United States Patent
Kikuchi et al.

(10) Patent No.: US 10,957,268 B2
(45) Date of Patent: Mar. 23, 2021

(54) ACTIVE-MATRIX SUBSTRATE AND DISPLAY DEVICE

(71) Applicant: Sharp Kabushiki Kaisha, Sakai (JP)

(72) Inventors: Tetsuo Kikuchi, Sakai (JP); Hajime Imai, Sakai (JP); Takashi Terauchi, Sakai (JP); Shinya Ohira, Sakai (JP); Isao Ogasawara, Sakai (JP); Satoshi Horiuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 175 days.

(21) Appl. No.: 16/309,958

(22) PCT Filed: Aug. 4, 2017

(86) PCT No.: PCT/JP2017/028427
§ 371 (c)(1),
(2) Date: Dec. 14, 2018

(87) PCT Pub. No.: WO2018/030298
PCT Pub. Date: Feb. 15, 2018

(65) Prior Publication Data
US 2019/0333461 A1 Oct. 31, 2019

(30) Foreign Application Priority Data
Aug. 12, 2016 (JP) .............................. JP2016-158952

(51) Int. Cl.
*G09G 3/36* (2006.01)
*H01L 27/12* (2006.01)
*G02F 1/1362* (2006.01)

(52) U.S. Cl.
CPC ......... *G09G 3/3655* (2013.01); *G02F 1/1362* (2013.01); *H01L 27/1218* (2013.01);
(Continued)

(58) Field of Classification Search
None
See application file for complete search history.

(56) References Cited

U.S. PATENT DOCUMENTS

| 2004/0017531 A1 | 1/2004 | Nagata et al. |
| 2006/0158595 A1 | 7/2006 | Hiroya et al. |

(Continued)

FOREIGN PATENT DOCUMENTS

| JP | 11-338376 A | 12/1999 |
| JP | 2006-201312 A | 8/2006 |

(Continued)

OTHER PUBLICATIONS

Official Communication issued in International Patent Application No. PCT/JP2017/028427, dated Oct. 31, 2017.

*Primary Examiner* — Benjamin C Lee
*Assistant Examiner* — Emily J Frank
(74) *Attorney, Agent, or Firm* — Keating & Bennett, LLP

(57) ABSTRACT

An active-matrix substrate according to an embodiment of the present invention includes a plurality of first TFTs that are arranged within a display area, an inorganic insulating layer that covers the plurality of first TFTs, an organic insulating layer that is provided on the inorganic insulating layer, a plurality of second TFTs that are arranged within a non-display area, and a source and gate metal connection portion that is positioned within the non-display area, a first conductive layer that is formed from an identical conductive film with a gate wiring line and a second conductive layer that is formed from an identical conductive film with a source wiring line being connected to each other at the source and gate metal connection portion. Each of the plurality of first TFTs is an oxide semiconductor TFT. At least one second TFT among the plurality of second TFTs is covered with the organic insulating layer. The source and (Continued)

gate metal connection portion is not covered with the organic insulating layer.

19 Claims, 25 Drawing Sheets

(52) U.S. Cl.
CPC ............... *G09G 2300/0426* (2013.01); *G09G 2300/0439* (2013.01)

(56) References Cited

U.S. PATENT DOCUMENTS

| | | | |
|---|---|---|---|
| 2008/0024416 A1 | 1/2008 | Onogi et al. | |
| 2009/0323005 A1 | 12/2009 | Ota | |
| 2011/0032444 A1 | 2/2011 | Yamazaki et al. | |
| 2011/0049523 A1 | 3/2011 | Choi et al. | |
| 2012/0138922 A1 | 6/2012 | Yamazaki et al. | |
| 2012/0241750 A1 | 9/2012 | Chikama et al. | |
| 2012/0300163 A1 | 11/2012 | Moriwaki et al. | |
| 2012/0327057 A1 | 12/2012 | Sakamoto et al. | |
| 2013/0027648 A1 | 1/2013 | Moriwaki | |
| 2013/0077035 A1 | 3/2013 | Kanzaki et al. | |
| 2013/0320334 A1 | 12/2013 | Yamazaki et al. | |
| 2014/0159068 A1* | 6/2014 | Park | H01L 27/1244 257/88 |
| 2014/0217412 A1 | 8/2014 | Yanagisawa et al. | |
| 2014/0286076 A1 | 9/2014 | Aoki et al. | |
| 2015/0108467 A1 | 4/2015 | Moriguchi et al. | |
| 2015/0115234 A1* | 4/2015 | Hong | H01L 51/5253 257/40 |
| 2015/0199929 A1* | 7/2015 | Kim | G09G 3/006 324/762.01 |
| 2015/0293546 A1 | 10/2015 | Tanaka et al. | |
| 2016/0013253 A1* | 1/2016 | Lee | C23C 16/50 257/40 |
| 2016/0240589 A1* | 8/2016 | Jeong | H01L 27/322 |
| 2016/0260750 A1 | 9/2016 | Ueda et al. | |
| 2016/0328062 A1* | 11/2016 | Jin | G02F 1/1309 |
| 2017/0025637 A1* | 1/2017 | Kim | H01L 27/3258 |
| 2017/0179231 A1* | 6/2017 | Jongman | H01L 27/3258 |
| 2017/0345883 A1* | 11/2017 | Song | G09G 3/3233 |
| 2018/0031895 A1* | 2/2018 | Koide | G02F 1/13458 |

FOREIGN PATENT DOCUMENTS

| | | |
|---|---|---|
| JP | 2008-032899 A | 2/2008 |
| JP | 2010-008758 A | 1/2010 |
| JP | 2011-048339 A | 3/2011 |
| JP | 2011-077503 A | 4/2011 |
| JP | 2012-134475 A | 7/2012 |
| JP | 2014-007399 A | 1/2014 |
| JP | 2014-153493 A | 8/2014 |
| JP | 2014-209727 A | 11/2014 |
| WO | 2011/070981 A1 | 6/2011 |
| WO | 2011/086624 A1 | 7/2011 |
| WO | 2011/104945 A1 | 9/2011 |
| WO | 2011/129065 A1 | 10/2011 |
| WO | 2011/155133 A1 | 12/2011 |
| WO | 2012/086513 A1 | 6/2012 |
| WO | 2014/069529 A1 | 5/2014 |
| WO | 2015/053010 A1 | 4/2015 |

* cited by examiner (a)

(b)

(c)

(d)

ACTIVE-MATRIX SUBSTRATE AND DISPLAY DEVICE

TECHNICAL FIELD

The present invention relates to an active-matrix substrate and particularly to an active-matrix substrate that has a configuration in which an inorganic insulating layer and organic insulating layer are stacked.

Furthermore, the present invention also relates to a display device that includes such an active-matrix substrate.

BACKGROUND ART

An active-matrix substrate that is used for a liquid crystal display device or the like includes a switching element, such as a thin film transistor (hereinafter referred to as a "TFT") for every pixel. As this switching element, a TFT (hereinafter referred to as an "amorphous silicon TFT") an activation layer of which is an amorphous silicon film, or a TFT (hereinafter referred to as a "polycrystal silicon TFT") an activation layer of which is a polycrystal silicon film is widely used.

In recent years, as a material of the activation layer of the TFT, use of an oxide semiconductor instead of the amorphous silicon or the polycrystal silicon has been proposed. A TFT that has an oxide semiconductor film as an activation layer is referred to as an "oxide semiconductor TFT". In PTL 1, an active-matrix substrate in which an In—Ga—Zn—O-based semiconductor film is used for an activation layer of a TFT is disclosed.

An oxide semiconductor has higher mobility than amorphous silicon. For this reason, it is possible that the oxide semiconductor TFT operates at a higher speed than the amorphous silicon TFT. Furthermore, because the oxide semiconductor film is formed in a simpler process than the polycrystal silicon film, the oxide semiconductor film can be applied to an apparatus which requires a large area.

Generally, the active-matrix substrate has a display area and a non-display area. The display area includes a plurality of pixels (pixel areas) that are arranged in a matrix form, and is also referred to as an active area. The non-display area is positioned in the vicinity of the display area, and is also referred to as a picture-frame area or a peripheral area.

Provided in the display area are a TFT that is formed for every pixel, and a gate wiring line, source wiring line, and pixel electrode that are electrically connected to a gate electrode, source electrode, and drain electrode of the TFT, respectively. The TFT is covered with an interlayer insulating layer, and the pixel electrode is formed on the interlayer insulating layer. A configuration is known in which, as an interlayer insulating layer, an inorganic insulating layer (a protection film) that is formed from an inorganic insulating material and an organic insulating layer (a planarizing film) that is formed from an organic insulating material (a resin material) are stacked.

Positioned in the non-display area is a drive circuit for driving a gate wiring line and a source wiring line. Specifically, a gate driver that supplies a scanning signal (a gate signal) to the gate wiring line, or a source driver for supplying a display signal (a source signal) to the source wiring line are arranged. Drive circuits such as the gate driver and the source driver may be mounted as semiconductor chips (chip on glass (COG) packaging) in some cases, and they may be monolithically (integrally) formed on the active-matrix substrate in other cases. The drive circuit that is monolithically formed is referred to as a "driver monolithic circuit". The driver monolithic circuit is normally configured using the TFT. In recent years, techniques have been used that manufacture a driver monolithic circuit using an oxide semiconductor TFT. Thus, narrowing-down of a picture-frame area, or reduction of cost, which results from simplification of a packaging processing, is realized.

In recent years, a gate driver is often monolithically formed (a gate driver monolithic circuit) and a source driver is often packaged using a COG method in the non-display area in devices, such as a smartphone and a tablet with a small size of less than 10 inches, the frame of which is strongly desired to be narrower.

In some cases, moreover, an inspection circuit for performing pseudo-dynamic lighting inspection, which is a method for detecting a defect in a liquid crystal display device (a liquid crystal display panel), is provided in the non-display area. Accordingly, it is possible that defects, such as a wiring-line breaking and a wiring-line short circuit, on the active-matrix substrate are detected. The inspection circuit, for example, is disclosed in PTL 2.

Furthermore, in some cases, a portion (hereinafter referred to as a "source and gate metal connection portion") at which a conductive layer that is formed from the same conductive film (a gate metal film) as the gate wiring line, and a conductive layer that is formed from the same conductive film (a source metal film) as the source wiring line are connected to each other is provided in the non-display area.

CITATION LIST

Patent Literature

PTL 1: Japanese Unexamined Patent Application Publication No. 2012-134475

PTL 2: Japanese Unexamined Patent Application Publication No. 2014-153493

SUMMARY OF INVENTION

Technical Problem

From the study by the inventors of the present application, it is found that a minute crack (a microcrack) is liable to occur in the inorganic insulating layer in the source and gate metal connection portion. Because the organic insulating layer is liable to contain water, when the microcrack occurs in the inorganic insulating layer, water from the organic insulating layer penetrates underneath the inorganic insulating layer through the microcrack and this causes corrosion of a source wiring line layer or a gate wiring line layer. Furthermore, when the corrosion advances and reaches up to the oxide semiconductor TFT, there is a concern that a leak will occur in the oxide semiconductor TFT. In this manner, when the microcrack occurs in the inorganic insulating layer in the source and gate metal connection portion, the reliability of the active-matrix substrate (more precisely, of the display device) is reduced.

An object of the present invention, which was made in view of the problems described above, is to provide an active-matrix substrate in which the reliability thereof is suppressed from being reduced due to penetration of water from a microcrack that occurs in an inorganic insulating layer.

Solution to Problem

According to an embodiment of the present invention, there is provided an active-matrix substrate that has a display area which includes a plurality of pixel areas, and a non-display area that is positioned in a vicinity of the display area, the active-matrix substrate including: a substrate; a plurality of first TFTs that are arranged within the display area, the plurality of first TFTs being supported on the substrate; a plurality of gate wiring lines for supplying a scanning signal to the plurality of first TFTs; a plurality of source wiring lines for supplying a display signal to the plurality of first TFTs; an inorganic insulating layer that covers the plurality of first TFTs; an organic insulating layer that is provided on the inorganic insulating layer; a plurality of second TFTs that are arranged within the non-display area, the plurality of second TFTs being supported on the substrate; and a source and gate metal connection portion that is positioned within the non-display area, a first conductive layer that is formed from an identical conductive film with the plurality of gate wiring lines and a second conductive layer that is formed from an identical conductive film with the plurality of source wiring lines being connected to each other at the source and gate metal connection portion, in which each of the plurality of first TFTs is an oxide semiconductor TFT that includes an oxide semiconductor layer, in which at least one second TFT among the plurality of second TFTs is covered with the organic insulating layer, and in which the source and gate metal connection portion is not covered with the organic insulating layer.

According to another embodiment of the present invention, there is provided an active-matrix substrate that has a display area which includes a plurality of pixel areas, and a non-display area that is positioned in a vicinity of the display area, the active-matrix substrate including: a substrate; a plurality of first TFTs that are arranged within the display area, the plurality of first TFTs being supported on the substrate; a plurality of gate wiring lines for supplying a scanning signal to the plurality of first TFTs; a plurality of source wiring lines for supplying a display signal to the plurality of first TFTs; an inorganic insulating layer that covers the plurality of first TFTs; an organic insulating layer that is provided on the inorganic insulating layer; a plurality of second TFTs that are arranged within the non-display area, the plurality of second TFTs being supported on the substrate; and a source and gate metal connection portion that is positioned within the non-display area, a first conductive layer that is formed from an identical conductive film with the plurality of gate wiring lines and a second conductive layer that is formed from an identical conductive film with the plurality of source wiring lines being connected to each other at the source and gate metal connection portion, in which each of the plurality of first TFTs is an oxide semiconductor TFT that includes an oxide semiconductor layer, in which the organic insulating layer includes a portion in which a groove that substantially surrounds the display area is formed, the portion being positioned within the non-display area, and in which the source and gate metal connection portion is not covered with the organic insulating layer.

The active-matrix substrate according to a certain embodiment further includes: a gate driver monolithic circuit that is formed on the substrate in the non-display area, in which the source and gate metal connection portion that is not covered with the organic insulating layer is positioned within the gate driver monolithic circuit.

According to a certain embodiment, the gate driver monolithic circuit includes a plurality of circuit TFTs, and the source and gate metal connection portion that is not covered with the organic insulating layer is positioned in a vicinity of a certain circuit TFT among the plurality of circuit TFTs.

The active-matrix substrate according to a certain embodiment further includes: a gate driver monolithic circuit that is formed on the substrate in the non-display area, in which the non-display area includes a GDM wiring-line area in which a plurality of wiring lines for supplying a signal to the gate driver monolithic circuit are formed, and in which the source and gate metal connection portion that is not covered with the organic insulating layer is positioned within the GDM wiring-line area.

The active-matrix substrate according to a certain embodiment, the plurality of wiring lines that are formed within the GDM wiring-line area includes a plurality of main wiring lines that extend in a given direction, in which the active-matrix substrate further includes a plurality of branch wiring lines that extend in a direction which intersects the given direction, and which connect the plurality of main wiring lines and the gate monolithic circuit, and in which the source and gate metal connection portion that is not covered with the organic insulating layer is a portion that connects a certain main wiring line, among the plurality of main wiring lines, and a certain branch wiring line, among the plurality of branch wiring lines.

The active-matrix substrate according to a certain embodiment further includes: a gate driver monolithic circuit that is formed on the substrate in the non-display area, in which the source and gate metal connection portion that is not covered with the organic insulating layer is positioned between the gate driver monolithic circuit and the display area.

According to a certain embodiment, the source and gate metal connection portion that is not covered with the organic insulating layer is a portion that connects the gate driver monolithic circuit and a certain gate wiring line, among the plurality of gate wiring lines.

The active-matrix substrate according to a certain embodiment includes: an inspection circuit that is formed on the substrate in the non-display area, in which the inspection circuit includes a plurality of inspection TFTs, and a plurality of inspection wiring lines for supplying a signal to the plurality of inspection TFTs, and in which the source and gate metal connection portion that is not covered with the organic insulating layer is positioned within the inspection circuit.

According to a certain embodiment, the source and gate metal connection portion that is not covered with the organic insulating layer is a portion that connects a certain inspection TFT, among the plurality of inspection TFTs, and a certain inspection wiring line, among the plurality of inspection wiring lines.

According to a certain embodiment, each of the plurality of second TFTs is a crystalline silicon TFT that includes a crystalline silicon semiconductor layer.

According to still another embodiment of the present invention, there is provided an active-matrix substrate that has a display area which includes a plurality of pixel areas, and a non-display area that is positioned in a vicinity of the display area, the active-matrix substrate including: a substrate; a plurality of pixel TFTs that are arranged within the display area, the plurality of pixel TFTs being supported on the substrate; a plurality of gate wiring lines for supplying a scanning signal to the plurality of pixel TFTs; a plurality of source wiring lines for supplying a display signal to the plurality of pixel TFTs; an inorganic insulating layer that covers the plurality of pixel TFTs; an organic insulating layer that is provided on the inorganic insulating layer; a source and gate metal connection portion that is positioned on the non-display area, a first conductive layer that is formed from an identical conductive film with the plurality of gate wiring lines and a second conductive layer that is formed from an identical conductive film with the plurality of source wiring lines being connected to each other at the source and gate metal connection portion, and a gate driver monolithic circuit that is formed on the substrate and includes a plurality of circuit TFTs, in which each of the plurality of pixel TFTs is an oxide semiconductor TFT that includes an oxide semiconductor layer, in which at least one portion of the gate driver monolithic circuit is positioned within the display area, and in which the source and gate metal connection portion is positioned within a portion of the gate driver monolithic circuit, which is positioned within the display area, and is not covered with the organic insulating layer.

According to a certain embodiment, the second conductive layer in the source and gate metal connection portion includes an edge that is at a distance of 1.0 μm or more from an edge of the organic insulating layer when viewed in a direction normal to the substrate.

According to a certain embodiment, the oxide semiconductor TFT is an etch stop type TFT.

According to a certain embodiment, the oxide semiconductor TFT is a channel etch type TFT.

According to a certain embodiment, the oxide semiconductor layer includes an In—Ga—Zn—O-based semiconductor.

According to a certain embodiment, the In—Ga—Zn—O-based semiconductor includes a crystalline portion.

According to a certain embodiment, the oxide semiconductor TFT includes an oxide semiconductor layer that has a stacked structure.

According to still another embodiment of the present invention, there is provided a display device including: the active-matrix substrate that has any one of the configurations described above; a counter substrate that is positioned in such a manner as to face the active-matrix substrate; and a display medium layer that is provided between the active-matrix substrate and the counter substrate.

Advantageous Effects of Invention

According to embodiments of the present invention, an active-matrix substrate can be provided in which the reliability thereof is suppressed from being reduced due to penetration of water from a microcrack that occurs in an inorganic insulating layer.

DESCRIPTION OF EMBODIMENTS

Active-matrix substrates according to embodiments of the present invention will be described below with reference to the drawings. The active-matrix substrates according to the embodiment of the present invention are widely used as various display devices and electronic devices. It is noted that the present invention is not limited to the following embodiment.

Embodiment 1

[Schematic Configuration of Active-Matrix Substrate]

Figure 1:
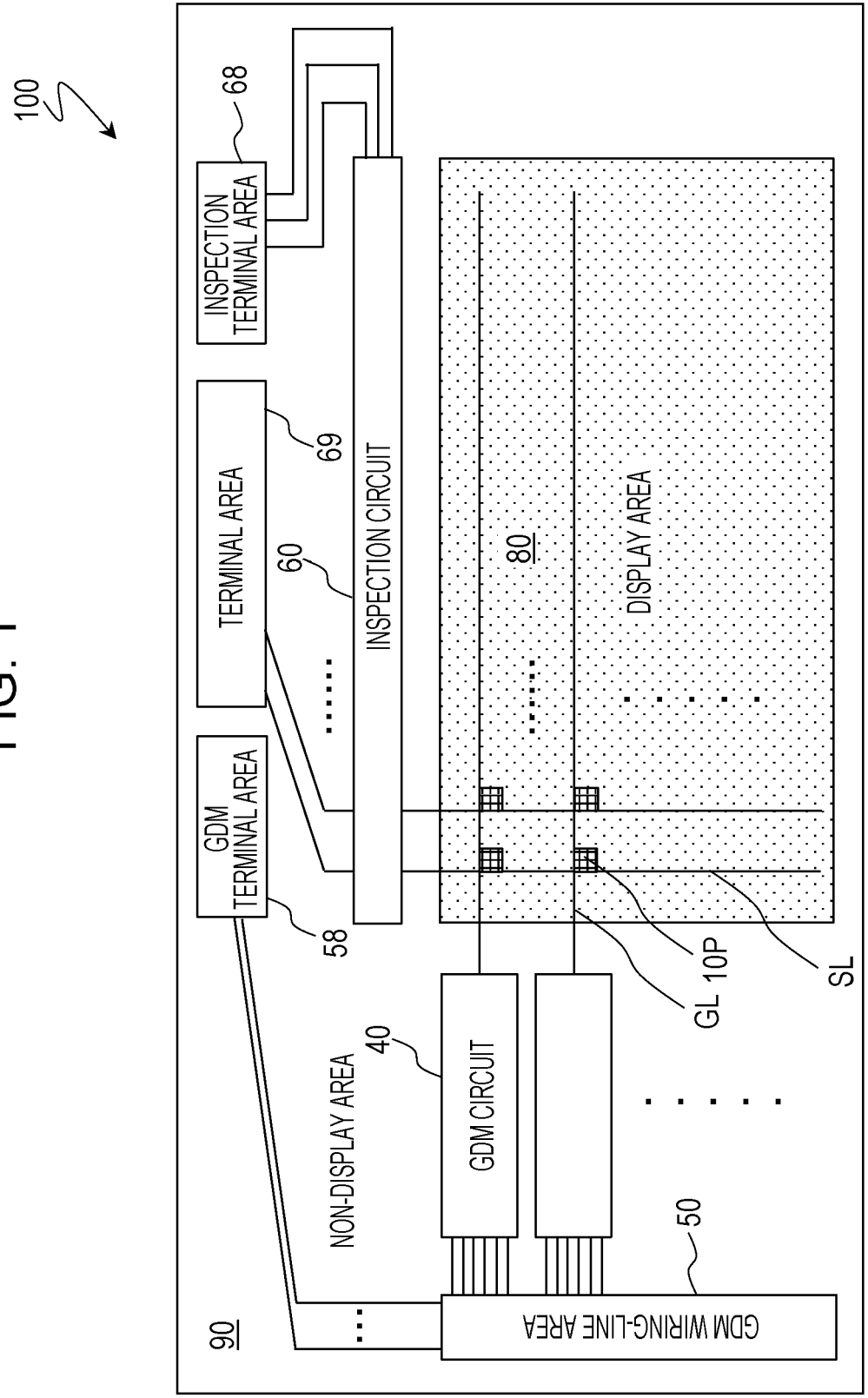
FIG. 1 is a diagram that schematically illustrates an active-matrix substrate 100 according to an embodiment of the present invention.

A schematic configuration of an active-matrix substrate 100 according to the present embodiment is described with reference to FIG. 1. FIG. 1 is a diagram that schematically illustrates the active-matrix substrate 100.

The active-matrix substrate 100, as illustrated in FIG. 1, has a display area 80 and a non-display area 90. The display area 80 includes a plurality of pixel areas. The "pixel area" is an area that corresponds to a pixel in the display device, and, in the present specification, is also referred to simply as a "pixel". The non-display area 90 is positioned in the vicinity of the display area 80 (is an area other than the display area 80).

A plurality of first TFTs 10P are arranged within the display area 80. The first TFT 10P is provided on every pixel. The first TFT 10P is also referred to as a "pixel TFT". Furthermore, a plurality of gate wiring lines GL and a plurality of source wiring lines SL are arranged within the display area 80. The plurality of gate wiring lines GL extend in the row direction. In contrast, the plurality of source wiring lines SL extend in the column direction. Each pixel TFT 10P is supplied with a scanning signal (a gate signal) from a corresponding gate wiring line GL, and supplied with a display signal (a source signal) from a corresponding source wiring line SL.

Positioned in the non-display area 90 is a gate driver monolithic (GDM) circuit 40. The GDM circuit 40 is a gate driver (a gate wiring-line drive circuit) that is monolithically (integrally) formed on the active-matrix substrate 100. The GDM circuit 40 includes a plurality of circuit TFTs.

The non-display area 90 includes a GDM wiring-line area 50. The GDM wiring-line area 50 is an area in which a plurality of wiring lines for supplying a signal to the GDM circuit 40 are formed. The plurality of wiring lines in the GDM wiring-line area 50 are connected to terminals in a GDM terminal area 58.

Furthermore, an inspection circuit 60 is positioned in the non-display area 90. The inspection circuit 60 includes a plurality of inspection TFTs and a plurality of inspection wiring lines. The plurality of inspection wiring lines are connected to terminals in an inspection terminal area 68.

The inspection circuit 60, for example, is provided in an area in which a semiconductor chip that constitutes a source driver is mounted. The source driver as the semiconductor chip is connected to the source wiring line SL via a terminal in a terminal area 69 for the source driver.

A plurality of second TFTs are arranged within the non-display area 90. The plurality of second TFTs, for example, include the plurality of circuit TFTs and/or the plurality of inspection TFTs, which are described above.

[Configuration of Each Pixel Area]

Figure 2:
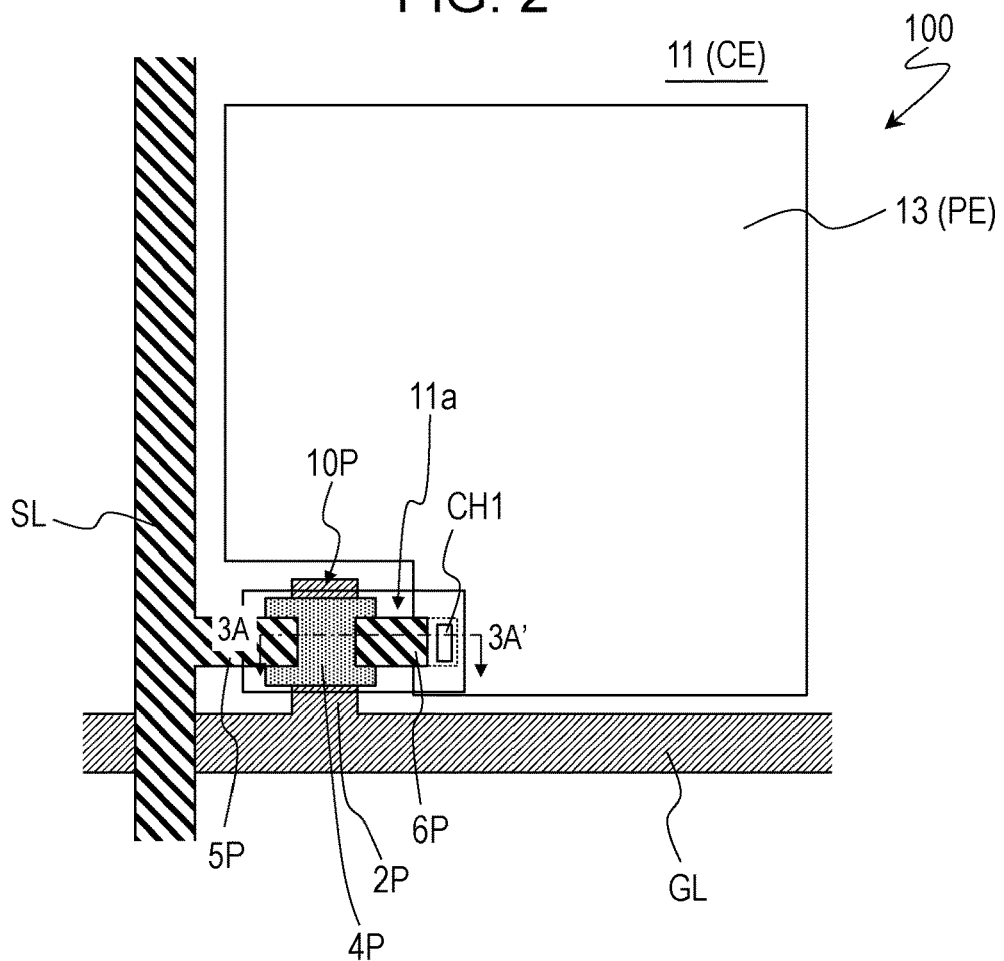
FIG. 2 is a plan-view diagram that schematically illustrates one pixel area in the active-matrix substrate 100.
Figure 3:
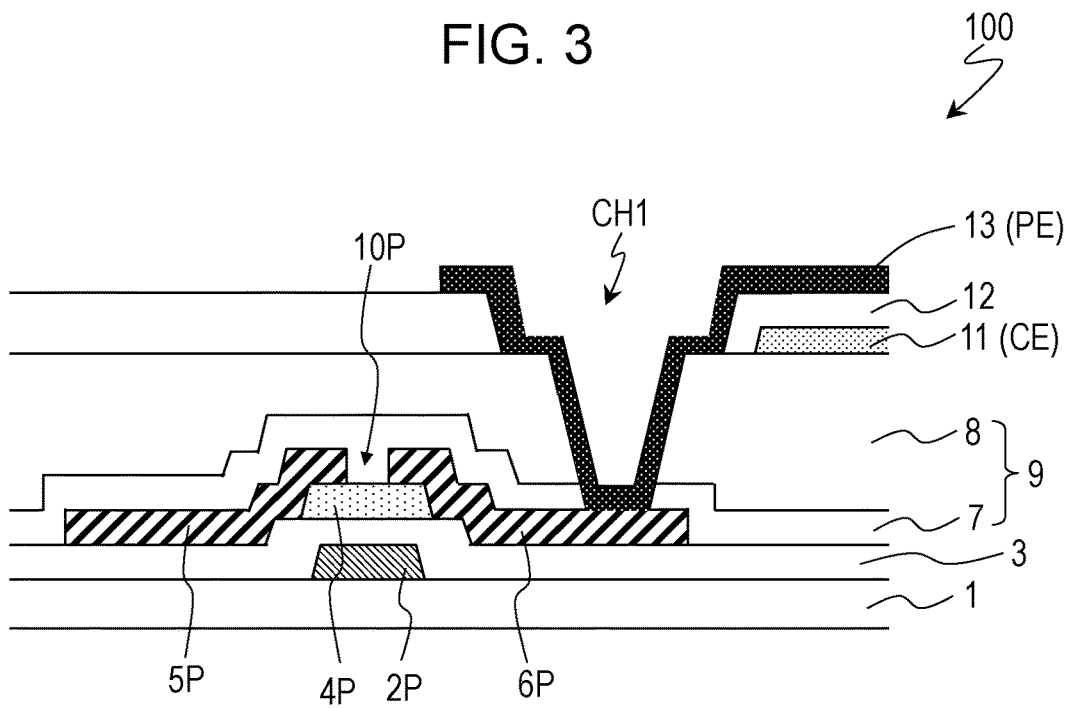
FIG. 3 is a cross-sectional diagram cut along line 3A-3A' in FIG. 2.

An example of a configuration of each pixel area is described with reference to FIGS. 2 and 3. FIG. 2 is a plan-view diagram that schematically illustrates one pixel area in the active-matrix substrate 100. FIG. 3 is a cross-sectional diagram cut along line 3A-3A' in FIG. 2. FIGS. 2 and 3 illustrate the active-matrix substrate 100 that is used in a display device in a fringe field switching (FFS) mode. The FFS mode is a display mode in compliance with a traverse field method in which a pair of electrodes are provided on a substrate and in which an electric field is applied, in a direction (in the horizontal direction) in parallel to a substrate surface, to liquid crystal molecules.

Each of the pixel areas, as illustrated in FIGS. 2 and 3, has the pixel TFT 10P. The pixel TFT 10P is supported on a substrate 1. The substrate 1, for example, is a glass substrate. It is noted that the second TFT which is positioned in the non-display area 90 is also supported on the substrate 1. In an example that is illustrated in FIGS. 2 and 3, the pixel TFT 10P has a bottom gate structure.

The pixel TFT 10P has a gate electrode 2P that is provided on the substrate 1, a gate insulating layer 3 that covers the gate electrode 2P, an oxide semiconductor layer 4P that is positioned on the gate insulating layer 3, and a source electrode 5P and a drain electrode 6P. More precisely, the pixel TFT 10P is an oxide semiconductor TFT.

The oxide semiconductor layer 4P is positioned in such a manner as to overlap, at least in part, the gate electrode 2P when viewed in a direction normal to the substrate 1. The source electrode 5P and the drain electrode 6P are electrically connected to the oxide semiconductor layer 4P. An area of the oxide semiconductor layer 4P, which is brought into contact with the source electrode 5P, is referred to as a source contact area, and an area thereof, which is brought into contact with the drain electrode 6P, is referred to as a drain contact area. A channel is formed within an area that is positioned between the source contact area and the drain contact area of the oxide semiconductor layer 4P and that overlaps the gate electrode 2P with the gate insulating layer 3 interposed therebetween. In the present specification, for convenience, an area that includes a portion which becomes a channel is referred to as a "channel area". A length in a channel length direction, of the channel area, is referred to as an "a channel length", and a length in a direction that orthogonally intersects the channel length direction, of the channel area, is referred to as a "channel width". It is noted that in the actual TFT, in some cases, because of diffusion or the like of an impurity element into the channel area, an entire channel area does not function as a channel.

The gate electrode 2P and the source electrode 5P of the pixel TFT 10P are electrically connected to the gate wiring line GL and the source wiring line SL, respectively. In the example that is illustrated in FIG. 2, the gate electrode 2P is a portion that branches from the gate wiring line GL, and the source electrode 5P is a portion that branches from the source wiring line SL.

In order to cover the pixel TFT 10P, an inorganic insulating layer (a protection film) 7 is provided, and an organic insulating layer (a planarizing film) 8 is provided on the inorganic insulating layer 7. In the following, the inorganic insulating layer 7 and the organic insulating layer 8 are also collectively referred to as an interlayer insulating layer 9. The inorganic insulating layer 7, for example, is a SiNx layer or a SiOx layer. Furthermore, the inorganic insulating layer 7 may be configured to result from stacking the SiNx layer and the SiOx layer. The thickness of the inorganic insulating layer 7, for example, is equal to or greater than 100 nm and is equal to or smaller than 500 nm. The organic insulating layer 8, for example, is a resin layer that is formed from a photosensitive resin material. The organic insulating layer 8 is thicker than the inorganic insulating layer 7, and the thickness thereof, for example, is equal to or greater 1 µm and is equal to or smaller than 3 µm. The organic insulating layer 8 is provided in order to planarize a surface of an upper layer of the pixel TFT 10P or reduce an electrostatic capacitance that is formed between a pixel electrode PE that will be described below, and the source wiring line SL or the like.

A lower transparent electrode 11 is provided on the interlayer insulating layer 9 and a dielectric layer 12 is provided in such a manner as to cover the lower transparent electrode 11. An upper transparent electrode 13 is provided on the dielectric layer 12. Although not illustrated, the upper transparent electrode 13 has a slit or a notched portion. In this example, the lower transparent electrode 11 is a common electrode CE, and the upper transparent electrode 13 is the pixel electrode PE. This electrode structure is disclosed, for example, in International Publication No. 2012/086513. It is noted that the lower transparent electrode 11 may be the pixel electrode PE and the upper transparent electrode 13 may be the common electrode CE. This electrode structure is disclosed, for example, in Japanese Unexamined Patent Application Publication Nos. 2008-032899 and 2010-008758. For reference, the entire contents of International Publication No. 2012/086513 and Japanese Unexamined Patent Application Publication Nos. 2008-032899 and 2010-008758 are incorporated herein by reference.

The pixel electrode PE (the upper transparent electrode 13 here) is separated pixel by pixel. The drain electrode 6P of the pixel TFT 10P is electrically connected to the pixel electrode PE. In this example, a contact hole (a pixel contact hole) CH1 that extends to the drain electrode 6P is formed on the interlayer insulating layer 9 and the dielectric layer 12, and the upper transparent electrode 13 is provided on the interlayer insulating layer 9 and within the pixel contact hole CH1, in such a manner as to come into contact with the drain electrode 6P within the pixel contact hole CH1.

The common electrode CE (the lower transparent electrode 11 here) may not be separated pixel by pixel. The common electrode CE may be formed over almost the entire display area 80, except for an area that is positioned on the pixel TFT 10P. In this example, the common electrode CE has an opening portion 11a that overlaps the pixel TFT 10P and a contact hole CH1 for connecting the pixel TFT 10P and the pixel electrode PE to each other, when viewed in the direction normal to the substrate 1.

[Configuration of Source and Gate Metal Connection Portion]

Provided within the non-display area 90 is a source and gate metal connection portion at which a conductive layer (referred to as a "first conductive layer") that is formed from the same conductive film as a plurality of gate wiring lines GL and a conductive layer (referred to as a "second conductive layer") that is formed from the same conductive film as a plurality of source wiring lines SL are connected to each other.

Figure 4:
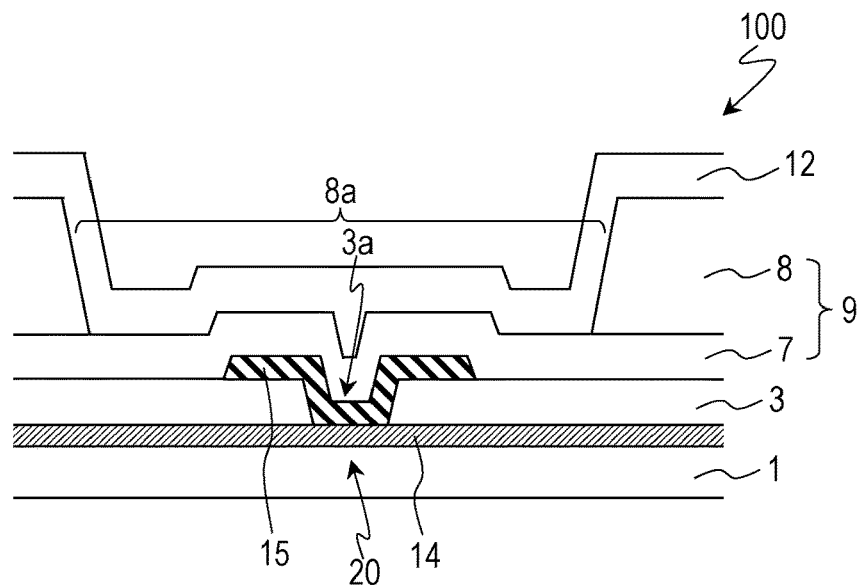
FIG. 4 is a diagram that schematically illustrates the vicinity of a source and gate metal connection portion 20 in the active-matrix substrate 100.

A structure of the source and gate metal connection portion 20 is described with reference to FIG. 4. FIG. 4 is a cross-sectional diagram that schematically illustrates the vicinity of the source and gate metal connection portion 20. As illustrated in FIG. 4, in the source and gate metal connection portion 20, the first conductive layer 14 and the second conductive layer 15 are connected to each other.

The first conductive layer 14 is provided on the substrate 1. The first conductive layer 14 is formed from the same conductive film (a gate metal film) as a plurality of gate wiring lines GL. The first conductive layer 14 is covered with the gate insulating layer 3. An opening portion 3a is formed in the gate insulating layer 3 in such a manner as to overlap one portion of the first conductive layer 14 (more precisely, in such a manner that one portion of the first conductive layer 14 is exposed through the opening portion 3a). The second conductive layer 15 is formed from the same conductive film (a source metal film) as a plurality of source wiring lines SL. The second conductive layer 15 is formed on the gate insulating layer 3 and within the opening portion 3a and is connected directly to the first conductive layer 14 within the opening portion 3a. Accordingly, the first conductive layer 14 and the second conductive layer 15 are connected to each other.

The second conductive layer 15 is covered with the inorganic insulating layer 7. An opening portion 8a is formed in a portion of the organic insulating layer 8, which corresponds to the source and gate metal connection portion 20. More precisely, the source and gate metal connection portion 20 is not covered with the organic insulating layer 8. An effect that is obtained with this configuration is described with reference to FIGS. 5(a) and 5(b).

Figure 5:
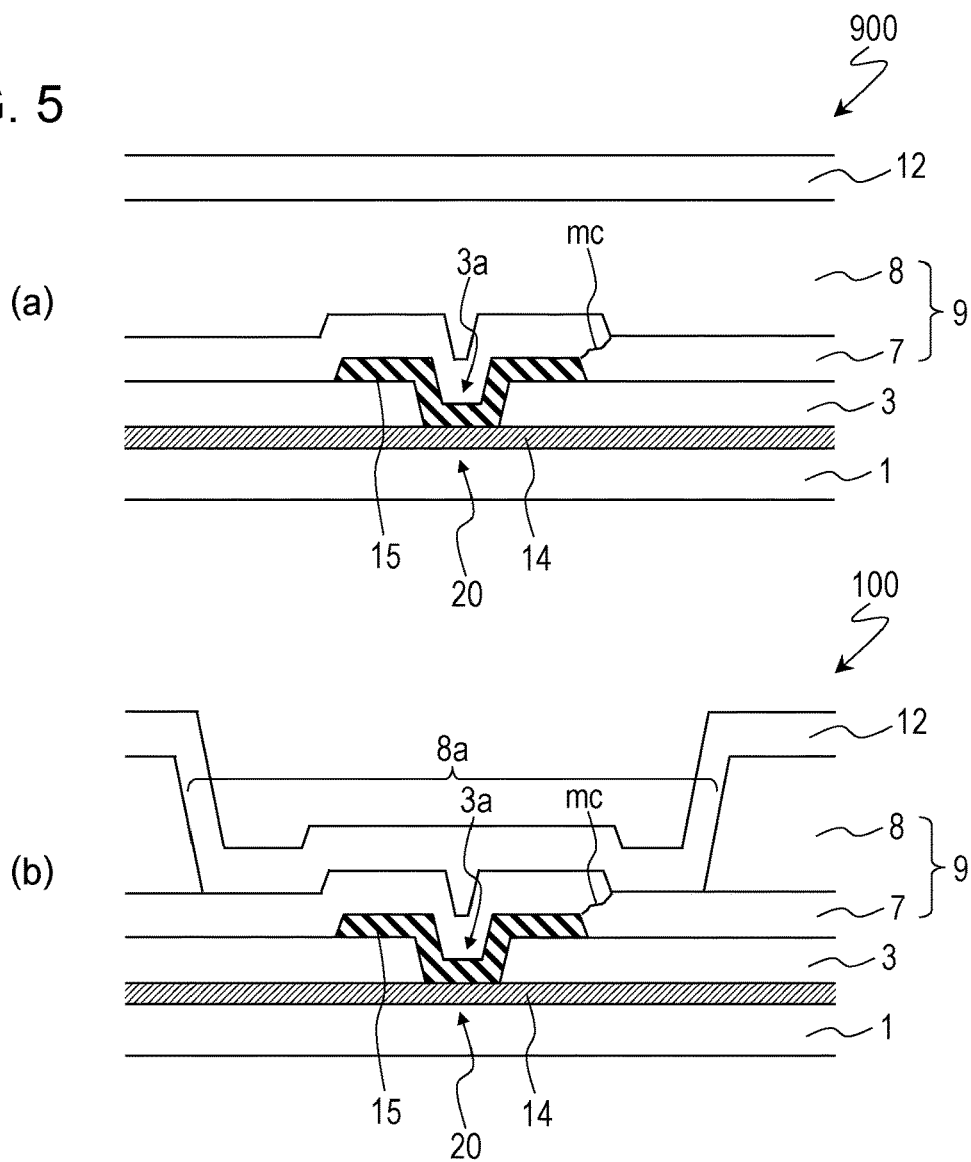
FIG. 5(a) is a cross-sectional diagram illustrating the vicinity of the source and gate metal connection portion 20 in an active-matrix substrate 900 in a comparative example.
FIG. 5(b) is a cross-sectional diagram illustrating the vicinity of the source and gate metal connection portion 20 in the active-matrix substrate 100 according to the embodiment of the present invention.

FIG. 5(a) is a cross-sectional diagram illustrating the vicinity of the source and gate metal connection portion 20 in an active-matrix substrate 900 in a comparative example. In the active-matrix substrate 900 in the comparative example, as illustrated in FIG. 5(a), an opening portion is not formed in an area of the organic insulating layer 8, which corresponds to the source and gate metal connection portion 20. More precisely, the source and gate metal connection portion 20 is covered with the organic insulating layer 8.

In the source and gate metal connection portion 20, due to film stress and thermal contraction of the first conductive layer 14 and the second conductive layer 15, which are stacked, a microcrack mc is liable to occur in the inorganic insulating layer 7. Because the organic insulating layer 8 is liable to contain water, when the microcrack mc occurs in the inorganic insulating layer 7, the water from the organic insulating layer 8 penetrates underneath the inorganic insulating layer 7 through the microcrack mc and this causes corrosion of the first conductive layer 14 or the second conductive layer 15. Furthermore, when the corrosion advances and reaches up to the oxide semiconductor TFT, there is a concern that a leak will occur in the oxide semiconductor TFT.

In contrast, in the active-matrix substrate 100 according to the present embodiment, as illustrated in FIG. 4, the source and gate metal connection portion 20 is not covered with the organic insulating layer 8. For this reason, as illustrated in FIG. 5(b), even though the microcrack mc occurs in the inorganic insulating layer 7, because the organic insulating layer 8 is not present on the inorganic insulating layer 7, the water is prevented from penetrating from the microcrack mc. Therefore, the reliability of the active-matrix substrate 100 is suppressed from being reduced.

According to Embodiment 1A to 1D, an example of a place where the source and gate metal connection portion 20 that is not covered with the organic insulating layer 8 within the non-display area 90 will be described below.

Embodiment 1A

Figure 6:
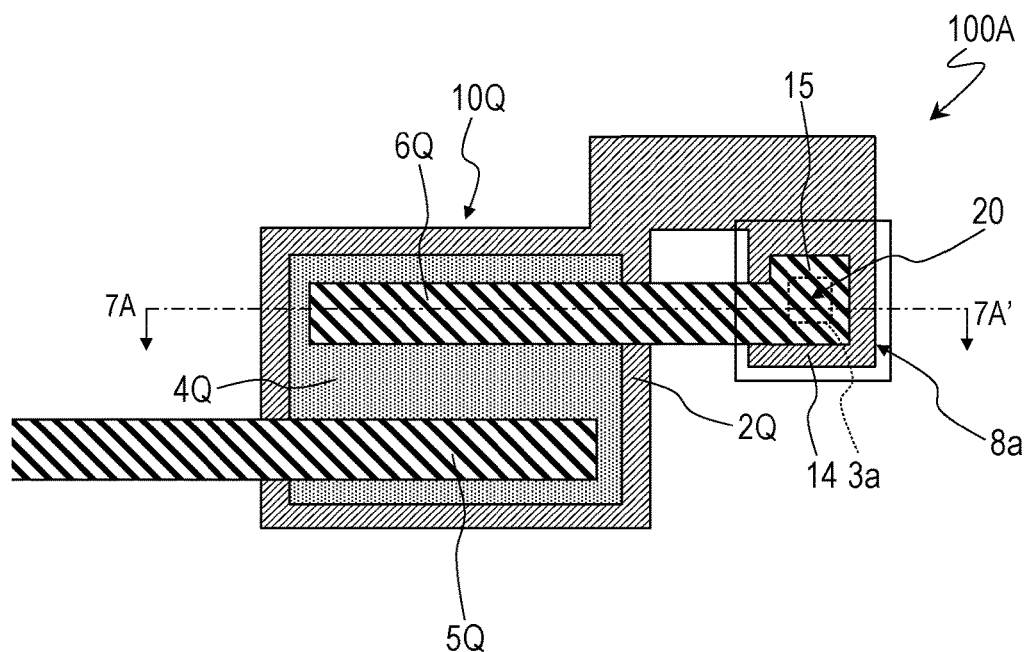
FIG. 6 is a plan-view diagram that schematically illustrates an active-matrix substrate 100A according to an embodiment of the present invention, and illustrates the vicinity of a certain circuit TFT 10Q among of a plurality of circuit TFTs 10Q that are included in a GDM circuit 40.
Figure 7:
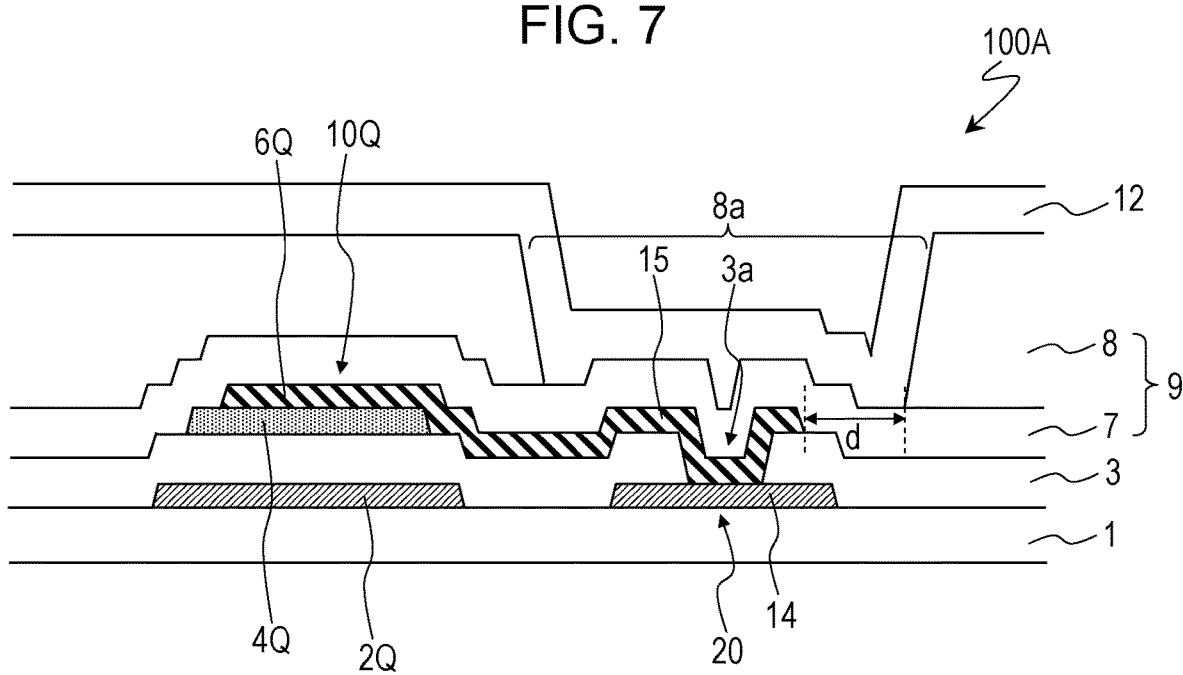
FIG. 7 is a cross-sectional diagram cut along line 7A-7A' in FIG. 6.

An active-matrix substrate 100A in the present embodiment is described with reference to FIGS. 6 and 7. In the present embodiment, the source and gate metal connection portion 20 that is not covered with the organic insulating layer 8 is positioned within the GDM circuit 40 that is formed on the substrate 1 in the non-display area 90. FIG. 6 is a plan-view diagram that schematically illustrates the vicinity of a certain circuit TFT 10Q among of a plurality of circuit TFTs 10Q that are included in the GDM circuit 40. FIG. 7 is a cross-sectional diagram cut along line 7A-7A' in FIG. 6.

The circuit TFT 10Q that is illustrated in FIGS. 6 and 7 has a gate electrode 2Q, an oxide semiconductor layer 4Q, a source electrode 5Q, and a drain electrode 6Q. More precisely, the circuit TFT 10Q is the oxide semiconductor TFT. The oxide semiconductor layer 4Q of the circuit TFT 10Q may be formed from the same oxide semiconductor film as the oxide semiconductor layer 4P of the pixel TFT 10P.

In an example that is illustrated in FIGS. 6 and 7, the source and gate metal connection portion 20 is positioned in the vicinity of the circuit TFT 10Q. The first conductive layer 14 extends from the gate electrode 2Q of the circuit TFT 10Q and is electrically connected to the gate electrode 2Q. The second conductive layer 15 extends from the drain electrode 6Q of the circuit TFT 10Q and is electrically connected to the drain electrode 6Q. Therefore, the gate electrode 2Q and the drain electrode 6Q of the circuit TFT 10Q are short-circuited (is electrically connected). More precisely, the circuit TFT 10Q is a TFT that is diode-connected. The circuit TFT 10Q that is diode-connected, for example, is used as a TFT that receives an output from the preceding stage, in a shift register circuit within the GDM circuit 40.

The opening portion 8a is formed in a portion of the organic insulating layer 8, which corresponds to the source and gate metal connection portion 20. More precisely, the source and gate metal connection portion 20 is not covered with the organic insulating layer 8. As illustrated in FIG. 7, the second conductive layer 15 includes an edge that is at a given distance d from an edge of the organic insulating layer 8 when viewed in the direction normal to the substrate 1. It is noted that, as illustrated in FIG. 7, the circuit TFT 10Q itself is covered with the organic insulating layer 8. An effect that is obtained with this configuration is described with reference to FIGS. 8(a) and 8(b).

FIG. 8(a) is a diagram illustrating the vicinity of the source and gate metal connection portion 20 in an active-matrix substrate 900A in the comparative example. In the active-matrix substrate 900A in the comparative example, as illustrated in FIG. 8(a), an opening portion is not formed in an area of the organic insulating layer 8, which corresponds to the source and gate metal connection portion 20. More precisely, the source and gate metal connection portion 20 is covered with the organic insulating layer 8. For this reason, when the microcrack mc occurs in the inorganic insulating layer 7, the water from the organic insulating layer 8 penetrates underneath the inorganic insulating layer 7 through the microcrack mc, and this causes the corrosion of the first conductive layer 14 or the second conductive layer 15. Furthermore, when the corrosion advances and reaches up to the circuit TFT 10Q, the oxide semiconductor layer 4Q is deoxidized with the water and an amount of off-leak current circuit TFT 10Q increases.

Figure 8:
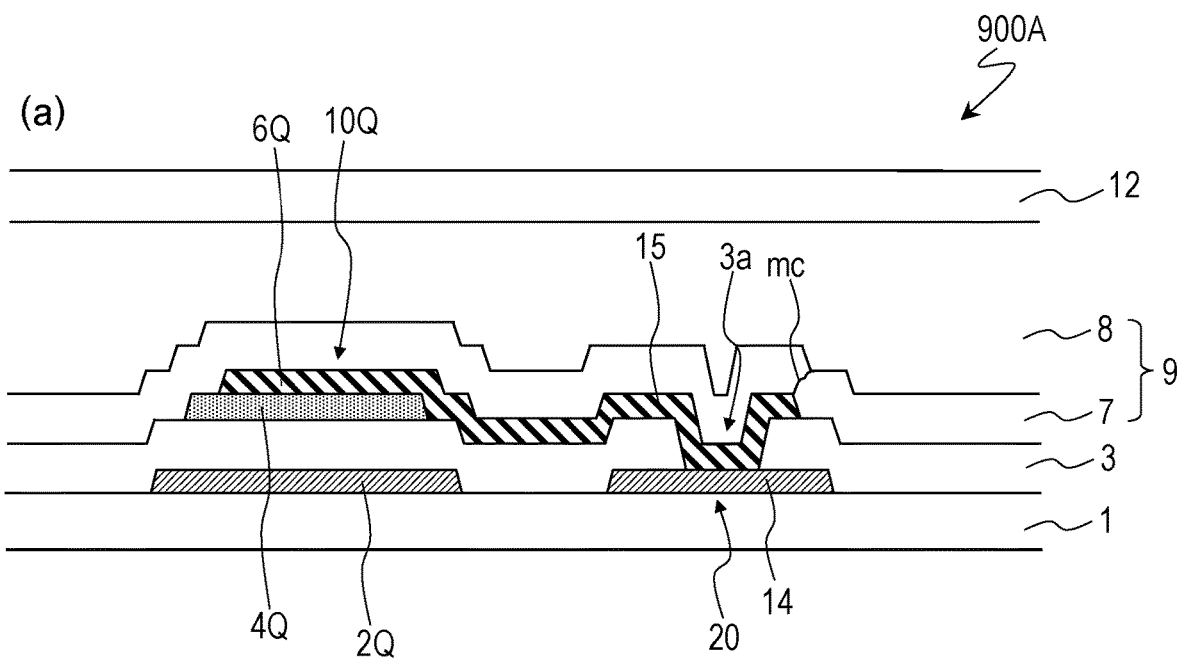
FIG. 8(a) is a cross-sectional diagram illustrating the vicinity of the source and gate metal connection portion 20 in an active-matrix substrate 900A in the comparative example.
FIG. 8(b) is a cross-sectional diagram illustrating the vicinity of the source and gate metal connection portion 20 in the active-matrix substrate 100A according to the embodiment of the present invention.
Figure 8:
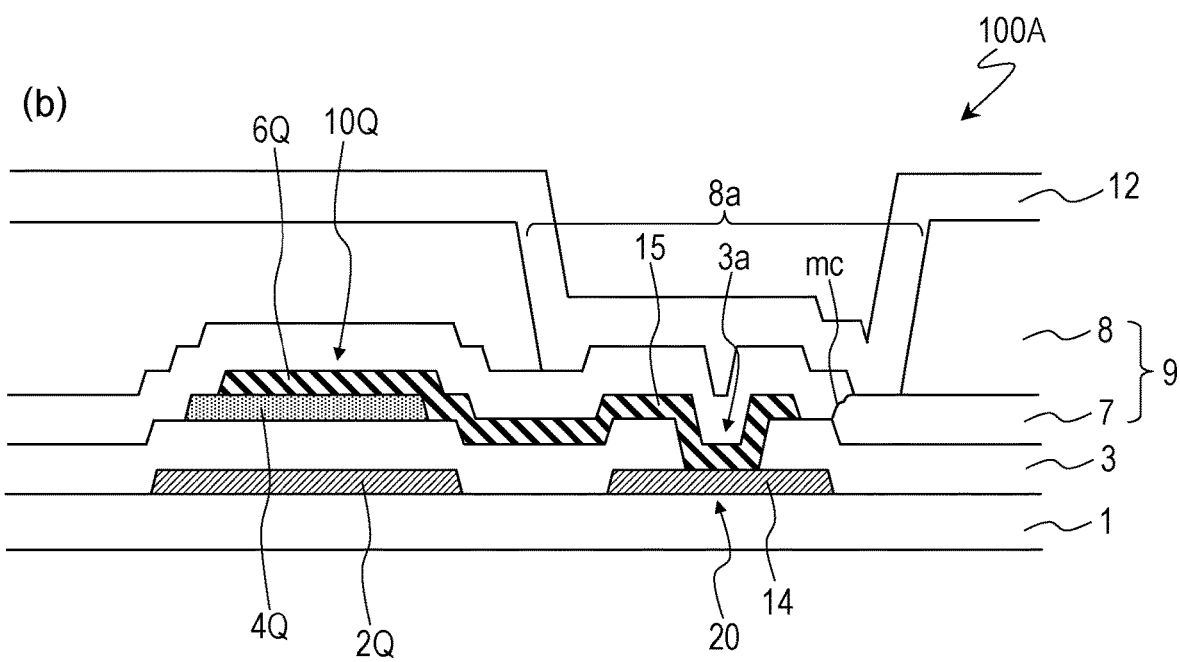

In contrast, in the active-matrix substrate 100A according to the present embodiment, as illustrated in FIGS. 6 and 7, the source and gate metal connection portion 20 is not covered with the organic insulating layer 8. For this reason, as illustrated in FIG. 8(*b*), even though the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of the active-matrix substrate 100A is suppressed from being reduced.

In the circuit TFT 10Q that is diode-connected as illustrated in FIGS. 6 and 7, a distance from the source and gate metal connection portion 20 to the oxide semiconductor layer 4Q of the circuit TFT 10Q is comparatively small. Because of this, when the water penetrates from the microcrack mc, the leak is liable to occur. For this reason, the significance of employing a configuration according to the embodiment of the present invention can be said to be great.

Figure 9:
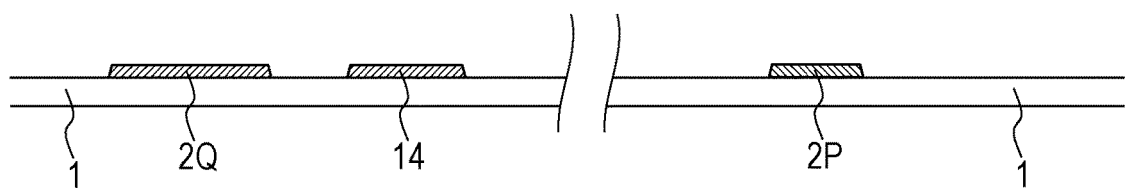
FIGS. 9(a) to 9(d) are cross-sectional process diagrams, each illustrating a process of manufacturing the active-matrix substrate 100A. A non-display area 90 is illustrated on the left side. A display area 80 is illustrated on the right side.
Figure 9:
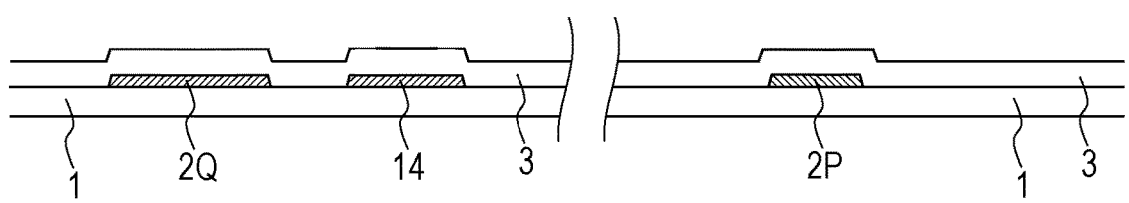
Figure 9:
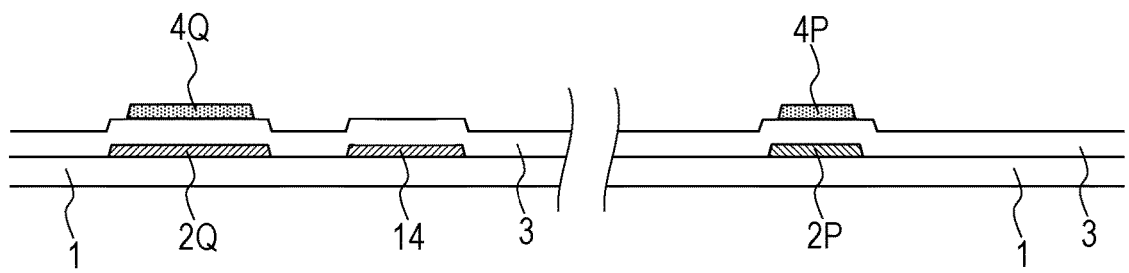
Figure 9:
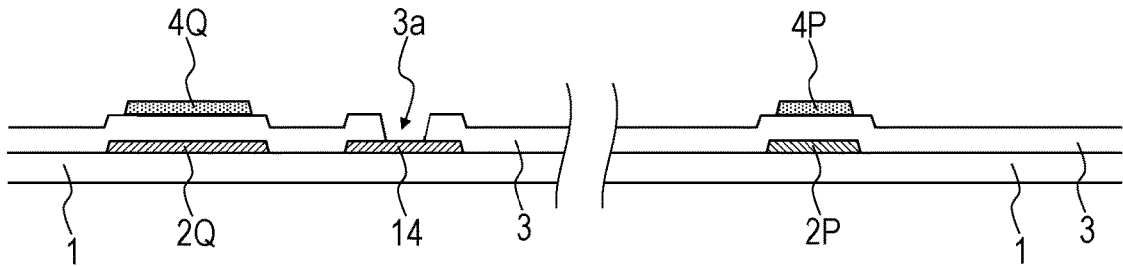

An example of a method of manufacturing the active-matrix substrate 100A is described with reference to FIGS. 9, 10 and 11. FIGS. 9(*a*) to 9(*d*), 10(*a*) to 10(*d*), and 11(*a*) to 11(*d*) are cross-sectional process diagrams, illustrating a process of manufacturing the active-matrix substrate 100A. The non-display area 90 (more specifically, an area that is illustrated in FIG. 7) is illustrated on the left side, and the display area 80 (more specifically, an area that is illustrated in FIG. 3) is illustrated on the right side.

First, with the well-known method, the pixel TFT 10P, the circuit TFT 10Q, the gate wiring line GL, the source wiring line SL, and the like are formed on the substrate 1.

Specifically, first, as illustrated in FIG. 9(*a*), a gate wiring-line layer that includes the gate wiring line GL, the gate electrodes 2P and 2Q, and the first conductive layer 14 is formed on the substrate 1. As the substrate 1, for example, a glass substrate can be used. To obtain the gate wiring-line layer, a gate conductive film (the thickness of which is equal to or greater than 50 nm and is equal to or smaller than 500 nm) is formed on the substrate 1 with a spattering method and this is patterned using a photolithographic process. As the gate conductive film, a film that contains a metal, such as aluminum (Al), tungsten (W), molybdenum (Mo), tantalum (Ta), chrome (Cr), titanium (Ti), or copper (Cu), an alloy of these, or a metal nitride of these can be suitably used. Furthermore, a stacked film that results from stacking these plural films may be used. Here, as the gate conductive film, a stacked film that results from forming a Cu film and a Ti film in this order is used.

Next, as illustrated in FIG. 9(*b*), the gate insulating layer (the thickness of which, for example, is equal to or greater than 200 nm and is equal to or smaller than 500 nm) 3 is formed with a CVD method or the like in such a manner as to cover the gate wiring-line layer. As the gate insulating layer 3, a silicon oxide (SiOx) layer, a silicon nitride (SiNx) layer, a silicon oxynitride (SiOxNy; x>Y) layer, a silicon nitride oxide (SiNxOy; x>y) layer, and the like can be suitably used. The gate insulating layer 3 may have a stacked structure. Here, as the gate insulating layer 3, a stacked film, a lower layer of which is the SiNx layer and an upper layer of which is the SiOx layer, is formed.

Subsequently, as illustrated in FIG. 9(*c*), an oxide semiconductor film is formed on the gate insulating layer 3 and the oxide semiconductor film (the thickness of which, for example, is equal to or greater than 10 nm and is equal to or smaller than 200 nm) is patterned using the photolithographic process. Thus, the oxide semiconductor layer 4P that is an activation layer of the pixel TFT 10P and the oxide semiconductor layer 4Q that is an activation layer of the circuit TFT 10Q are formed. The oxide semiconductor film may have a stacked structure.

Thereafter, as illustrated in FIG. 9(*d*), the opening portion 3*a* through which one portion of the first conductive layer 14 is exposed is formed on the gate insulating layer 3, using the photolithographic process.

Figure 10:
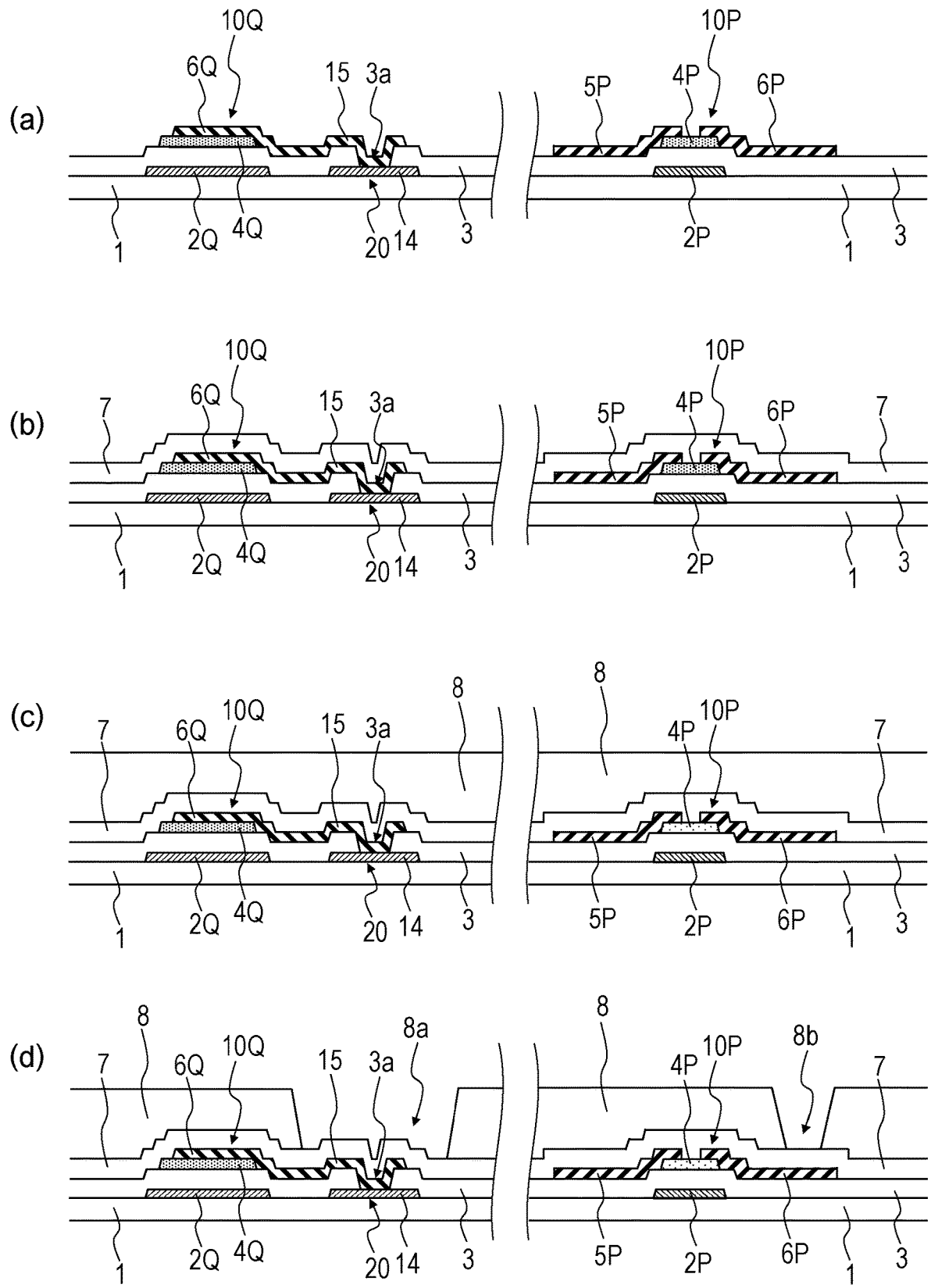
FIGS. 10(a) to 10(d) are cross-sectional process diagrams, each illustrating the process of manufacturing the active-matrix substrate 100A. The non-display area 90 is illustrated on the left side. The display area 80 is illustrated on the right side.
Figure 11:
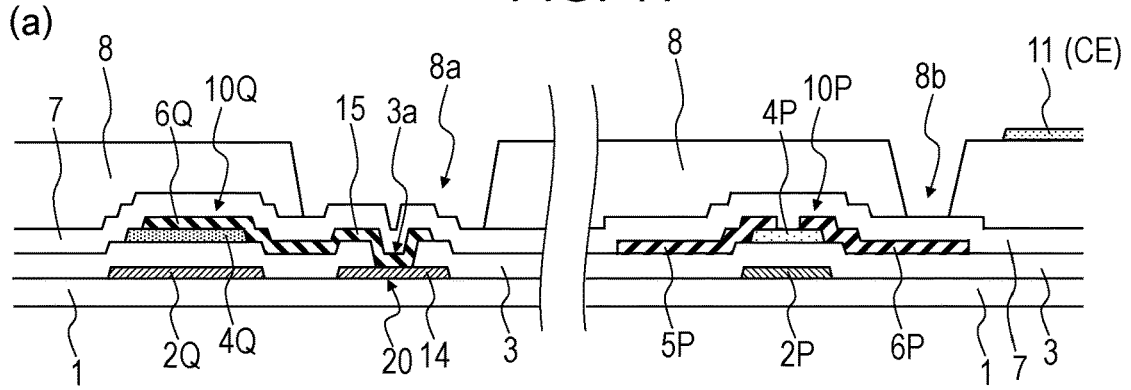
FIGS. 11(a) to 11(d) are cross-sectional process diagrams, each illustrating the process of manufacturing the active-matrix substrate 100A. The non-display area 90 is illustrated on the left side. The display area 80 is illustrated on the right side.
Figure 11:
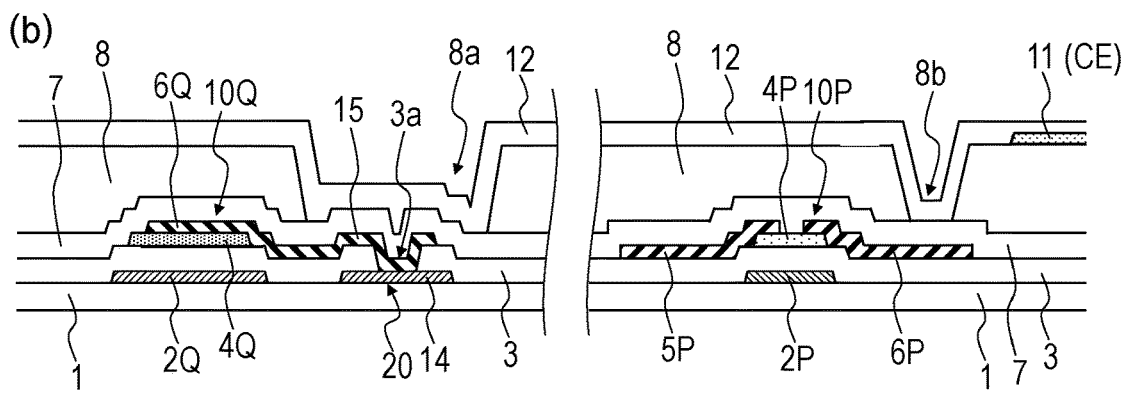
Figure 11:
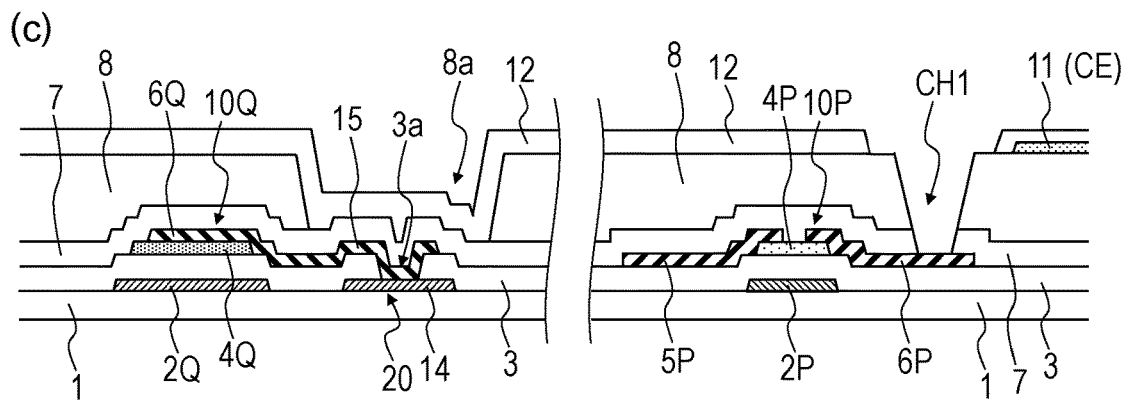
Figure 11:
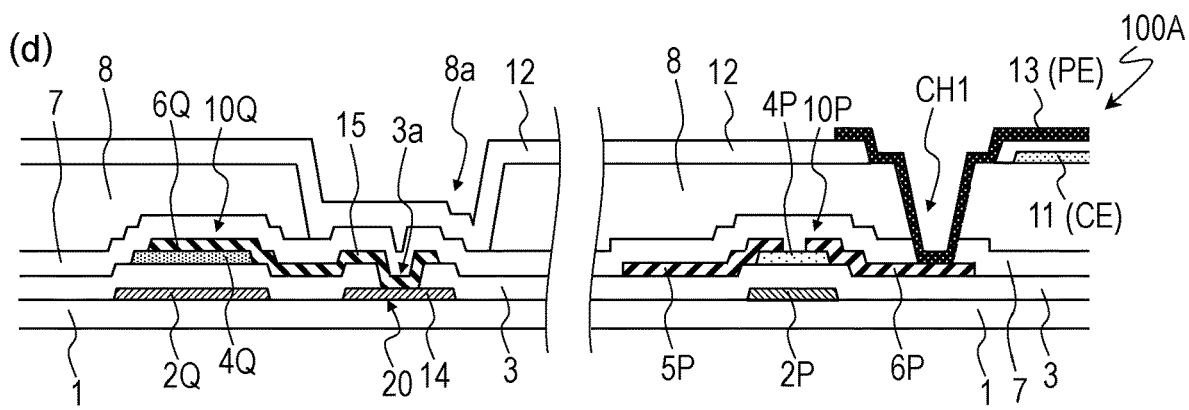

Next, as illustrated in FIG. 10(*a*), a source conductive film (the thickness of which, for example, is equal to or greater than 50 nm and is equal to or smaller than 500 nm) is formed on the substrate 1, and the source conductive film is patterned using the photolithographic process. Thus, the source electrodes 5P and 5Q and the drain electrodes 6P and 6Q that are brought into contact with the source wiring line SL and the oxide semiconductor layers 4P and 4Q are formed. Accordingly, the pixel TFT 10P and the circuit TFT 10Q are obtained. At this time, the second conductive layer 15 is also formed. Because the second conductive layer 15 is formed on the gate insulating layer 3 and within the opening portion 3*a* in the gate insulating layer 3, the source and gate metal connection portion 20 at which the first conductive layer 14 and the second conductive layer 15 are connected to each other is formed. As the source conductive film, a film that contains a metal, such as aluminum (Al), tungsten (W), molybdenum (Mo), tantalum (Ta), chrome (Cr), titanium (Ti), or copper (Cu), an alloy of these, or a metal nitride of these can be suitably used. Furthermore, a stacked film that results from stacking these films may be used. Here, as the source conductive film, a stacked film that results from forming a Cu film and a Ti film in this order is used.

Subsequently, as illustrated in FIG. 10(*b*), the inorganic insulating layer 7 (the thickness of which, for example, is equal to or greater than 100 nm and is equal to or smaller than 500 nm, and, preferably, is equal to or greater than 150 nm and is equal to or smaller than 500 nm) is formed with the CVD method or the like in such a manner as to cover the pixel TFT 10P and the circuit TFT 10Q. As the inorganic insulating layer 7, an inorganic insulating film (a passivation film), such as a silicon oxide (SiOx) film, a silicon nitride (SiNx) film, a silicon oxynitride (SiOxNy; x>y) film, a silicon nitride oxide (SiNxOy; x>y) film, can be used. The inorganic insulating layer 7 may have a stacked structure. Here, as the inorganic insulating layer 7, a stacked film, an upper layer of which is the SiNx layer and a lower layer of which is the SiOx layer, is formed.

Thereafter, as illustrated in FIG. 10(*c*), the organic insulating layer 8 (the thickness of which, for example, is equal to or greater than 1 μm and is equal to or smaller than 3 μm, and, preferably, is equal to or greater than 2 μm and is equal to or smaller than 3 μm) is formed on the inorganic insulating layer 7. As a material of the organic insulating layer 8, for example, a photosensitive resin material can be used.

Next, as illustrated in FIG. 10(*d*), the patterning of the organic insulating layer 8 is performed, and thus the opening portion 8a that is positioned over the source and gate metal connection portion 20 and an opening portion 8b through which a portion of the inorganic insulating layer 7, which is positioned on the drain electrode 6P of the pixel TFT 10P, is exposed are formed. In a case where as a material of the organic insulating layer 8, the photosensitive resin material is used, this patterning can be performed by performing exposing and developing through a mask.

Subsequently, as illustrated in FIG. 11(a), a first transparent conductive film (the thickness of which is equal to or greater than 50 nm and is equal to or smaller than 200 nm) is formed on the organic insulating layer 8, and the first transparent conductive film is patterned using the photolithographic process. Thus, the lower transparent electrode 11 (the common electrode CE) is formed. As the first transparent conductive film, for example, an indium and tin oxide (ITO) film, an indium and zinc oxide (In—Zn—O-based oxide) film, a zinc oxide film (ZnO film), or the like can be used. Here, as the transparent conductive film, the ITO film is formed.

Thereafter, as illustrated in FIG. 11(b), the dielectric layer 12 (the thickness of which, for example, is equal to or greater than 70 nm and equal to or smaller than 300 nm) is formed that covers the lower transparent electrode 11. As the dielectric layer 12, a silicon nitride (SiNx) film, a silicon oxide (SiOx) film, a silicon oxynitride (SiOxNy; x>y) film, a silicon nitride oxide (SiNxOy; x>y) film, and the like can be suitably used. Here, as the dielectric layer 12, the SiNx film is formed.

Next, as illustrated in FIG. 11(c), a resist layer that is not illustrated is formed, and etching of the dielectric layer 12 and the inorganic insulating layer 7 is performed using the resist layer and the organic insulating layer 8 as an etching mask, thereby forming the pixel contact hole CH1.

Thereafter, as illustrated in FIG. 11(d), a second transparent conductive film is formed on the dielectric layer 12 and within the pixel contact hole CH1, and the second transparent conductive film is patterned using the photolithographic process, thereby forming the upper transparent electrode 13 (the pixel electrode PE). The second transparent conductive film may have the same suitable material and thickness as the first transparent conductive film. Here, as the transparent conductive film, the ITO film is formed.

In this manner, the active-matrix substrate 100A can be manufactured.

Noted that it is preferable that the distance d from the edge of the second conductive layer 15 to the edge of the organic insulating layer 8 (refer to FIG. 7) is set considering the precision of process in performing the process of manufacturing the active-matrix substrate 100A. Specifically, it is preferable that, in a case where the size of the substrate is comparatively small, the distance d is equal to or greater than 1.0 μm, and it is preferable that, in a case where the size of the substrate is comparatively large, the distance d is equal to or greater than 3.0 μm. The reason for this will be described below.

In a case where the size of the substrate is comparatively small (for example, is equal to or smaller than 730×920 mm), the precision of photo-alignment is approximately ±0.5 μm, and variation in the line width of each of the source wiring-line layer and the organic insulating layer 8 is approximately ±0.25 μm. For this reason, by setting the distance d to be equal to or greater than 1.0 μm, the edge of the second conductive layer 15 can be set in such a manner as not to be covered with the organic insulating layer 8.

Furthermore, in a case where the size of the substrate is comparatively large (for example, is equal to or greater than 2160×2460 mm), the precision of photo-alignment is approximately ±1.0 μm, and variation in the line width of each of the source wiring-line layer and the organic insulating layer 8 is approximately ±1.0 μm. For this reason, by setting the distance d to be equal to or greater than 3.0 μm, the edge of the second conductive layer 15 can be set in such a manner as not to be covered with the organic insulating layer 8.

Embodiment 1B

Figure 12:
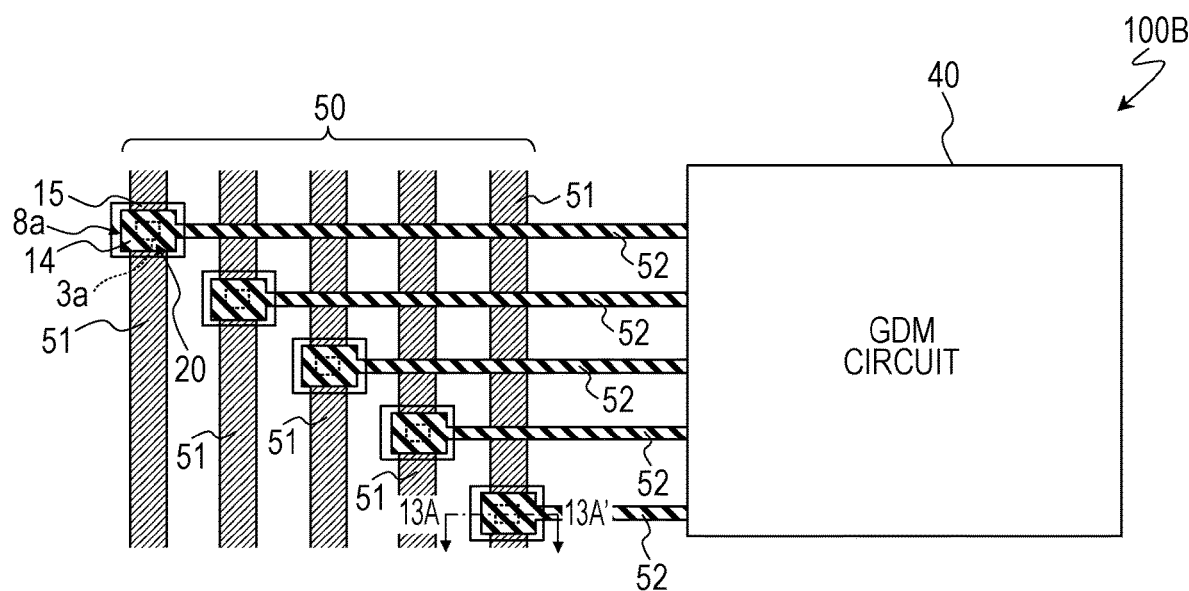
FIG. 12 is a plan-view diagram that schematically illustrates an active-matrix substrate 100B according to an embodiment of the present invention, and illustrates the vicinity of a GDM wiring-line area 50.
Figure 13:
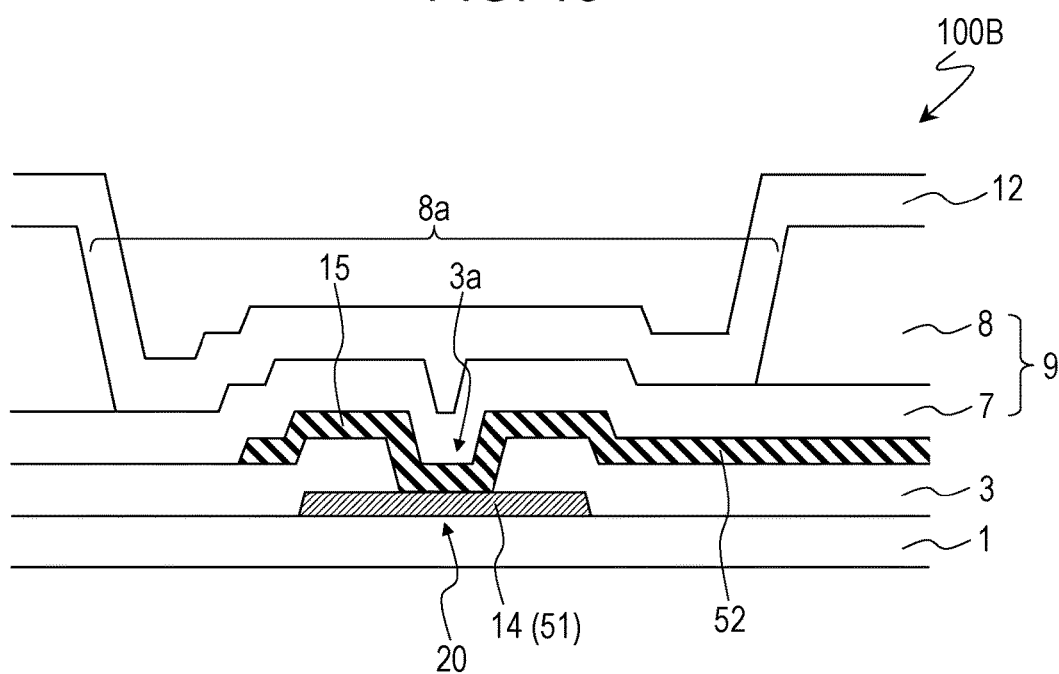
FIG. 13 is a cross-sectional diagram cut along line 13A-13A' in FIG. 12.

The active-matrix substrate 100B in the present embodiment is described with reference to FIGS. 12 and 13. In the present embodiment, the source and gate metal connection portion 20 that is not covered with the organic insulating layer 8 is positioned within the GDM wiring-line area 50. FIG. 12 is a plan-view diagram that schematically illustrates the vicinity of the GDM wiring-line area 50. FIG. 13 is a cross-sectional diagram cut along line 13A-13A' in FIG. 12.

As illustrated in FIGS. 12 and 13, a plurality of main wiring lines 51 that extend in a given direction are formed within GDM wiring-line areas 50. Furthermore, a plurality of branch wiring lines 52 are formed that extend in a direction which intersects (for example, orthogonally intersects) a direction in which a plurality of main wiring lines 51 extend. The plurality of branch wiring lines 52 connect the plurality of main wiring lines 51 and the GDM circuit 40.

The source and gate metal connection portion 20 is a portion that connects the main wiring line 51 and the branch wiring line 52 which corresponds to the main wiring line 51. Here, the plurality of main wiring lines 51 are formed from the same conductive film as the plurality of gate wiring lines GL, and the plurality of branch wiring lines 52 are formed from the same conductive film as the plurality of source wiring lines SL. One portion of the main wiring line 51 is the first conductive layer 14, and one portion of the branch wiring line 52 is the second conductive layer 15.

Figure 14:
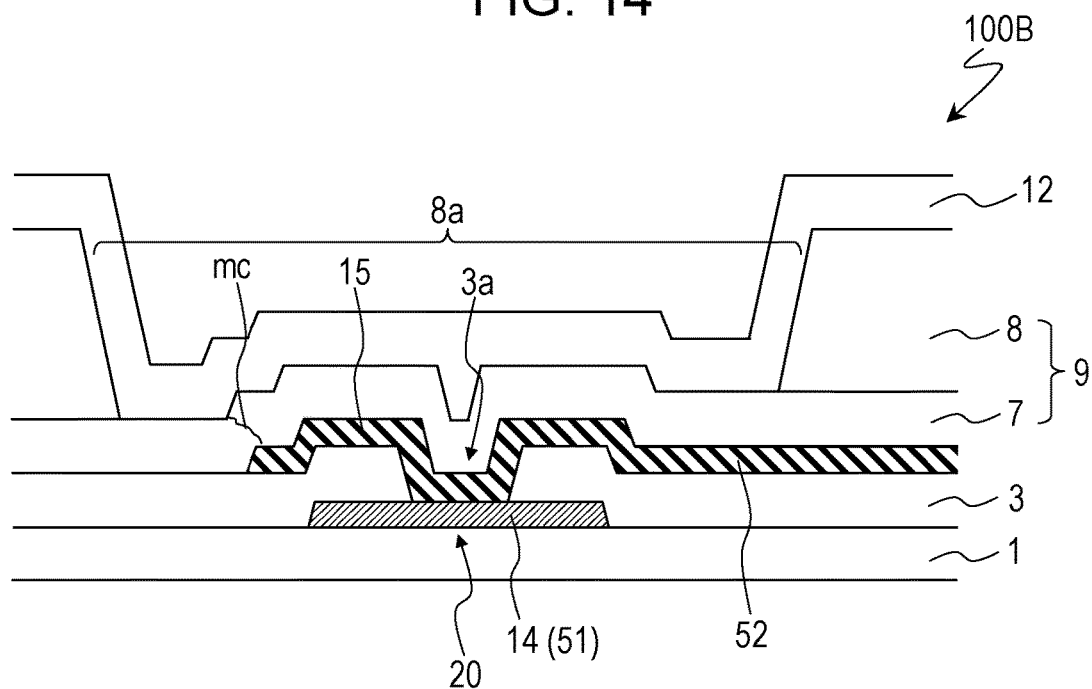
FIG. 14 is a cross-sectional diagram cut along the line 13A-13A' in FIG. 12, and illustrates a situation in which a microcrack mc occurs in an inorganic insulating layer 7 in the active-matrix substrate 100B.

The opening portion 8a is formed in a portion of the organic insulating layer 8, which corresponds to the source and gate metal connection portion 20. More precisely, the source and gate metal connection portion 20 is not covered with the organic insulating layer 8. For this reason, as illustrated in FIG. 14, although the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of the active-matrix substrate 100B is suppressed from being reduced.

It is noted that in FIGS. 12 and 13, a configuration is illustrated in which the main wiring line 51 is formed from the same conductive film as the gate wiring line GL and the branch wiring line 52 is formed from the same conductive film as the source wiring line SL, but that conversely, the main wiring line 51 may be formed from the same conductive film as the source wiring line SL and the branch wiring line 52 may be formed from the same conductive film as the gate wiring line GL.

Embodiment 1C

Figure 15:
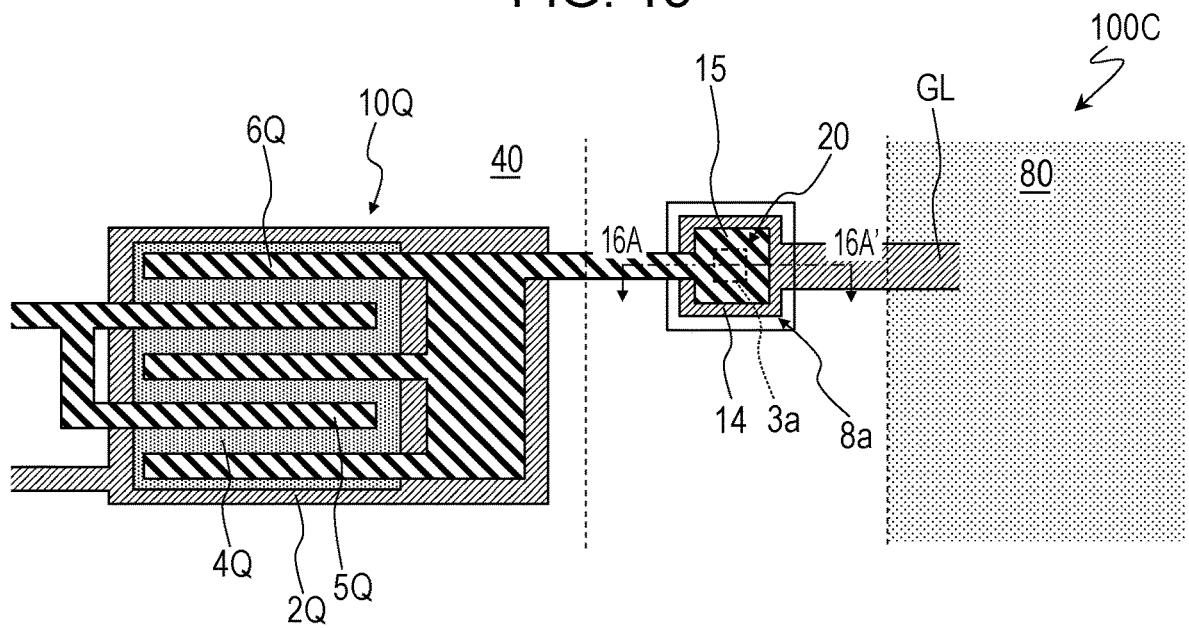
FIG. 15 is a plan-view diagram that schematically illustrates an active-matrix substrate 100C according to an embodiment of the present invention, and illustrates the vicinity of the circuit TFT 10Q that finally performs outputting of a scanning signal to a gate wiring line GL, among the plurality of circuit TFTs 10Q of the GDM circuit 40.
Figure 16:
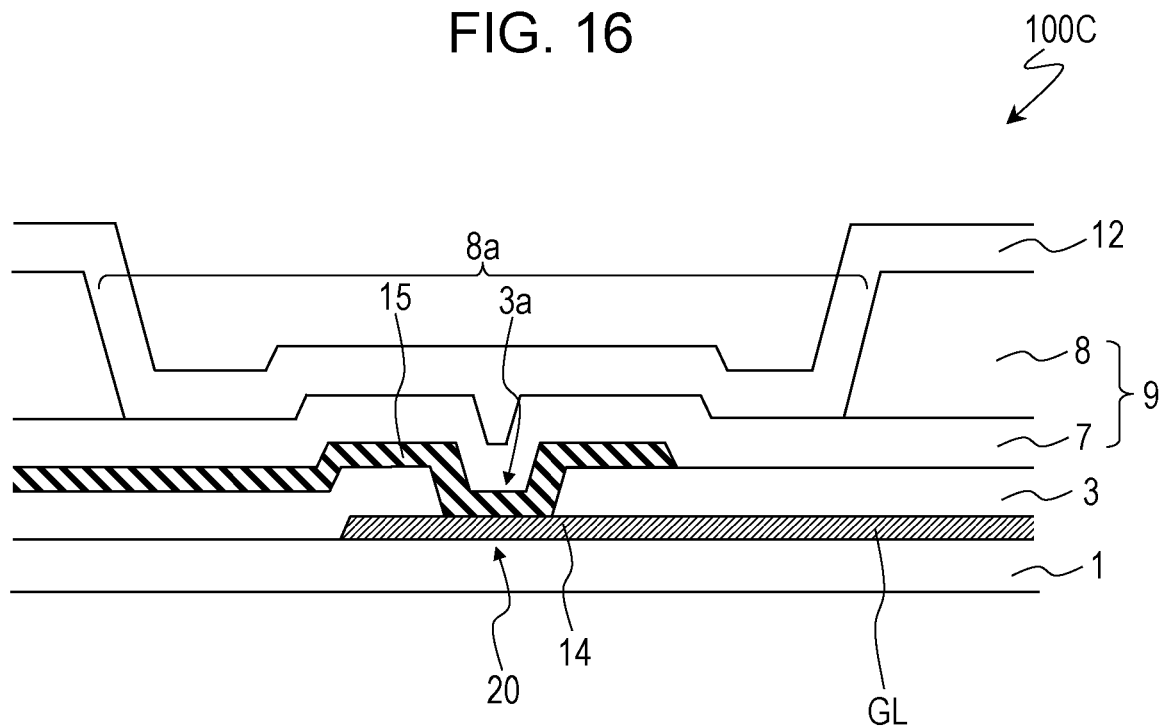
FIG. 16 is a cross-sectional diagram cut along line 16A-16A' in FIG. 15.

An active-matrix substrate 100C in the present embodiment is described with reference to FIGS. 15 and 16. In the present embodiment, the source and gate metal connection portion 20 that is not covered with the organic insulating layer 8 is positioned between the GDM circuit 40 and the display area 80. FIG. 15 is a plan-view diagram that schematically illustrates the vicinity of the circuit TFT 10Q which finally performs outputting of the scanning signal to the gate wiring line GL, among a plurality of circuit TFTs 10Q of the GDM circuit 40. FIG. 16 is a cross-sectional diagram cut along line 16A-16A' in FIG. 15.

The circuit TFT 10Q that is illustrated in each of FIGS. 15 and 16 has the gate electrode 2Q, the oxide semiconductor layer 4Q, the source electrode 5Q, and the drain electrode 6Q. More precisely, the circuit TFT 10Q is the oxide semiconductor TFT. The oxide semiconductor layer 4Q of the circuit TFT 10Q is formed from the same oxide semiconductor film as the oxide semiconductor layer 4P of the pixel TFT 10P.

In an example that is illustrated in each of FIGS. 15 and 16, the source and gate metal connection portion 20 is a portion that connects the GDM circuit 40 and a certain gate wiring line GL among the plurality of gate wiring lines GL, between the GDM circuit 40 and the display area 80.

The first conductive layer 14 that constitutes the source and gate metal connection portion 20 is one end portion of the gate wiring line GL. Furthermore, the second conductive layer 15 extends from the drain electrode 6Q of the circuit TFT 10Q and is electrically connected to the drain electrode 6Q. The second conductive layer 15 is connected to the first conductive layer 14 in the source and gate metal connection portion 20, and thus, the outputting of the scanning signal from the GDM circuit 40 to the gate wiring line GL is possible.

Figure 17:
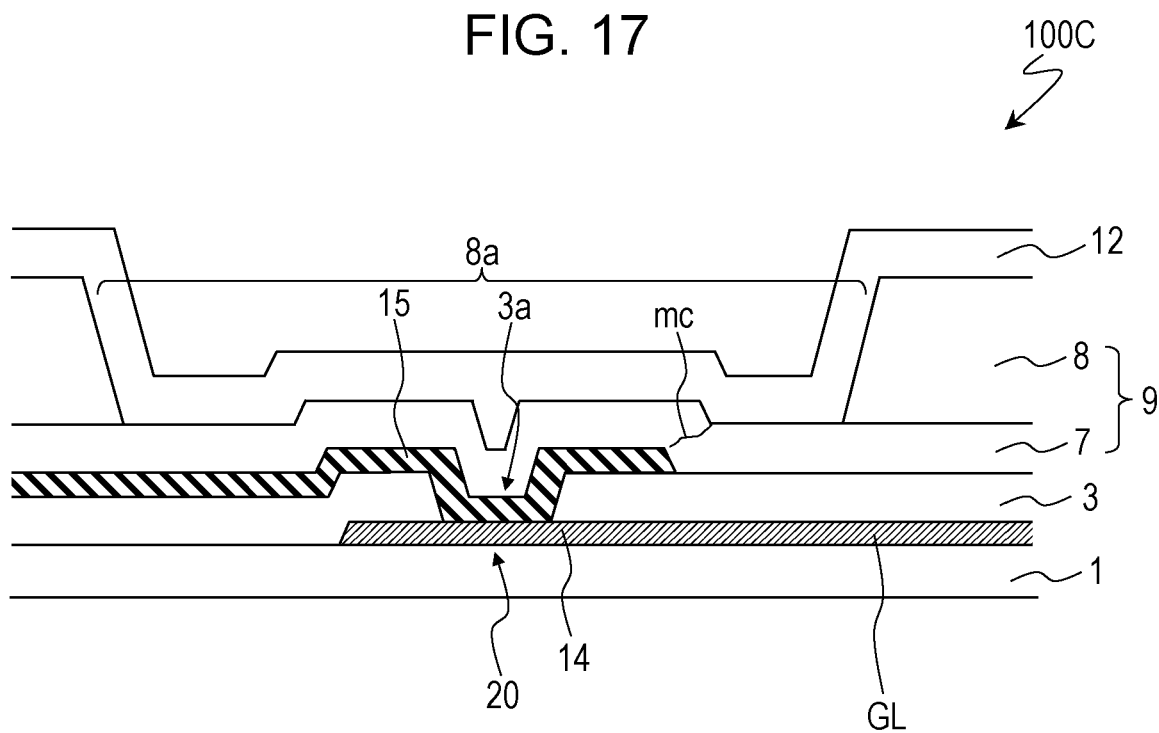
FIG. 17 is a cross-sectional diagram cut along the line 16A-16A' in FIG. 15, and illustrates a situation in which the microcrack mc occurs in the inorganic insulating layer 7 in the active-matrix substrate 100C.

The opening portion 8a is formed in a portion of the organic insulating layer 8, which corresponds to the source and gate metal connection portion 20. More precisely, the source and gate metal connection portion 20 is not covered with the organic insulating layer 8. For this reason, as illustrated in FIG. 17, although the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of the active-matrix substrate 100C is suppressed from being reduced.

Embodiment 1D

Figure 18:
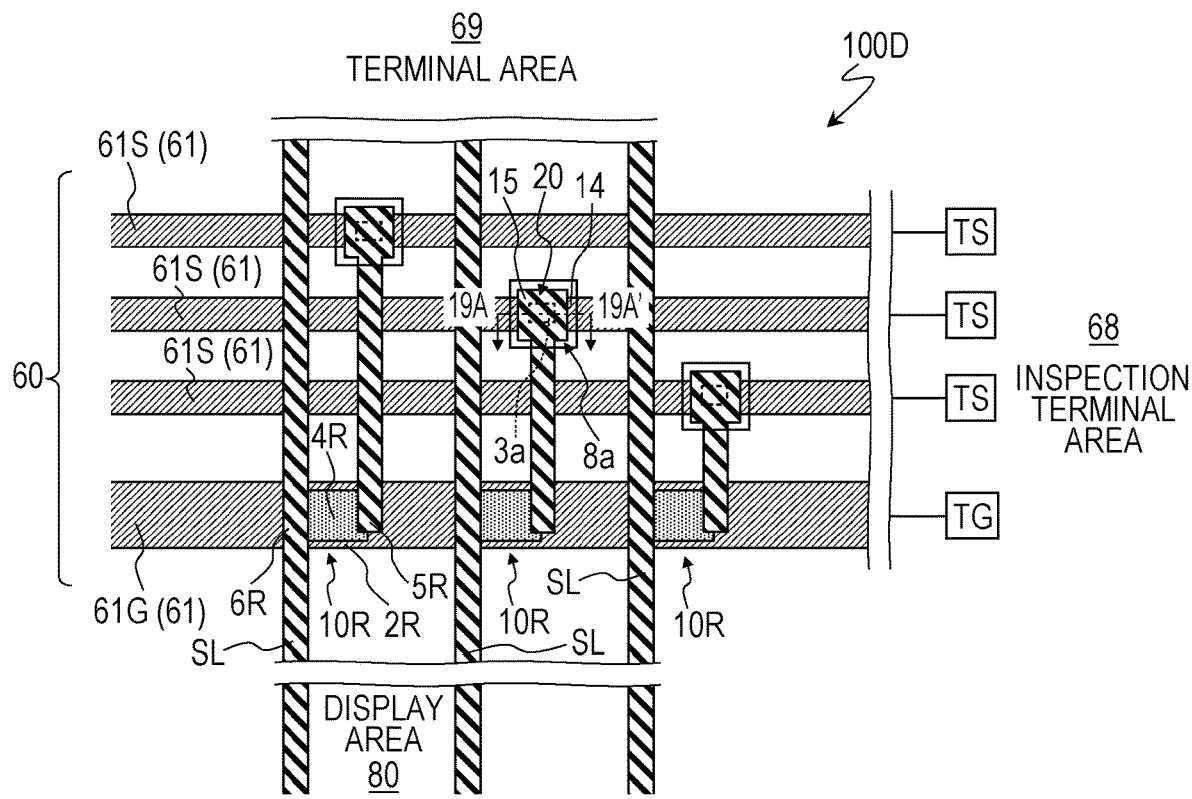
FIG. 18 is a plan-view diagram that schematically illustrates an active-matrix substrate 100D according to an embodiment of the present invention, and illustrates the vicinity of an inspection circuit 60.
Figure 19:
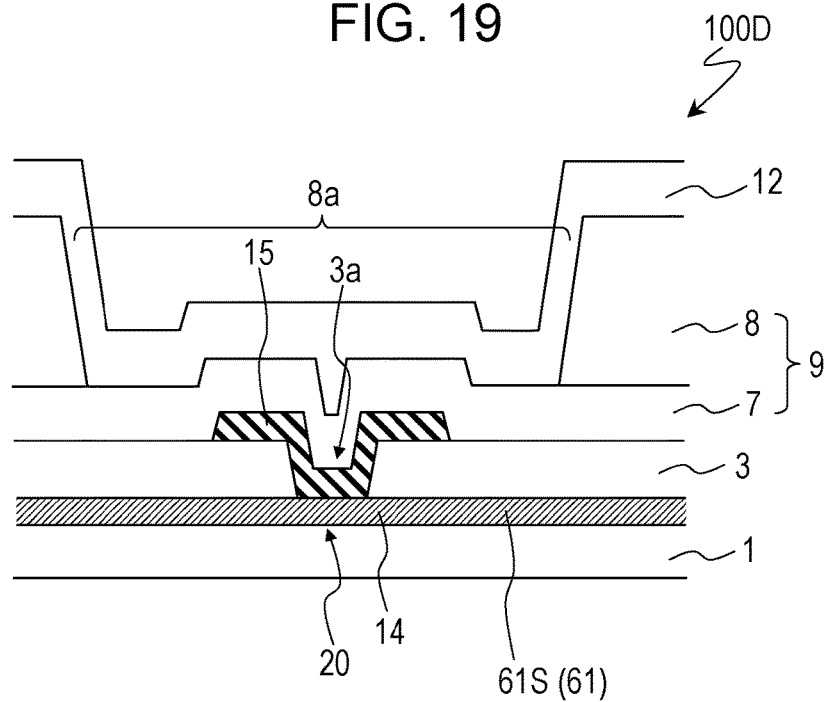
FIG. 19 is a cross-sectional diagram cut along line 19A-19A' in FIG. 18.

An active-matrix substrate 100D in the present embodiment is described with reference to FIGS. 18 and 19. In the present embodiment, the source and gate metal connection portion 20 that is not covered with the organic insulating layer 8 is positioned within the inspection circuit 60 that is formed on the substrate 1 in the non-display area 90. FIG. 18 is a plan-view diagram that schematically illustrates the vicinity of the inspection circuit 60. FIG. 19 is a cross-sectional diagram cut along line 19A-19A' in FIG. 18.

The inspection circuit 60, as illustrated in FIGS. 18 and 19, includes a plurality of inspection TFTs 10R and a plurality of inspection wiring lines 61 that supply signals to the plurality of inspection TFTs 10R, respectively.

Each of the plurality of inspection TFTs 10R has a gate electrode 2R, an oxide semiconductor layer 4R, a source electrode 5R, and a drain electrode 6R. More precisely, the inspection TFT 10R is the oxide semiconductor TFT. The oxide semiconductor layer 4R of the inspection TFT 10R may be formed from the same oxide semiconductor film as the oxide semiconductor layer 4P of the pixel TFT 10P.

A plurality of inspection wiring lines 61 each include an inspection gate wiring line 61G and an inspection source wiring line 61S. The inspection gate wiring line 61G is connected to an inspection gate terminal TG in the inspection terminal area 68. The inspection source wiring line 61S is connected to an inspection source terminal TS in the inspection terminal area 68. The plurality of inspection wiring lines 61 that include the inspection gate wiring line 61G and the inspection source wiring line 61S are formed from the same conductive film as the plurality of gate wiring lines GL.

The gate electrode 2R of the inspection TFT 10R is electrically connected to the inspection gate wiring line 61G. The source electrode 5R of the inspection TFT 10R is electrically connected to the inspection source wiring line 61S. The drain electrode 6R of the inspection TFT 10R is electrically connected to any one of the plurality of source wiring lines SL.

In the inspection circuit 60, at the time of lighting inspection, with a signal that is supplied from the inspection gate terminal TG to the gate electrode 2R of the inspection TFT 10R through the inspection gate wiring line 61G, all inspection TFTs 10R are turned on. As a result, a signal can be supplied from the inspection source terminal TS to each source wiring line SL through the inspection source wiring line 61S and the inspection TFT 10R in an on state, and lighting inspection can be performed. After the lighting inspection, when a normal operation is performed, a gate voltage of the inspection TFT 10R is controlled in such a manner that the inspection TFT 10R is in an off state.

In an example that is illustrated in each of FIGS. 18 and 19, the source and gate metal connection portion 20 is a portion that connects the inspection TFT 10R and the inspection wiring line 61 (here, the inspection source wiring line 61S) that corresponds to the inspection TFT 10R. One portion of the inspection source wiring line 61S is the first conductive layer 14, and a portion that extends from the source electrode 5R of the inspection TFT 10R is the second conductive layer 15.

Figure 20:
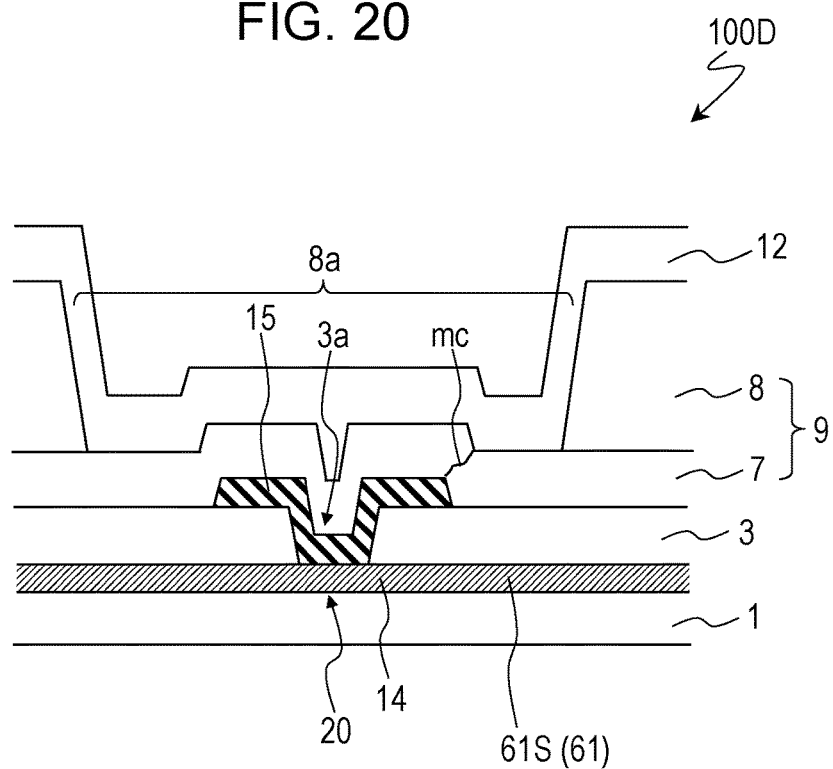
FIG. 20 is a cross-sectional diagram cut along the line 19A-19A' in FIG. 18, and illustrates a situation in which the microcrack mc occurs in the inorganic insulating layer 7 in the active-matrix substrate 100D.

The opening portion 8a is formed in a portion of the organic insulating layer 8, which corresponds to the source and gate metal connection portion 20. More precisely, the source and gate metal connection portion 20 is not covered with the organic insulating layer 8. For this reason, as illustrated in FIG. 20, although the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of the active-matrix substrate 100D is suppressed from being reduced.

It is noted that an example in which one inspection TFT 10R is positioned for one source wiring line SL here, but that one inspection TFT 10R may be provided for two or more source wiring lines SL.

Moreover, instead of the semiconductor chip that constitutes the source driver, the semiconductor chip that constitutes the gate driver may be packaged on the active-matrix substrate. A configuration of the inspection circuit in this case is the same as the configuration that is illustrated in FIG. 18 and other figures. However, the drain electrode 6R of the inspection TFT 10R is connected to a corresponding gate wiring line GL. A signal that is supplied from the inspection source wiring line 61S is input into each gate wiring line GL through the inspection TFT 10R.

[Structure of TFT]

Structures of the pixel TFT 10P, the circuit TFT 10Q, and the inspection TFT 10R are not limited to the example described above. The pixel TFT 10P, the circuit TFT 10Q, and the inspection TFT 10R may have a top contact structure in which a source electrode and a drain electrode are brought into contact with an upper surface of a semiconductor layer and may have a bottom contact structure in which the source electrode and the drain electrode is brought into contact with a lower surface of the semiconductor layer. Furthermore, the pixel TFT 10P, the circuit TFT 10Q, and the inspection TFT 10R may have a channel etch structure, and may have an etch stop structure.

In an etch stop type TFT, an etch stop layer is formed on the channel area. End portion lower surfaces on the channel side, of the source electrode and the drain electrode, for example, are positioned on the etch stop layer. For example, the etch stop layer that covers a portion of the oxide semiconductor layer, which is a channel area, is formed, and then a conductive film for source and drain electrodes is formed on the oxide semiconductor layer and the etch stop layer and separation of a source and a drain is performed. Thus, the etch stop type TFT is formed.

In the channel etch type TFT, as illustrated in FIG. 3, the end portion lower surfaces on the channel side, of the source electrode and the drain electrode, are arranged in such a manner as to come into contact with an upper surface of the oxide semiconductor layer, without the etch stop layer being formed on the channel area. For example, the conductive film for the source and drain electrodes is formed on the oxide semiconductor layer and the separation of the source and the drain is performed. Thus, the channel etch type TFT is formed. In some cases, in a process of separating the source and the drain, a surface portion of the channel area is etched.

[Oxide Semiconductor]

An oxide semiconductor that is included in the oxide semiconductor layer 4P, 4Q, and 4R may be an amorphous oxide semiconductor, and may be a crystalline oxide semiconductor that has a crystalline portion. As the crystalline oxide semiconductor, a polycrystalline oxide semiconductor, a micro-crystalline oxide semiconductor, a crystalline oxide semiconductor in which a c-axis aligns roughly vertically with a layer surface, and the like are given.

The oxide semiconductor layer 4P, 4Q, and 4R each may have a stacked structure in which two or more layers are involved. In a case where the oxide semiconductor layers 4P, 4Q, and 4R each have the stacked structure, the oxide semiconductor layers 4P, 4Q, and 4R each may include a amorphous oxide semiconductor layer and a crystalline oxide semiconductor layer. Alternatively, a plurality of crystalline oxide semiconductor layers that have different crystalline structures may be included. Furthermore, a plurality of amorphous oxide semiconductor layers may be included. In a case where the oxide semiconductor layers 4P, 4Q, and 4R each have a two-layered structure in which an upper layer and a lower layer are included, it is preferable that an energy gap of the oxide semiconductor that is included in the upper layer is greater than an energy gap of the oxide semiconductor that is included in the lower layer. However, in a case where a difference in the energy gap between the upper and lower layers is comparatively small, the energy gap of the oxide semiconductor in the lower layer may be greater than the energy gap of the oxide semiconductor in the upper layer.

Materials and structures of the amorphous oxide semiconductor and each crystalline oxide semiconductor, a film formation method, a structure of the oxide semiconductor layer that has a stacked structure, and the like, for example, are described in Japanese Unexamined Patent Application Publication No. 2014-007399. For reference, the entire contents of Japanese Unexamined Patent Application Publication No. 2014-007399 are incorporated herein by reference.

The oxide semiconductor layers 4P, 4Q, and 4R each may have, for example, at least one type of metal element among In, Ga, and Zn. In the present embodiment, the oxide semiconductor layers 4P and 4Q each contain, for example, an In—Ga—Zn—O-based semiconductor (for example, oxide indium gallium zinc). The In—Ga—Zn—O-based semiconductor here is a ternary oxide material that consists of Indium (In), Gallium (Ga), and Zinc (Zn). A ratio (a composition ratio) among In, Ga, and Zn is not particularly limited. Examples of the ratio include In:Ga:Zn=2:2:1, In:Ga:Zn=1:1:1, In:Ga:Zn=1:1:2, and the like. The oxide semiconductor layers 5P and 5Q can be formed from an oxide semiconductor film that includes an In—Ga—Zn—O-based semiconductor.

The In—Ga—Zn—O-based semiconductor may be amorphous, and may be crystalline (may include a crystalline portion). It is preferable that a crystalline In—Ga—Zn—O-based semiconductor is a crystalline in-Ga—Zn—O-based semiconductor in which a c-axis aligns roughly vertically with a layer surface.

It is noted that a crystal structure of the crystalline In—Ga—Zn—O-based semiconductor, for example, is disclosed in Japanese Unexamined Patent Application Publication Nos. 2014-007399, 2012-134475, and 2014-209727, which are described above, and others. For reference, the entire contents of Japanese Unexamined Patent Application Publication Nos. 2012-134475 and 2014-209727 are incorporated herein by reference. A TFT that has an In—GA—Zn—O-based semiconductor layer has high mobility (which is more than 20 times higher than that of an a-Si TFT) and a small amount of leak current (which is less than one-hundredth of that of the a-Si TFT). Because of this, the TFT is suitably used as a drive TFT (for example, a TFT that is included in a drive circuit which is provided on the same substrate as a display area, in the vicinity of the display area that includes a plurality of pixels) and a pixel TFT (a TFT that is provided in a pixel).

The oxide semiconductor layers 4P, 4Q, and 4R each may contain any other oxide semiconductor instead of the In—Ga—Zn—O-based semiconductor. For example, an In—Sn—Zn—O-based semiconductor (for example, $In_2O_3$—$SnO_2$—ZnO; InSnZnO) may be contained. The In—Sn—Zn—O-based semiconductor is a ternary oxide material that consists of Indium (In), Tin (Sn), and Zinc (Zn). Alternatively, the oxide semiconductor layers 4P, 4Q, and 4R each may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, Cadmium oxide (CdO), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, or the like.

Embodiment 2

An active-matrix substrate in the present embodiment includes oxide semiconductor TFT and a crystalline silicon TFT that are formed on the same substrate.

In the present embodiment, as the pixel TFT, for example, the oxide semiconductor TFT an activation layer of which is an In—Ga—Zn—O-based semiconductor film is used. It is possible that the pixel TFT 10p which is described with reference to FIGS. 2 and 3 is used as the pixel TFT.

One portion (for example, a gate driver) of a peripheral drive circuit is integrally (monolithically) formed on the same substrate as the pixel TFT. A remaining portion (for example, a source driver) of the peripheral drive circuit, for example, is packaged on a substrate with COG packaging.

The peripheral drive circuit is provided in a non-display area (a picture-frame area). As a TFT (a circuit TFT) that constitutes the peripheral drive circuit, for example, the crystalline silicon TFT an activation layer of which is a polycrystal silicon film is used. In this manner, when the oxide semiconductor TFT is used as the pixel TFT and when the crystalline silicon TFT is used as the circuit TFT, it is possible that power consumption is reduced in the display area and it is possible that the picture-frame area is reduced. Furthermore, the crystalline silicon TFT can be used as the inspection TFT that is provided in the non-display area.

In this manner, the active-matrix substrate in the present embodiment includes the oxide semiconductor TFT that includes the oxide semiconductor layer, as the first TFT (the pixel TFT) that is provided in the display area, and includes the crystalline silicon TFT that includes a crystalline silicon semiconductor layer, as the second TFT (the circuit TFT or the inspection TFT) that is provided in the non-display area.

Figure 21:
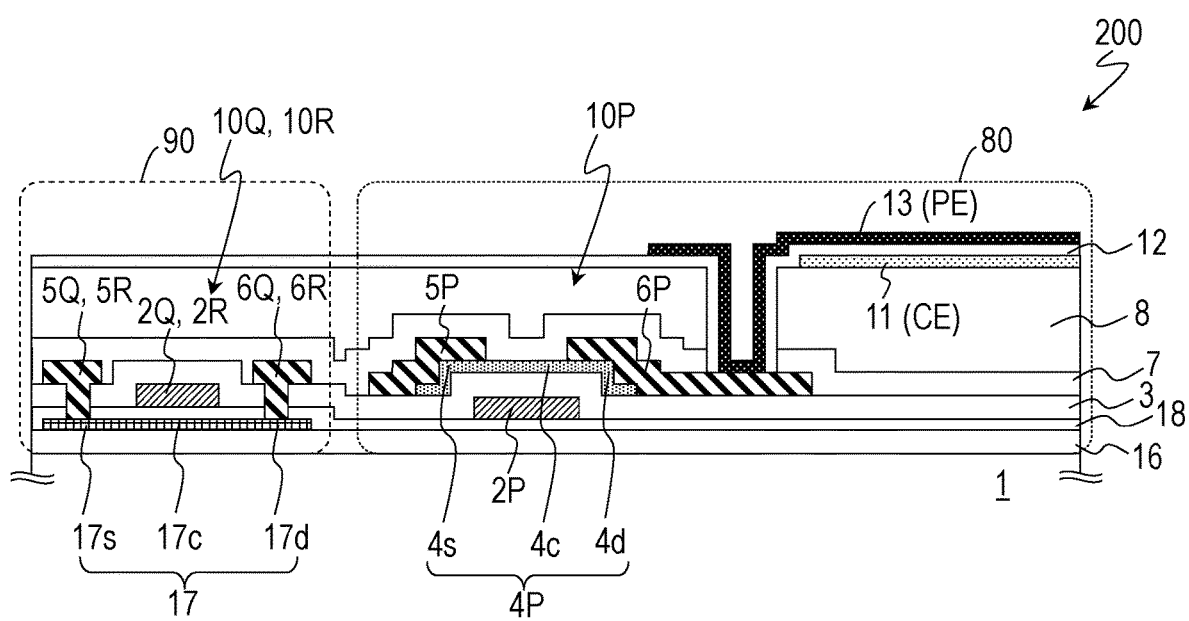
FIG. 21 is a cross-sectional diagram that schematically illustrates an active-matrix substrate 200 according to an embodiment of the present invention.

FIG. 21 is a cross-sectional diagram illustrating a first TFT (the pixel TFT 10P) and a second TFT (the circuit TFT 10Q or the inspection TFT 10R) in an active-matrix substrate 200 according to the present embodiment.

In this example, the pixel TFT 10P is the oxide semiconductor TFT that has the bottom gate structure, and the circuit TFT 10Q and the inspection TFT 10R is the crystalline silicon TFT that has the top gate structure.

A planar structure of the active-matrix substrate 200 is the same as the structure that is described with reference to FIG. 1, and thus a description thereof is omitted.

In the active-matrix substrate 200, the pixel TFT 10P is formed in each pixel in the display area 80, and the circuit TFT 10Q and the inspection TFT 10R are formed in the non-display area 90.

The active-matrix substrate 200 includes the substrate 1, a base film 16 that is formed on the substrate 1, the pixel TFT 10P that is formed on the base film 16, and the circuit TFT 10Q and the inspection TFT 10R, which are formed on the base film 16. The circuit TFT 10Q and the inspection TFT 10R are the crystalline silicon TFT that has an activation area that is mostly formed from crystalline silicon. The pixel TFT 10P is the oxide semiconductor TFT that has the activation area that is mostly formed from the oxide semiconductor. The circuit TFT 10Q, the inspection TFT 10R, and the pixel TFT 10P are integrally built on the substrate 1. The "activation area" here refers to an area on which a channel is formed, of the semiconductor layer that is the activation layer of the TFT, and is also called a "channel area".

The circuit TFT 10Q and the inspection TFT 10R have a crystalline silicon semiconductor layer (for example, a low-temperature polysilicon layer) 17 that is formed on the base film 16, a lower insulating layer 18 that covers the crystalline silicon semiconductor layer 17, and the gate electrodes 2Q and 2R that are provided on the lower insulating layer 18. A portion of the lower insulating layer 18, which is positioned between the crystalline silicon semiconductor layer 17 and the gate electrodes 2Q and 2R, functions as a gate insulating film of the circuit TFT 10Q and the inspection TFT 10R. The crystalline silicon semiconductor layer 17 has an area (the activation area) 17c on which a channel is formed, and a source area 17s and a drain area 17d that are positioned on both sides, respectively, of the activation area. In this example, a portion of the crystalline silicon semiconductor layer 17, which overlaps the gate electrodes 2Q and 2R through the lower insulating layer 18, is an activation area 17c. The circuit TFT 10Q and the inspection TFT 10R have the source electrodes 5Q and 5R and the drain electrodes 6Q and 6R, which are connected to the source area 17s and the drain area 17d, respectively. The source electrodes 5Q and 5R and the drain electrodes 6Q and 6R may be provided on an interlayer insulating film (here, the gate insulating layer 3) that covers the gate electrodes 2Q and 2R and the crystalline silicon semiconductor layer 17, and may be connected to the crystalline silicon semiconductor layer 17 within a contact hole that is formed in the interlayer insulating film.

The pixel TFT 10P has the gate electrode 2P that is provided on the base film 16, the gate insulating layer 3 that covers the gate electrode 2P, and the oxide semiconductor layer 4P that is positioned on the gate insulating layer 3. As illustrated, the lower insulating layer 18 that is the gate insulating film of the circuit TFT 10Q and the inspection TFT 10R may extend up to an area in which the pixel TFT 10P is formed. A portion of the gate insulating layer 3, which is positioned between the gate electrode 2P and the oxide semiconductor layer 4P, functions as the gate insulating film of the pixel TFT 10P. The oxide semiconductor layer 4P has an area (the activation area) 4c on which a channel is formed, and a source contact area 4s and a drain contact area 4d that are positioned on both sides, respectively, of the activation area. In this example, a portion of the oxide semiconductor layer 4P, which overlaps the gate electrode 2P through the gate insulating layer 3, is an activation area 4c. Furthermore, the pixel TFT 10P further has the source electrode 5P and the drain electrode 6P that are connected to the source contact area 4s and the drain contact area 4d, respectively. It is noted that a configuration in which the base film 16 is not provided on the substrate 1 is possible.

The circuit TFT 10Q, and the inspection TFT 10R and the pixel TFT 10P are covered with the inorganic insulating layer (the passivation film) 7 and the organic insulating layer (the planarizing film) 8. The gate electrode 2P, the source electrode 5P, and the drain electrode 6P of the pixel TFT 10P are connected to a gate wiring line (not illustrated), a source wiring line (not illustrated), and the pixel electrode PE (the upper transparent electrode 13), respectively. In this example, the drain electrode 6P is connected to a corresponding pixel electrode PE within an opening portion that is formed on the inorganic insulating layer 7 and the organic insulating layer 8. The display signal is supplied to the source electrode 5P through a source wiring line, and necessary electric charge is written into the pixel electrode PE based on the scanning signal from the gate wiring line.

It is noted that, as illustrated, the lower transparent electrode 11 may be formed, as a common electrode CE, on the organic insulating layer 8, and that the dielectric layer 12 may be formed between the lower transparent electrode 11 (the common electrode CE) and the pixel electrode PE. In this case, an opening in the shape of a slit may be provided on the pixel electrode PE. The active-matrix substrate 200, for example, can find application in FFS-mode liquid crystal display devices. In this example, an electric field is generated that is expressed as a line of electric force which gets out of the pixel electrode PE, passes through a liquid crystal layer (not illustrated) and further through the opening in the shape of a slit in the pixel electrode PE, and gets to the common electrode CE. The electric field has a component in the horizontal direction with respect to the liquid crystal layer. As a result, the electric field in the horizontal direction can be applied to the liquid crystal layer. In a horizontal-direction electric field method, a liquid crystal molecule does not rise up from the substrate. Because of this, there is an advantage that the horizontal-direction electric field method can realize a wider viewing angle than a vertical-direction electric field method.

In an example that is illustrated, the circuit TFT 10Q and the inspection TFT 10R have the top gate structure in which the crystalline silicon semiconductor layer 17 is positioned between the gate electrodes 2Q and 2R and the substrate 1 (the base film 16). On the other hand, the pixel TFT 10P has the bottom gate structure in which the gate electrode 2P is positioned between the oxide semiconductor layer 4P and the substrate 1 (the base film 16). By employing these structures, it is possible that the number of manufacturing processes or an increase in manufacturing cost is effectively suppressed when a plurality of types of thin film transistors (the circuit TFT 10Q, the inspection TFT 10R, and the pixel TFT 10P) are integrally formed on the same substrate 1.

TFT structures of the circuit TFT 10Q, the inspection TFT 10R, and the pixel TFT 10P are not limited to those described above. For example, the circuit TFT 10Q and the inspection TFT 10R, and the pixel TFT 10P may have the same TFT structure. Alternatively, the circuit TFT 10Q and the inspection TFT 10R may have the bottom gate structure, and the pixel TFT 10P may have the top gate structure. Furthermore, in the case of the bottom gate structure, a channel etch type may be available and an etch stop type may be available.

The gate insulating layer 3 that is the gate insulating film of the pixel TFT 10P may extend up to an area in which the circuit TFT 10Q and the inspection TFT 10R are formed, and may function as the interlayer insulating film that covers the gate electrodes 2Q and 2R of the circuit TFT 10Q and the inspection TFT 10R, and the crystalline silicon semiconductor layer 17. In a case where, in this manner, the interlayer insulating film of the circuit TFT 10Q and the inspection TFT 10R, and the gate insulating film of the pixel TFT 10P are formed with the same layer (the gate insulating layer 3), the gate insulating layer 3 may have the stacked structure. For example, the gate insulating layer 3 may have a stacked structure in which a layer (for example, a silicon nitride layer) with a hydrogen donation property of possibly supplying hydrogen and a layer (for example, a silicon oxide layer) with an oxygen donation property of possibly supplying oxygen are included, which is positioned on the layer with the hydrogen donation property of possibly supplying hydrogen.

The gate electrodes 2Q and 2R of the circuit TFT 10Q and the inspection TFT 10R, and the gate electrode 2P of the pixel TFT 10P may be formed within the same layer. Furthermore, the source electrode 5Q and the drain electrode 6Q of the circuit TFT 10Q, the source electrode 5R and the drain electrode 6R of the inspection TFT 10R, and the source electrode 5P and the drain electrode 6P of the pixel TFT 10P may be formed within the same layer. The expression "electrodes are formed within the same layer" means that electrodes are formed using the same film (the conductive film). Accordingly, the number of manufacturing processes and the increase in the manufacturing cost can be suppressed.

Even in the active-matrix substrate 200 according to the present embodiment, the source and gate metal connection portion within the non-display area 90 is not covered with the organic insulating layer 8, and thus an effect of improving the reliability is obtained. Embodiments 2A to 2E that are examples of these will be specifically described below.

Embodiment 2A

Figure 22:
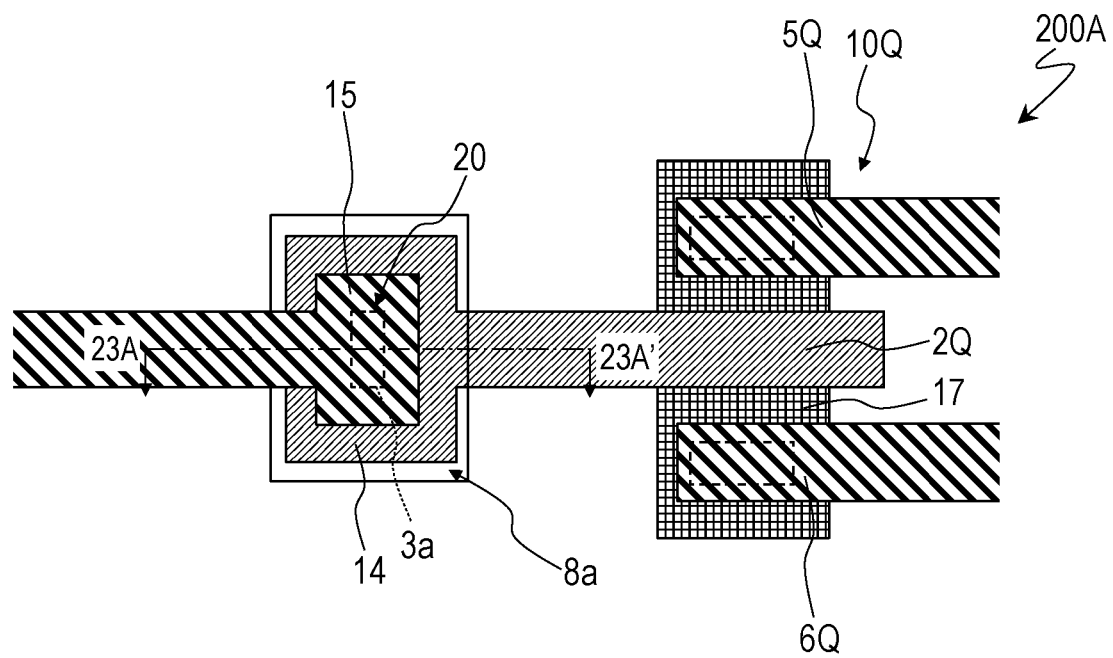
FIG. 22 is a plan-view diagram that schematically illustrates an active-matrix substrates 200A according to an embodiment of the present invention, and illustrates the vicinity of a certain circuit TFT 10Q, among the plurality of circuit TFTs 10Q that are included in the GDM circuit 40.
Figure 23:
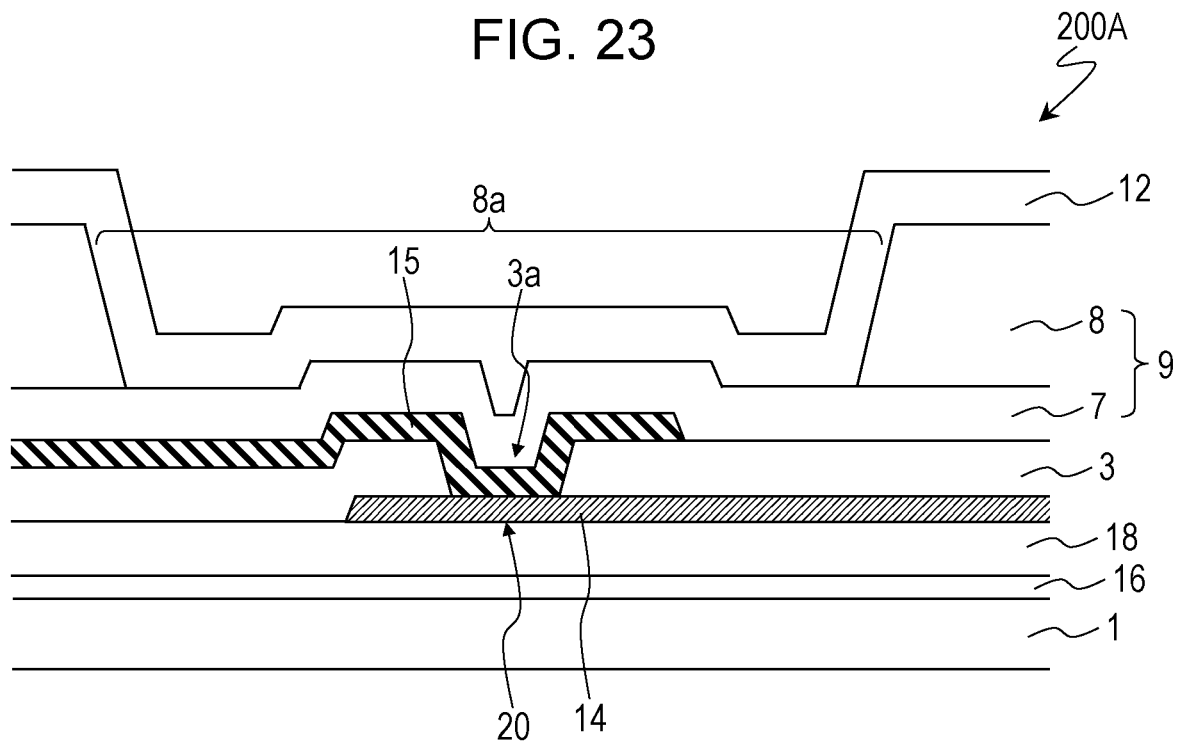
FIG. 23 is a cross-sectional diagram cut along line 23A-23A' in FIG. 22.

An active-matrix substrate 200A in the present embodiment is described with reference to FIGS. 22 and 23. In the present embodiment, the source and gate metal connection portion 20 that is not covered with the organic insulating layer 8 is positioned within the GDM circuit 40 that is formed on the substrate 1 in the non-display area 90. FIG. 22 is a plan-view diagram that schematically illustrates the vicinity of a certain circuit TFT 10Q among of a plurality of circuit TFTs 10Q that are included in the GDM circuit 40. FIG. 23 is a cross-sectional diagram cut along line 23A-23A' in FIG. 22.

The circuit TFT 10Q that is illustrated in each of FIGS. 22 and 23 has the gate electrode 2Q. The crystalline silicon semiconductor layer 17, the source electrode 5Q, and the drain electrode 6Q. More precisely, the circuit TFT 10Q is the crystalline silicon TFT.

In an example that is illustrated in each of FIGS. 22 and 23, the source and gate metal connection portion 20 is positioned in the vicinity of the circuit TFT 10Q. The first conductive layer 14 extends from the gate electrode 2Q of the circuit TFT 10Q and is electrically connected to the gate electrode 2Q. In the source and gate metal connection portion 20, the first conductive layer 14 and the second conductive layer 15 are connected.

Figure 24:
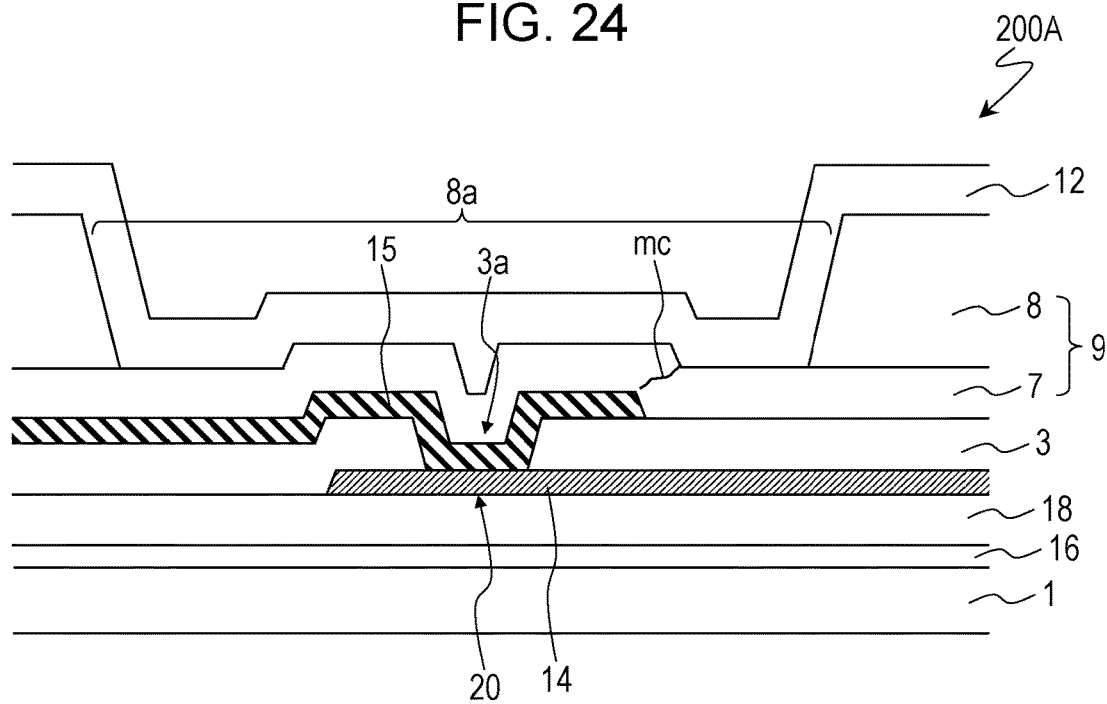
FIG. 24 is a cross-sectional diagram cut along the line 23A-23A' in FIG. 22, and illustrates a situation in which the microcrack mc occurs in the inorganic insulating layer 7 in the active-matrix substrate 200A.

The opening portion 8a is formed in a portion of the organic insulating layer 8, which corresponds to the source and gate metal connection portion 20. More precisely, the source and gate metal connection portion 20 is not covered with the organic insulating layer 8. For this reason, as illustrated in FIG. 24, although the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of an active-matrix substrate 200A is suppressed from being reduced.

When manufacturing the active-matrix substrate 200A, a process of forming the base film 16 on the substrate 1, a process of forming the crystalline silicon semiconductor layer (for example, the low-temperature polysilicon layer) 17 on the base film 16, and a process of forming the lower insulating layer 18 that covers the crystalline silicon semiconductor layer 17 are added to the manufacturing method that is described with reference to FIGS. 9 to 11.

As the base film 16, a silicon oxide (SiOx) film, a silicon nitride (SiNx) film, a silicon oxynitride (SiOxNy; x>y) film, a silicon nitride oxide (SiNxOy; x>y) film, and the like can be used. The base film 16 may have a stacked structure.

A amorphous silicon (a-Si) film is first formed on the base film 16, the a-Si film is subsequently crystallized, and then is patterned. Thus, formation of the crystalline silicon semiconductor layer 17 can be performed. The crystallization of the a-Si film can be performed using various well-known methods, and for example, can be performed with laser annealing.

As the lower insulating layer 18, a silicon oxide (SiOx) film, a silicon nitride (SiNx) film, a silicon oxynitride (SiOxNy; x>y) film, a silicon nitride oxide (SiNxOy; x>y) film, and the like can be used. The lower insulating layer 18 may have a stacked structure. Here, as the inorganic insulating layer 7, a SiOx film is formed.

Embodiment 2B

Figure 25:
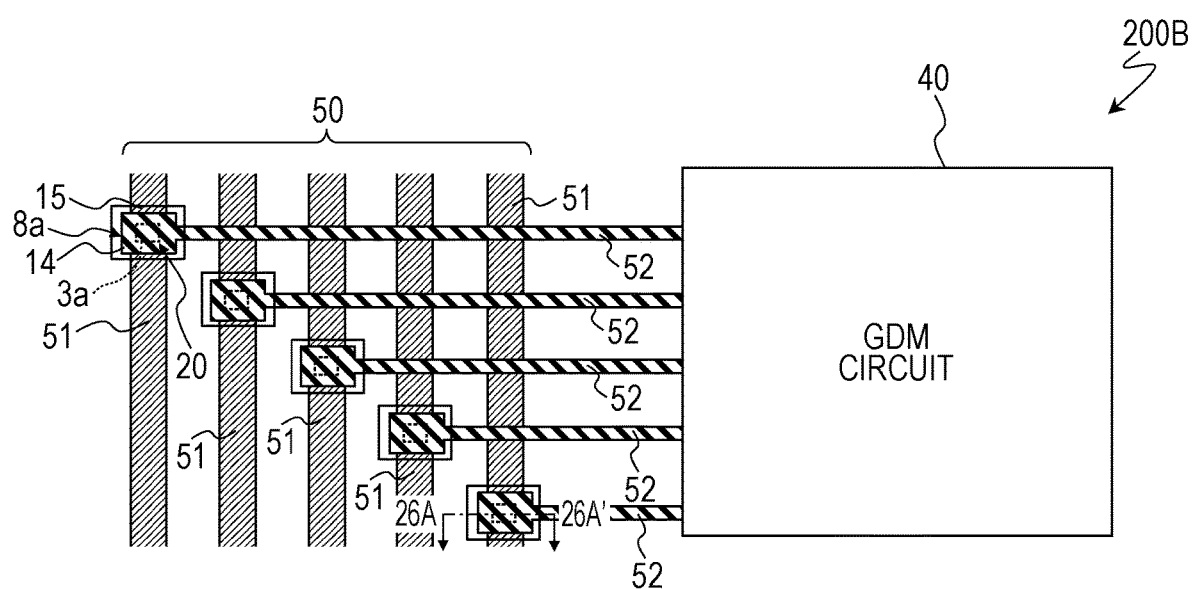
FIG. 25 is a plan-view diagram that schematically illustrates an active-matrix substrate 200B according to an embodiment of the present invention, and illustrates the vicinity of the GDM wiring-line area 50.
Figure 26:
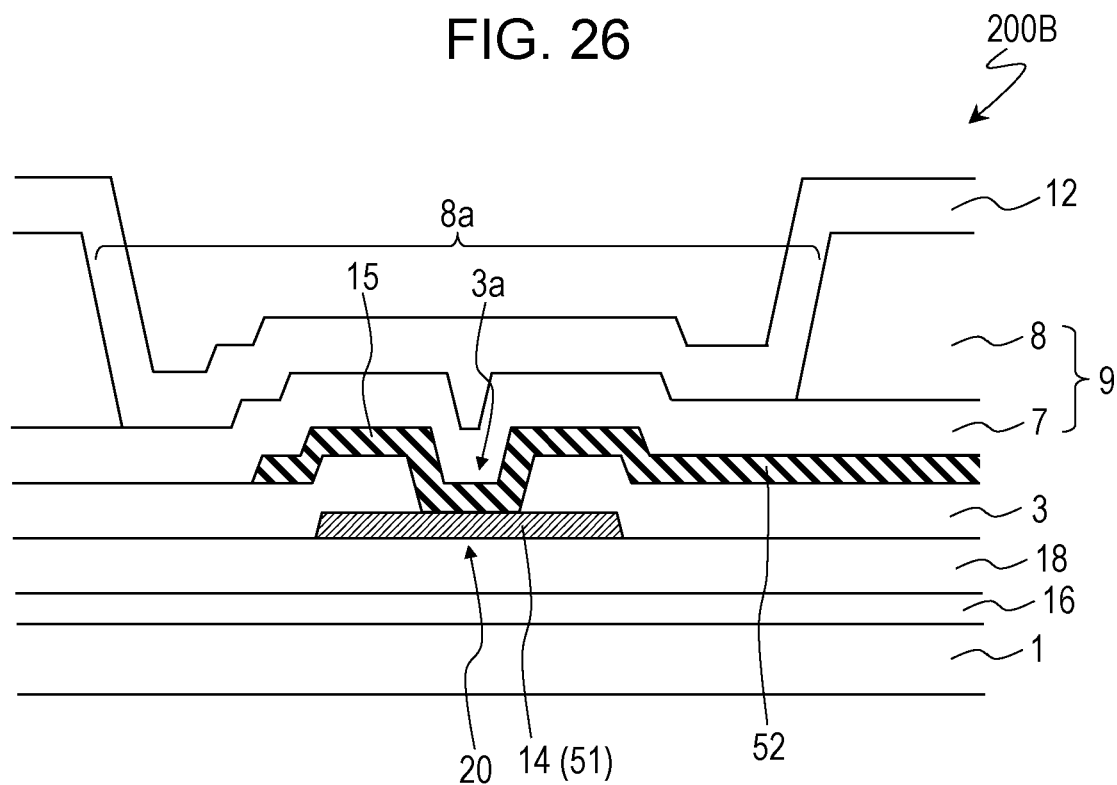
FIG. 26 is a cross-sectional diagram cut along line 26A-26A' in FIG. 25.

An active-matrix substrate 200B in the present embodiment is described with reference to FIGS. 25 and 26. In the present embodiment, the source and gate metal connection portion 20 that is not covered with the organic insulating layer 8 is positioned within the GDM wiring-line area 50. FIG. 25 is a plan-view diagram that schematically illustrates the vicinity of the GDM wiring-line area 50. FIG. 26 is a cross-sectional diagram cut along line 26A-26A' in FIG. 25.

As illustrated in FIGS. 25 and 26, a plurality of main wiring lines 51 that extend in a given direction are formed within GDM wiring-line areas 50. Furthermore, a plurality of branch wiring lines 52 are formed that extend in a direction which intersects (for example, orthogonally intersects) a direction in which a plurality of main wiring lines 51 extend. The plurality of branch wiring lines 52 connect the plurality of main wiring lines 51 and the GDM circuit 40.

The source and gate metal connection portion 20 is a portion that connects the main wiring line 51 and the branch wiring line 52 which corresponds to the main wiring line 51. Here, the plurality of main wiring lines 51 are formed from the same conductive film as the plurality of gate wiring lines GL, and the plurality of branch wiring lines 52 are formed from the same conductive film as the plurality of source wiring lines SL. One portion of the main wiring line 51 is the first conductive layer 14, and one portion of the branch wiring line 52 is the second conductive layer 15.

Figure 27:
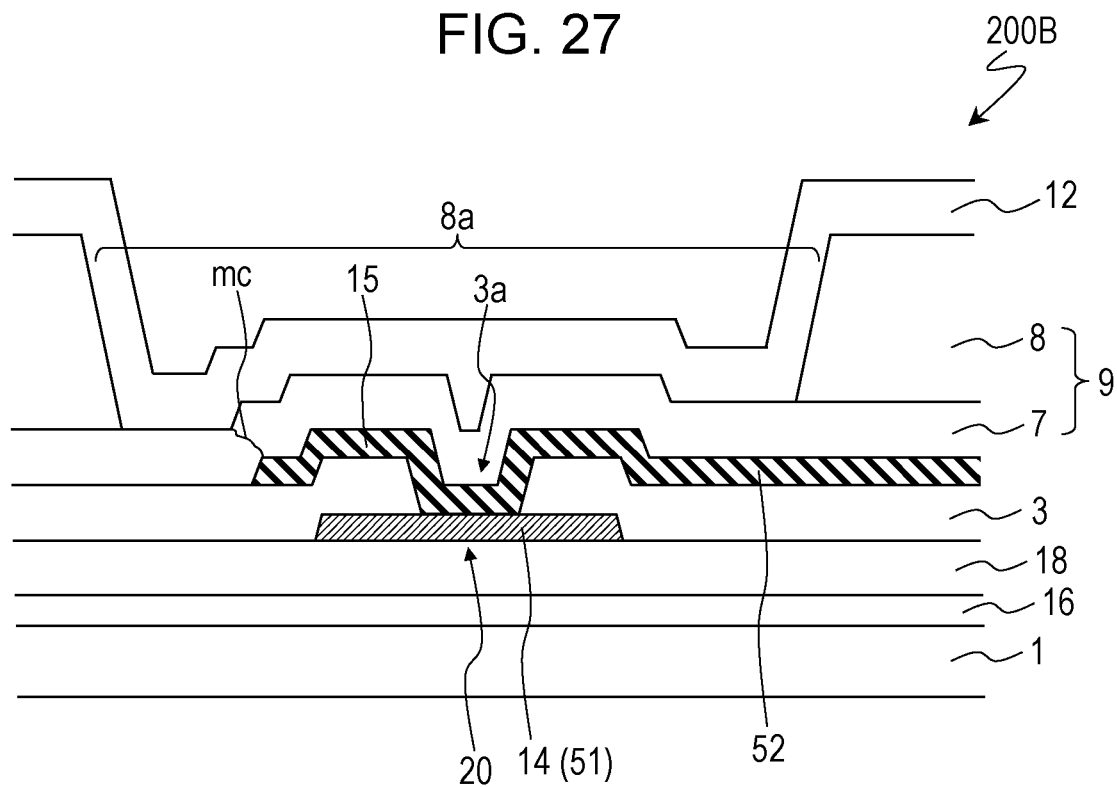
FIG. 27 is a cross-sectional diagram cut along the line 26A-26A' in FIG. 25, and illustrates a situation in which the microcrack mc occurs in the inorganic insulating layer 7 in the active-matrix substrate 200B.

The opening portion 8a is formed in a portion of the organic insulating layer 8, which corresponds to the source and gate metal connection portion 20. More precisely, the source and gate metal connection portion 20 is not covered with the organic insulating layer 8. For this reason, as illustrated in FIG. 27, although the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of the active-matrix substrate 200B is suppressed from being reduced.

It is noted that in FIGS. 25 and 26, a configuration is illustrated in which the main wiring line 51 is formed from the same conductive film as the gate wiring line GL and the branch wiring line 52 is formed from the same conductive film as the source wiring line SL, but that conversely, the main wiring line 51 may be formed from the same conductive film as the source wiring line SL and the branch wiring line 52 may be formed from the same conductive film as the gate wiring line GL.

Embodiment 2C

Figure 28:
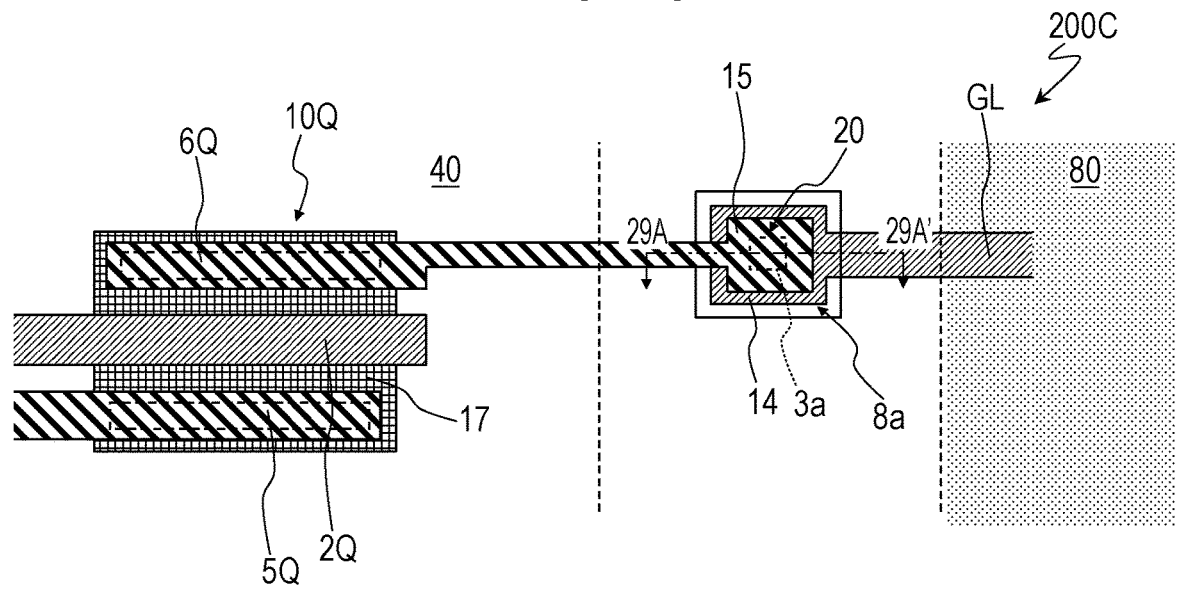
FIG. 28 is a plan-view diagram that schematically illustrates an active-matrix substrate 200C according to an embodiment of the present invention, and illustrates the vicinity of the circuit TFT 10Q that finally performs outputting of a scanning signal to the gate wiring line GL, among the plurality of circuit TFTs 10Q of the GDM circuit 40.
Figure 29:
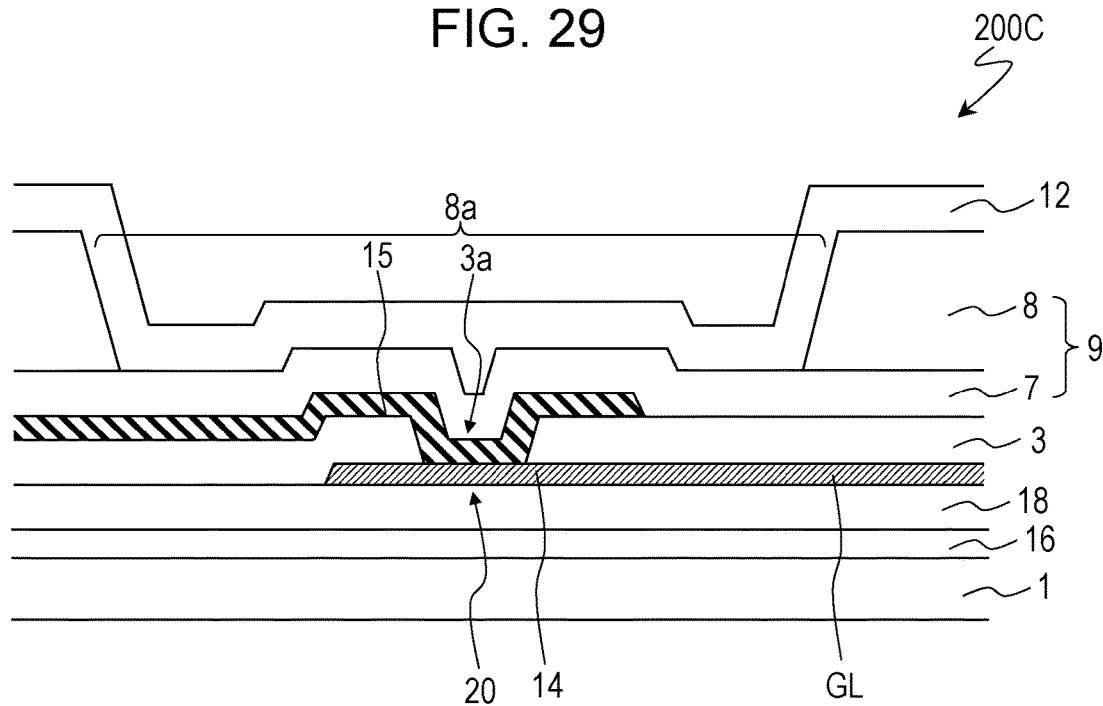
FIG. 29 is a cross-sectional diagram cut along line 29A-29A' in FIG. 28.

An active-matrix substrate 200C in the present embodiment is described with reference to FIGS. 28 and 29. In the present embodiment, the source and gate metal connection portion 20 that is not covered with the organic insulating layer 8 is positioned between the GDM circuit 40 and the display area 80. FIG. 28 is a plan-view diagram that schematically illustrates the vicinity of the circuit TFT 10Q which finally performs outputting of the scanning signal to the gate wiring line GL, among a plurality of circuit TFTs 10Q of the GDM circuit 40. FIG. 29 is a cross-sectional diagram cut along line 29A-29A' in FIG. 28.

The circuit TFT 10Q that is illustrated in each of FIGS. 28 and 29 has the gate electrode 2Q, the crystalline silicon semiconductor layer 17, the source electrode 5Q, and the drain electrode 6Q. More precisely, the circuit TFT 10Q is the crystalline silicon TFT.

In an example that is illustrated in each of FIGS. 28 and 29, the source and gate metal connection portion 20 is a portion that connects the GDM circuit 40 and a certain gate wiring line GL among the plurality of gate wiring lines GL, between the GDM circuit 40 and the display area 80.

The first conductive layer 14 that constitutes the source and gate metal connection portion 20 is one end portion of the gate wiring line GL. Furthermore, the second conductive layer 15 extends from the drain electrode 6Q of the circuit TFT 10Q and is electrically connected to the drain electrode 6Q. The second conductive layer 15 is connected to the first conductive layer 14 in the source and gate metal connection portion 20, and thus, the outputting of the scanning signal from the GDM circuit 40 to the gate wiring line GL is possible.

Figure 30:
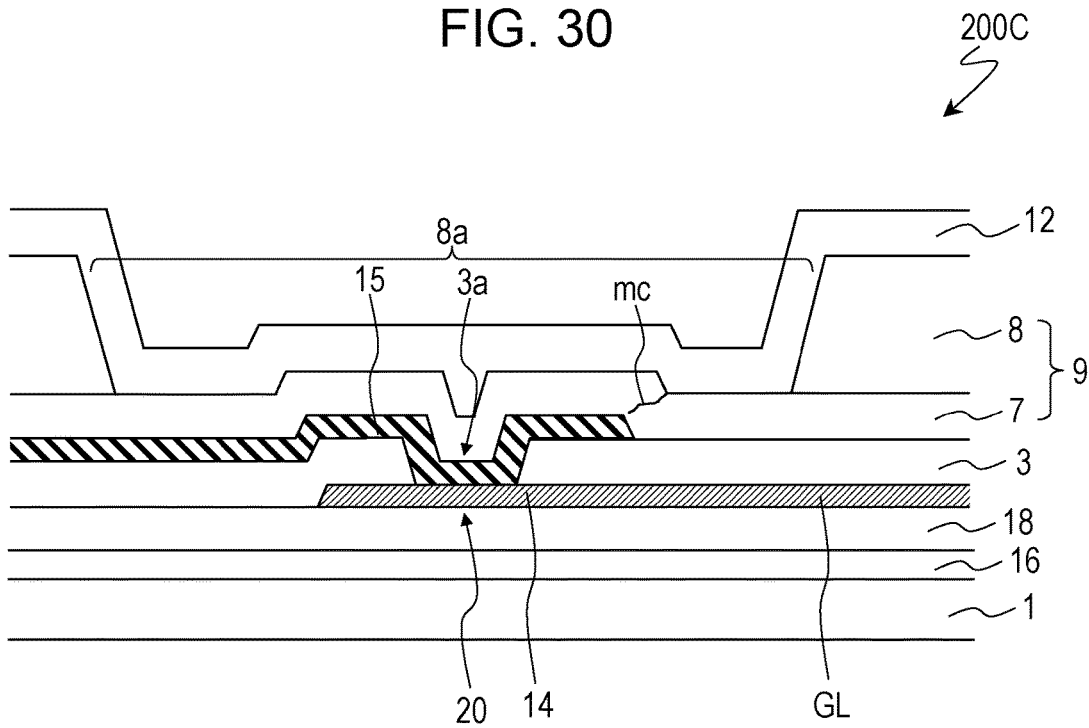
FIG. 30 is a cross-sectional diagram cut along the line 29A-29A' in FIG. 28, and illustrates a situation in which the microcrack mc occurs in the inorganic insulating layer 7 in the active-matrix substrate 200C.

The opening portion 8a is formed in a portion of the organic insulating layer 8, which corresponds to the source and gate metal connection portion 20. More precisely, the source and gate metal connection portion 20 is not covered with the organic insulating layer 8. For this reason, as illustrated in FIG. 30, although the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of the active-matrix substrate 200C is suppressed from being reduced.

Embodiment 2D

Figure 31:
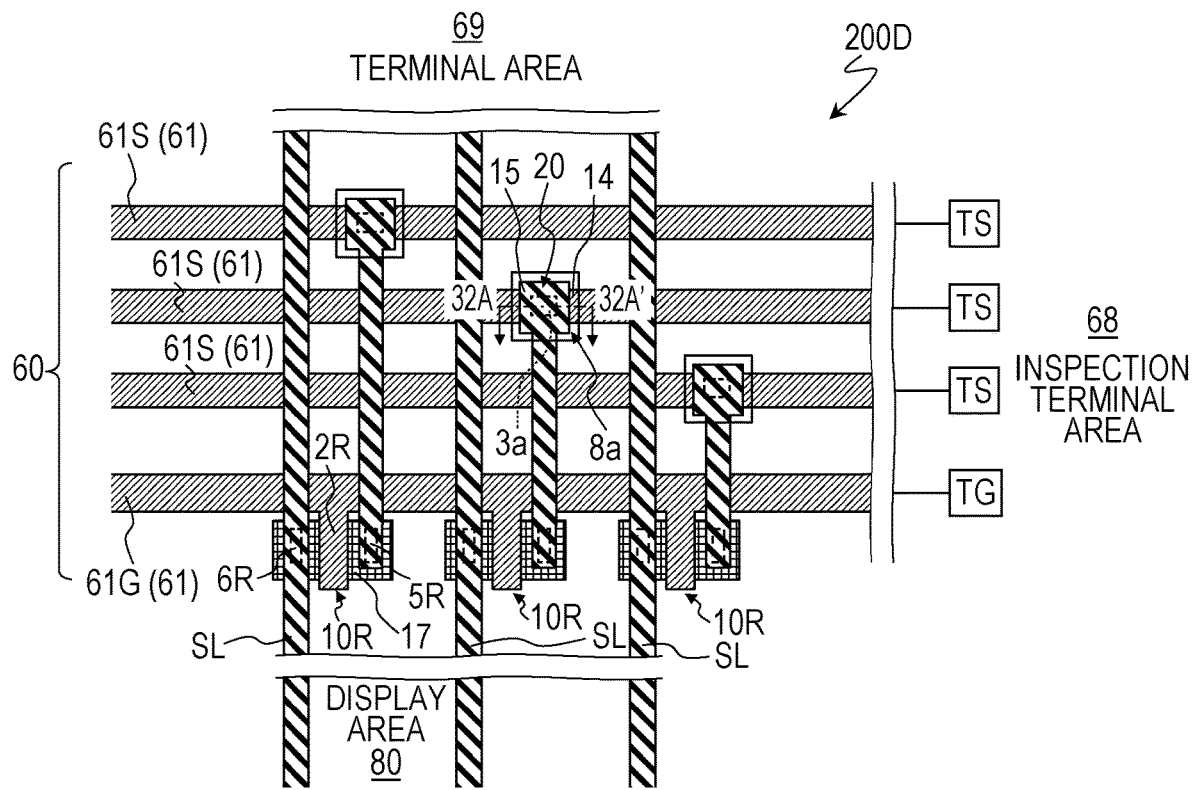
FIG. 31 is a plan-view diagram that schematically illustrates an active-matrix substrate 200D according to an embodiment of the present invention, and illustrates the vicinity of the inspection circuit 60.
Figure 32:
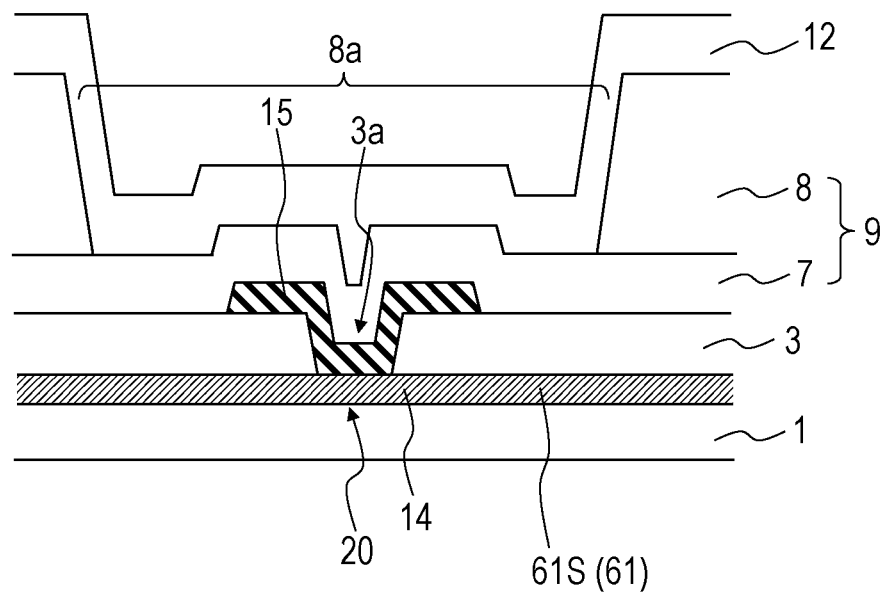
FIG. 32 is a cross-sectional diagram cut along line 32A-32A' in FIG. 31.

An active-matrix substrate 200D in the present embodiment is described with reference to FIGS. 31 and 32. In the present embodiment, the source and gate metal connection portion 20 that is not covered with the organic insulating layer 8 is positioned within the inspection circuit 60 that is formed on the substrate 1 in the non-display area 90. FIG. 31 is a plan-view diagram that schematically illustrates the vicinity of the inspection circuit 60. FIG. 32 is a cross-sectional diagram cut along line 32A-32A' in FIG. 31.

The inspection circuit 60, as illustrated in FIGS. 31 and 32, includes a plurality of inspection TFTs 10R and a plurality of inspection wiring lines 61 that supply signals to the plurality of inspection TFTs 10R, respectively.

A plurality of inspection TFTs 10R each have the gate electrode 2R, the crystalline silicon semiconductor layer 17, the source electrode 5R, and the drain electrode 6R. More precisely, the inspection TFT 10R is the crystalline silicon TFT.

A plurality of inspection wiring lines 61 each include an inspection gate wiring line 61G and an inspection source wiring line 61S. The inspection gate wiring line 61G is connected to an inspection gate terminal TG in the inspection terminal area 68. The inspection source wiring line 61S is connected to an inspection source terminal TS in the inspection terminal area 68. The plurality of inspection wiring lines 61 that include the inspection gate wiring line 61G and the inspection source wiring line 61S are formed from the same conductive film as the plurality of gate wiring lines GL.

The gate electrode 2R of the inspection TFT 10R is electrically connected to the inspection gate wiring line 61G. The source electrode 5R of the inspection TFT 10R is electrically connected to the inspection source wiring line 61S. The drain electrode 6R of the inspection TFT 10R is electrically connected to any one of the plurality of source wiring lines SL.

In the inspection circuit 60, at the time of lighting inspection, with a signal that is supplied from the inspection gate terminal TG to the gate electrode 2R of the inspection TFT 10R through the inspection gate wiring line 61G, all inspection TFTs 10R are turned on. As a result, a signal can be supplied from the inspection source terminal TS to each source wiring line SL through the inspection source wiring line 61S and the inspection TFT 10R in an on state, and lighting inspection can be performed. After the lighting inspection, when a normal operation is performed, a gate voltage of the inspection TFT 10R is controlled in such a manner that the inspection TFT 10R is in an off state.

In an example that is illustrated in each of FIGS. 31 and 32, the source and gate metal connection portion 20 is a portion that connects the inspection TFT 10R and the inspection wiring line 61 (here, the inspection source wiring line 61S) that corresponds to the inspection TFT 10R. One portion of the inspection source wiring line 61S is the first conductive layer 14, and a portion that extends from the source electrode 5R of the inspection TFT 10R is the second conductive layer 15.

Figure 33:
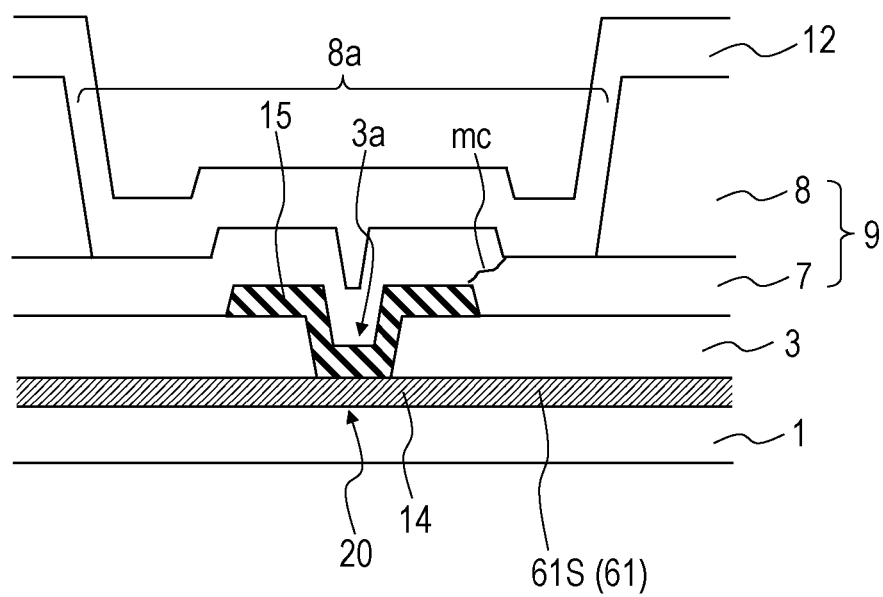
FIG. 33 is a cross-sectional diagram cut along the line 32A-32A' in FIG. 31, and illustrates a situation in which the microcrack mc occurs in the inorganic insulating layer 7 in the active-matrix substrates 200D.

The opening portion 8a is formed in a portion of the organic insulating layer 8, which corresponds to the source and gate metal connection portion 20. More precisely, the source and gate metal connection portion 20 is not covered with the organic insulating layer 8. For this reason, as illustrated in FIG. 33, although the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of the active-matrix substrate 200D is suppressed from being reduced.

It is noted that an example in which one inspection TFT 10R is positioned for one source wiring line SL here, but that one inspection TFT 10R may be provided for two or more source wiring lines SL.

Moreover, instead of the semiconductor chip that constitutes the source driver, the semiconductor chip that constitutes the gate driver may be packaged on the active-matrix substrate. A configuration of the inspection circuit in such a case is the same as a configuration that is illustrated in FIG. 31 and other figures. However, the drain electrode 6R of the inspection TFT 10R is connected to a corresponding gate wiring line GL. A signal that is supplied from the inspection source wiring line 61S is input into each gate wiring line GL through the inspection TFT 10R.

Embodiment 2E

A source driver (a source wiring-line drive circuit) may be formed monolithically formed on the active-matrix substrate 200 (the substrate 1). This source driver is hereinafter referred to as a source driver monolithic (SDM) circuit. The source and gate metal connection portion 20 that is positioned with the source driver monolithic circuit is not covered with the organic insulating layer 8, and thus water can be prevented from penetrating from the microcrack mc that occurs in the inorganic insulating layer 7.

Furthermore, in some cases, a Source Shared Driving (SSD) circuit is provided on the active-matrix substrate 200. The SSD circuit distributes video data from one video signal line from each terminal of the source driver, to a plurality of source wiring lines SL. The source and gate metal connection portion 20 is positioned within the SSD circuit is not covered with the organic insulating layer 8, and thus the same effect can be obtained.

Figure 44:
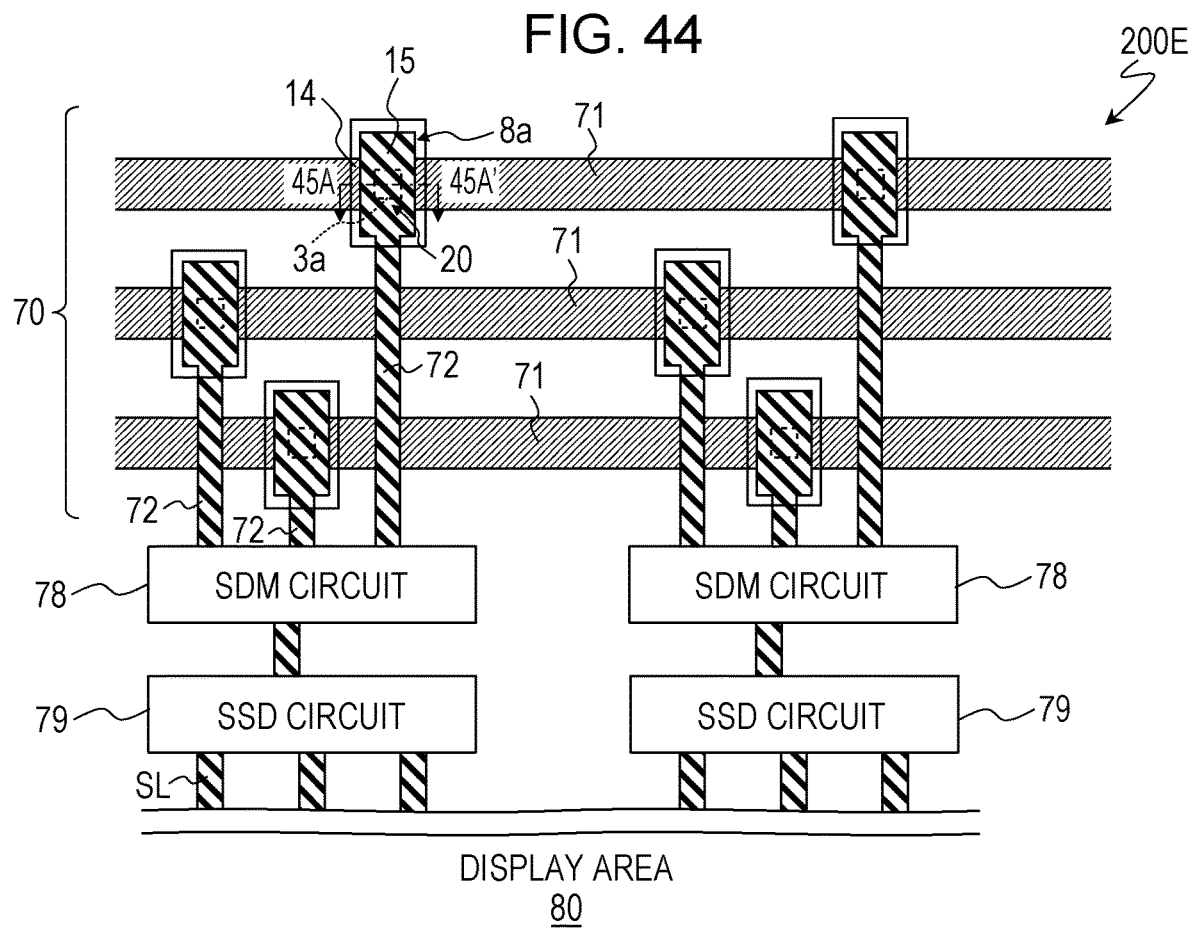
FIG. 44 is a plan-view diagram that schematically illustrates an active-matrix substrate 200E according to an embodiment of the present invention, and illustrates the vicinity of an SDM wiring-line area 70.
Figure 45:
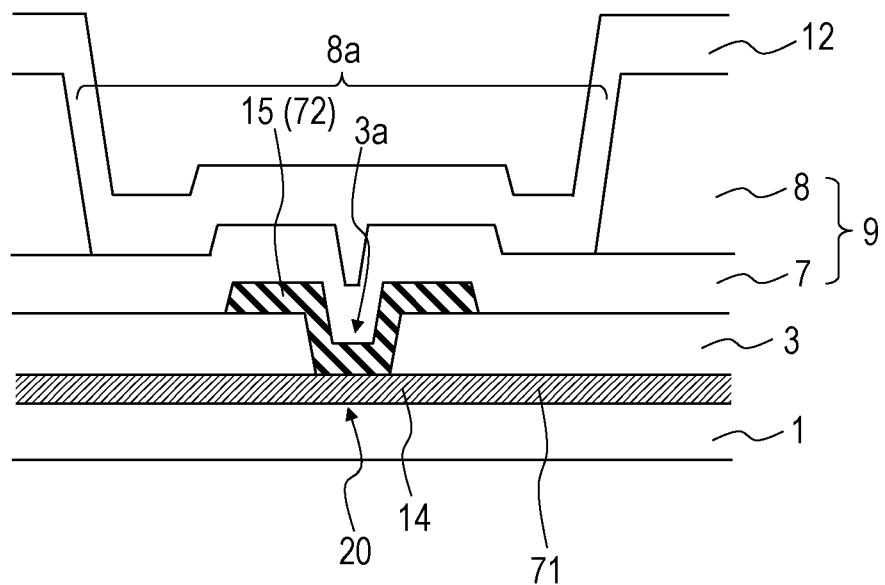
FIG. 45 is a cross-sectional diagram cut along the line 45A-45A' in FIG. 44.

Another example of the active-matrix substrate in the present embodiment is described with reference to FIGS. 44 and 45. In an active-matrix substrate 200E that is illustrated in each of FIGS. 44 and 45, the source and gate metal connection portion 20 that is not covered with the organic insulating layer 8 is positioned within an SDM wiring-line area 70 within the non-display area 90. The SDM wiring-line area 70 is an area in which a plurality of wiring lines for supplying a signal to an SDM circuit 78 are formed. A signal that is output from the SDM circuit 78 is distributed by the SSD circuit 79 to a plurality of source wiring lines SL. FIG. 44 is a diagram that schematically illustrates the vicinity of the SDM wiring-line area 70. FIG. 45 is a cross-sectional diagram cut along line 45A-45A' in FIG. 44.

As illustrated in each of FIGS. 44 and 45, a plurality of main wiring lines 71 that extend in a given direction is formed within the SDM wiring-line area 70. Furthermore, a plurality of branch wiring lines 72 are formed that extend in a direction which intersects (for example, orthogonally intersects) a direction in which a plurality of main wiring lines 71 extend. Each of the plurality of branch wiring lines 72 connects each of the plurality of main wiring lines 71 and the SDM circuit 78.

The source and gate metal connection portion 20 is a portion that connects the main wiring line 71 and the branch wiring line 72 which corresponds to the main wiring line 71. Here, the plurality of main wiring lines 71 are formed from the same conductive film as the plurality of gate wiring lines GL, and the plurality of branch wiring lines 72 are formed from the same conductive film as the plurality of source wiring lines SL. One portion of the main wiring line 71 is the first conductive layer 14, and one portion of the branch wiring line 72 is the second conductive layer 15.

Figure 46:
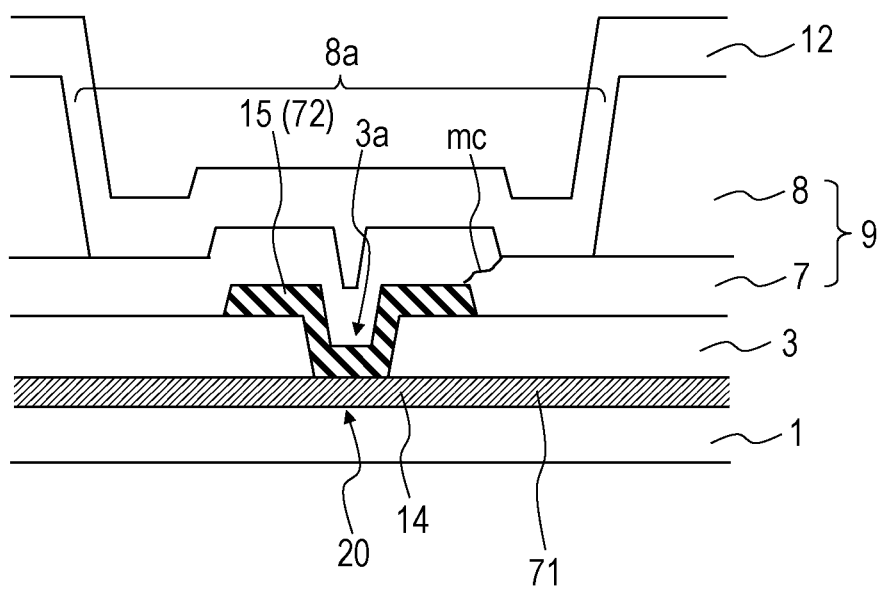
FIG. 46 is a cross-sectional diagram cut along the line 45A-45A' in FIG. 44, and illustrates a situation in which the microcrack mc occurs in the inorganic insulating layer 7 on the active-matrix substrate 200E.

The opening portion 8a is formed in a portion of the organic insulating layer 8, which corresponds to the source and gate metal connection portion 20. More precisely, the source and gate metal connection portion 20 is not covered with the organic insulating layer 8. For this reason, as illustrated in FIG. 46, although the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of the active-matrix substrate 200E is suppressed from being reduced.

It is noted that in FIGS. 44 and 45, a configuration is illustrated in which the main wiring line 71 is formed from the same conductive film as the gate wiring line GL and the branch wiring line 72 is formed from the same conductive film as the source wiring line SL, but that conversely, the main wiring line 71 may be formed from the same conductive film as the source wiring line SL and the branch wiring line 72 may be formed from the same conductive film as the gate wiring line GL.

[Positioning of Organic Insulating Layer within Non-Display Area]

As described above, in the active-matrix substrates 100 and 200 (and 100A to 100D and 200A to 200E) according to Embodiments 1 and 2, the source and gate metal connection portion 20 in the non-display area 90 is not covered with the organic insulating layer 8. However, the organic insulating layer 8 is not absent over the entire non-display area 90. More precisely, the non-display area 90 includes both an area in which the organic insulating layer 8 is not formed and an area in which the organic insulating layer 8 is formed. An area in which the organic insulating layer 8 is preferably not formed and an area in which the organic insulating layer 8 is preferably formed will be specifically described below.

First, examples of the area on which the organic insulating layer 8 is preferably not formed include areas relating to the following (1), (2), and (3).

(1): Source and gate metal connection portion (2): Area in which the gate wiring-line layer and the source wiring-line layer intersect (3): Groove for stopping a movement of an alignment film material to a sealing portion The area relating to (1) is the source and gate metal connection portion 20 that is already described (that is illustrated in FIG. 4 and other figures). The organic insulating layer 8 is not formed on the source and gate metal connection portion 20, and thus a decrease in the reliability due to the microcrack mc that occurs in the inorganic insulating layer 7 can be suppressed.

The area relating to (2) is an area in which a conductive layer (a wiring line or an electrode), which is formed from the same conductive film as the gate wiring line GL, and a conductive layer (a wiring line or an electrode), which is formed from the same conductive film as the source wiring line GL, overlap through the insulating layer. In this area, an electric field occurs due to electric charge that is spread to each of the conductive layers. Because of this, when a metal ion occurs due to an influence of water, there is a concern that the metal will move by being influenced by the electric field, that is, so-called ionic migration will occur. This causes a short circuit. The organic insulating layer 8 that easily contains water is not formed on intersection portions of the gate wiring-line layer and the source wiring-line layer, and thus the ion migration can be suppressed from occurring.

Figure 34:
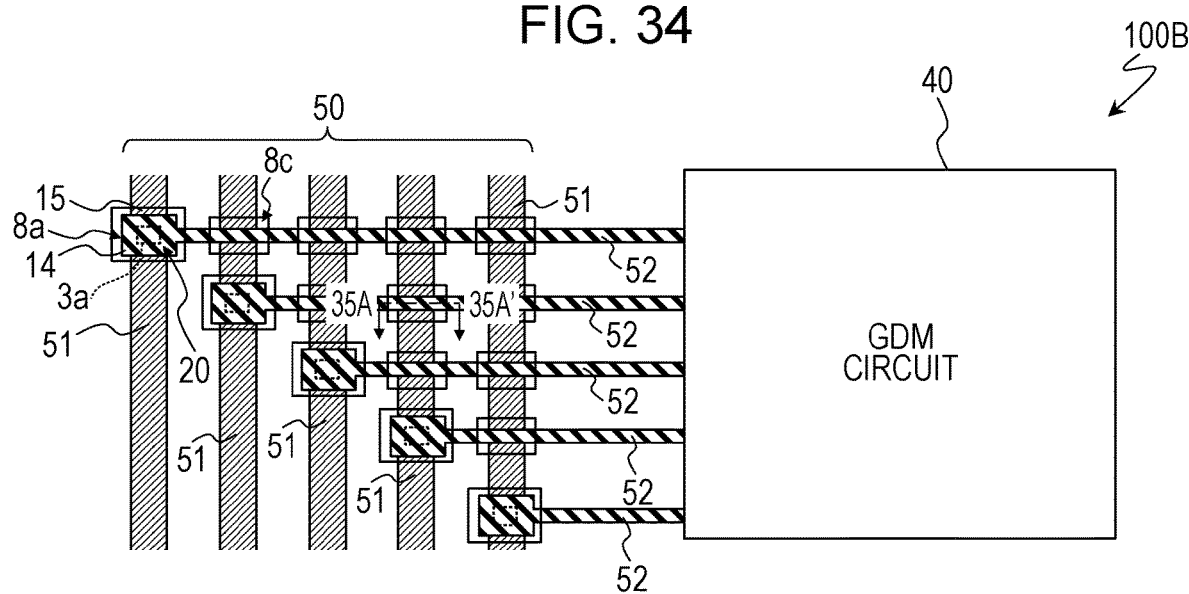
FIG. 34 is a plan-view diagram that schematically illustrates the active-matrix substrate 100B according to the embodiment of the present invention, and illustrates the vicinity of the GDM wiring-line area 50.
Figure 35:
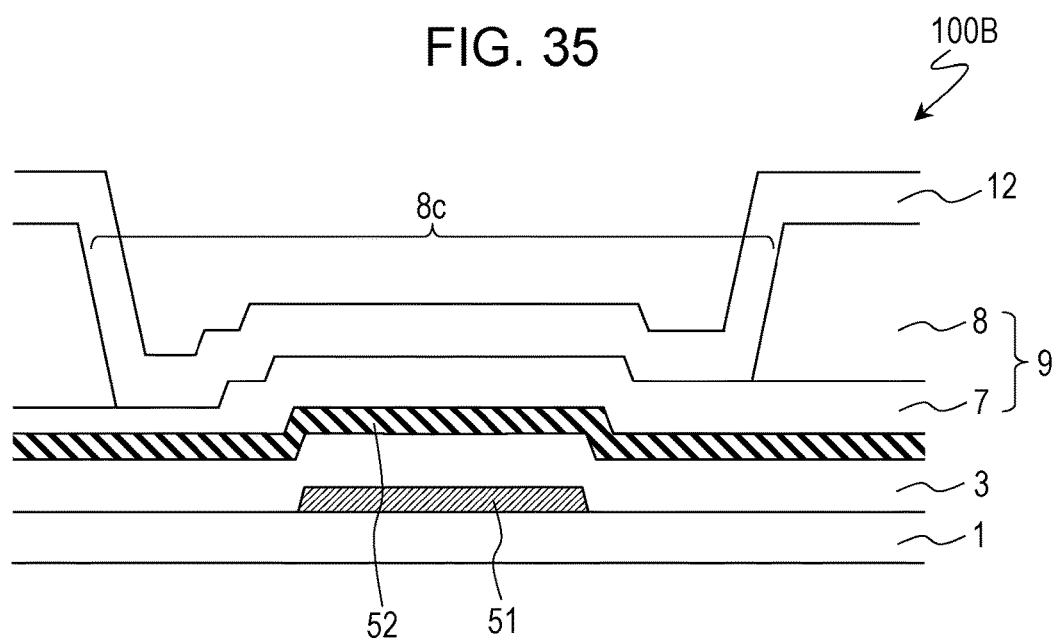
FIG. 35 is a cross-sectional diagram cut along line 35A-35A' in FIG. 34.

For example, in the active-matrix substrate 100B that is illustrated in each of FIGS. 12 and 13, an area in which the main wiring line 51 and branch wiring line 52 intersect (overlap) through the gate insulating layer 3. As illustrated in FIGS. 34 and 35, when the organic insulating layer 8 has an opening portion 8c that corresponds to this area, more precisely, when the organic insulating layer 8 is not formed on this area, the ion migration described above can be suppressed from occurring, and the short circuit that accompanies the ion migration can be suppressed from occurring.

The area relating to (3) is described with reference to FIGS. 36 to 38.

Figure 36:
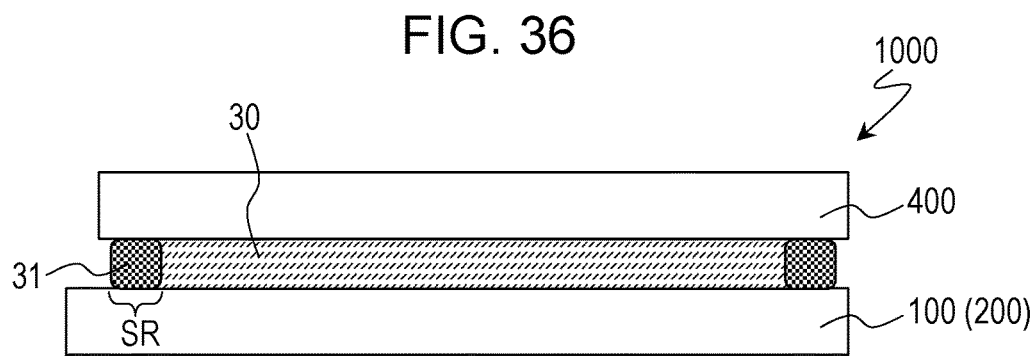
FIG. 36 is a cross-section diagram that schematically illustrates a liquid crystal display device 1000 according to an embodiment of the present invention.
Figure 37:
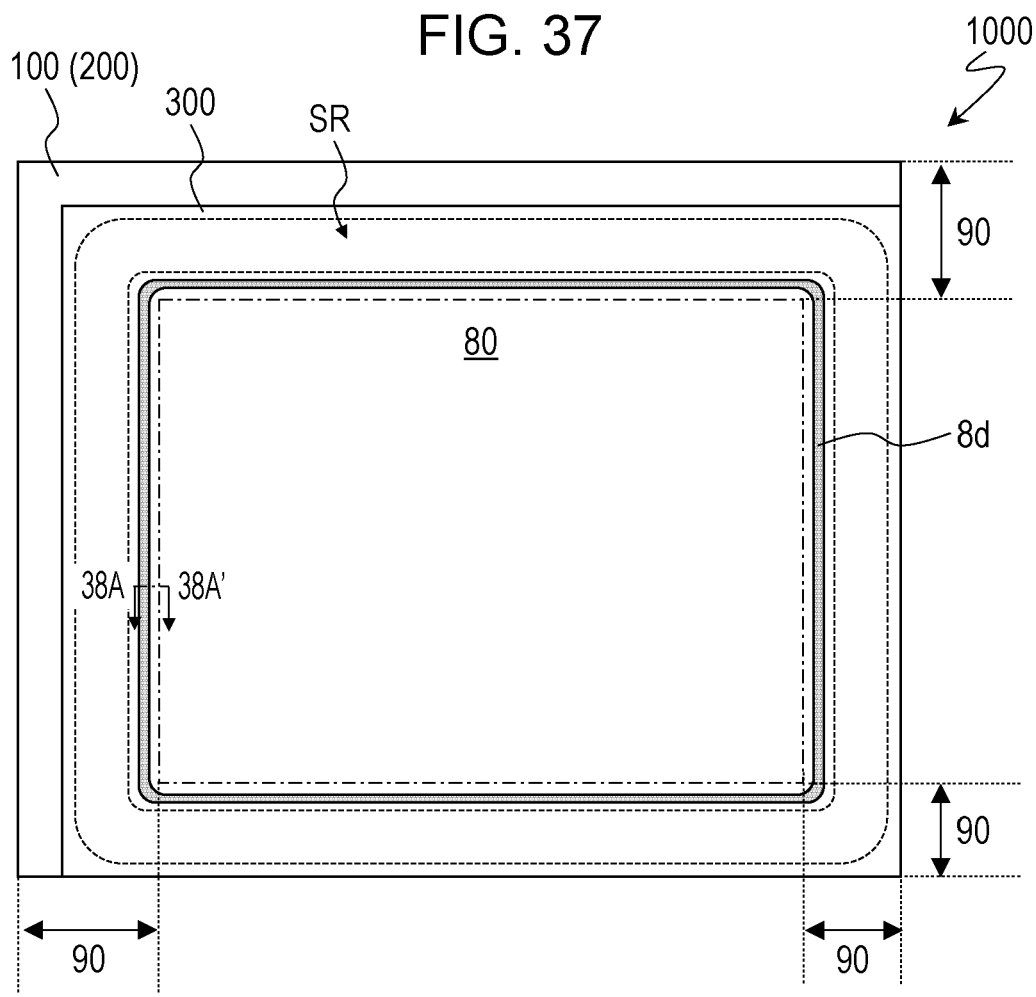
FIG. 37 is a plan-view diagram that schematically illustrates the liquid crystal display device 1000 according to the embodiment of the present invention.

FIGS. 36 and 37 are a cross-sectional diagram and a plan-view diagram, respectively, that schematically illustrate a liquid crystal display device 1000 which includes the active-matrix substrate 100 (or 200). The liquid crystal display device 1000, as illustrated in FIG. 36, includes the active-matrix substrate 100 (200), a counter substrate 400 that is positioned in such a manner as to face the active-matrix substrate 100 (200), a liquid crystal layer (a display medium layer) 30 that is provided between the active-matrix substrate 100 (200) and the counter substrate 400.

As illustrated in FIG. 37, in the liquid crystal display device 1000, the non-display area 90 includes a sealing area SR which surrounds the display area 80. In the sealing area SR, a sealing material 31 in the shape of a ring is formed, and with this sealing material 31, the active-matrix substrate 100 (200) and the counter substrate 400 are bonded together.

Between the sealing area SR and the display area 80 (between the sealing material 31 and the display area 80), a groove 8d that substantially surrounds the display area 80 is formed in the organic insulating layer 8 on the active-matrix substrate 100 (200).

Figure 38:
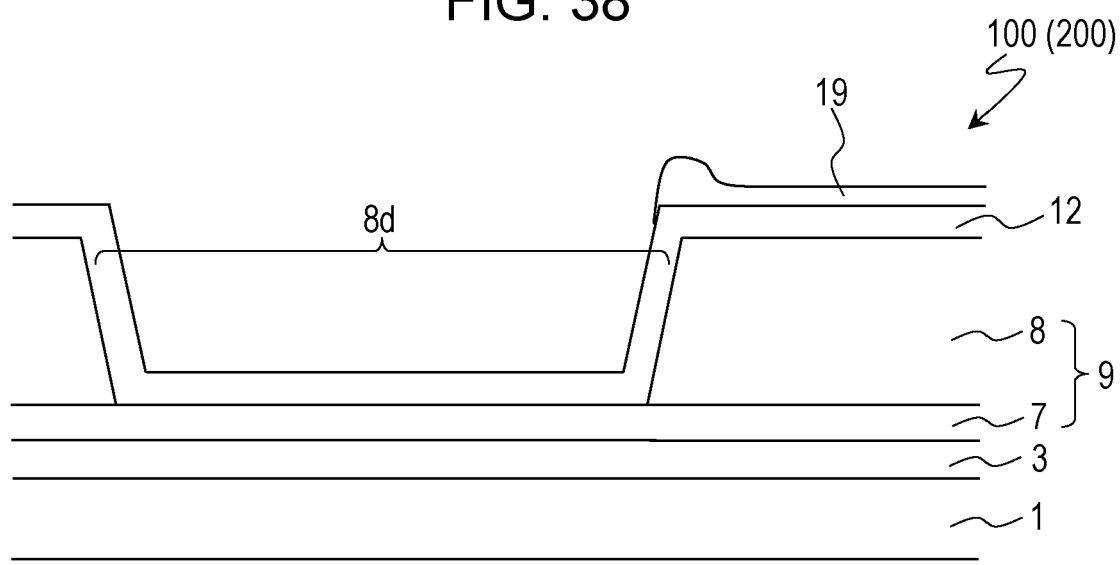
FIG. 38 is a cross-sectional diagram illustrating the vicinity of a groove 8d that is formed in an organic insulating layer 8 on the active-matrix substrate 100 (200), and illustrates a cross-sectional diagram cut along line 38A-38A' in FIG. 37.

FIG. 38 is a cross-sectional diagram of the active-matrix substrate 100 (200), cut along line 38A-38A' in FIG. 37, which illustrates the vicinity of the groove 8d. As illustrated in FIG. 38, the organic insulating layer 8 is a portion that is positioned within the non-display area 90, and includes a portion in which the groove 8d that substantially surrounds the display area 80 is formed. In FIG. 38, an alignment film 19 that is provided on the outermost surface of the active-matrix substrate 100 (200) is illustrated.

An alignment film material is spread (applied) on a substrate surface, and then burning or the like is performed. Thus, the alignment film 19 can be formed. In recent years, in most cases, an ink-jet method has been used for spreading the alignment film material. The ink-jet method has advantages in that direct drawing can be performed, in that low contamination results from a non-contact process, in that working hours can be reduced, and in other respects.

However, in a case where the ink-jet method is used, the alignment film material is spread in a state where the viscosity thereof is comparatively low. Because of this, there is a concern that the alignment film material will be spread beyond a desired area. Because the adhesion of the alignment film 19 to the sealing material 31 is low, when alignment film material reaches the sealing area SR, this causes a sealing defect.

As illustrated in FIGS. 37 and 38, when the groove 8d that substantially surrounds the display area 80 is formed in the organic insulating layer 8, the alignment film material can be prevented from flowing out into the sealing area SR. The groove 8d that is formed in the organic insulating layer 8, for example, is disclosed in International Publication Nos. 2011/086624, 2011/129065, and 2011/155133. For reference, the entire contents of International Publication Nos. 2011/086624, 2011/129065, and 2011/155133 are incorporated herein by reference.

As described above, it is preferable that the organic insulating layer 8 is not formed in the areas (1), (2), and (3). Subsequently, areas in the non-display area 90, in which the organic insulating layer 8 is preferably formed, are described.

The areas in the non-display area 90, in which the organic insulating layer 8 is preferably formed, for example, are areas relating to the following (4) and (5).

(4): Over the gate wiring-line layer and the source wiring-line layer (but, except for (1), (2), and (3) that are described above)

(5): Over the TFT (but, except for the TFT includes a back gate electrode)

Figure 39:
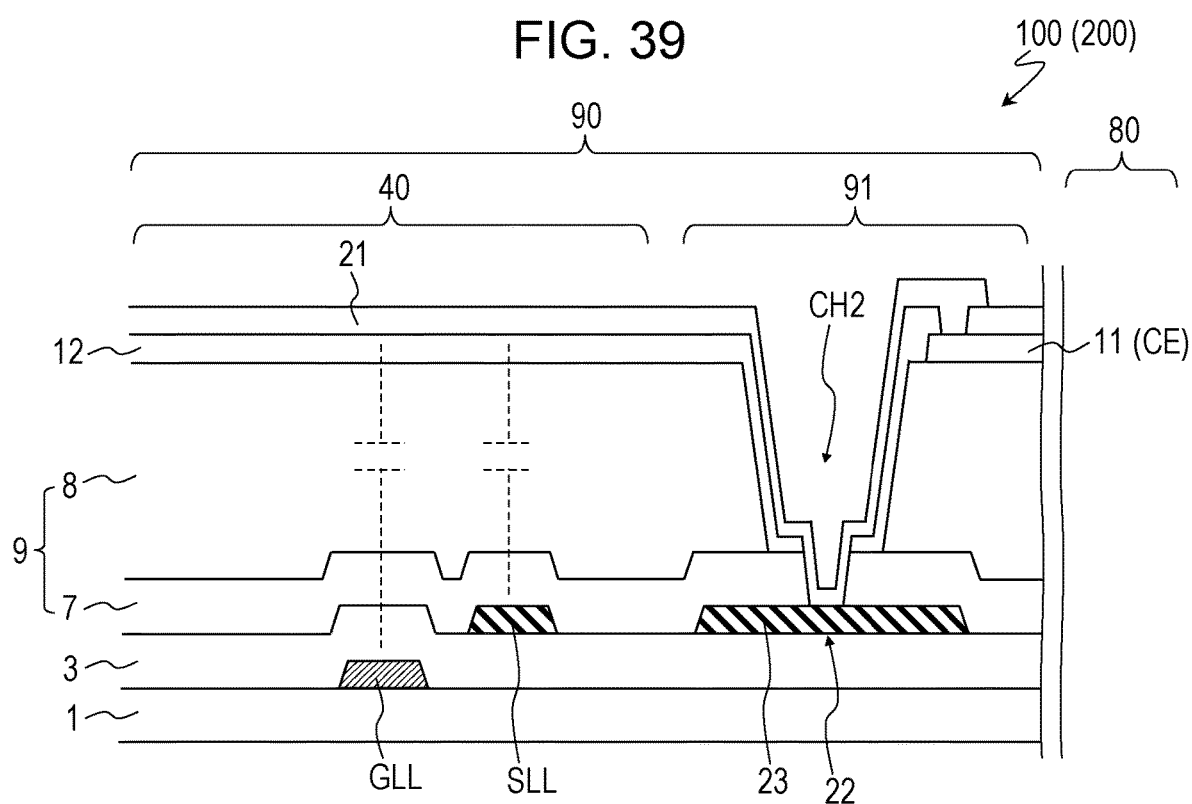
FIG. 39 is a cross-sectional diagram that schematically illustrates the active-matrix substrate 100 (200) on which a shield layer 21 is provided in the non-display area 90.

The reason why the organic insulating layer 8 is preferably formed in the areas relating to (4) and (5) is described with reference to FIG. 39. FIG. 39 is a diagram illustrating a configuration that a shield layer 21 is provided in the non-display area 90.

The shield layer 21, as illustrated in FIG. 39, is positioned in such a manner as to overlap at least one portion of the GDM circuit 40. Electric charge of the shield layer 21, for example, is set to be common electric charge. In an example that is illustrated in FIG. 39, the shield layer 21 is formed from the same transparent conductive film as the pixel electrode PE (the upper transparent electrode 13). The shield layer 21 is electrically connected to a common wiring line (a COM wiring line) 23 in a COM contact portion 22 that is provided in a COM wiring-line area 91. The COM wiring line 23, for example, is formed from the same conductive film as the source wiring line SL.

In an example that is illustrated in FIG. 39, the common electrode CE (the lower transparent electrode 11) is electrically connected to the COM wiring line 23 through the shield layer 21. Specifically, an opening portion 12a through which the common electrode CE is exposed is formed in the dielectric layer 12, and a COM contact hole CH2 through which a COM wiring line 23 is exposed is formed in the dielectric layer 12 and the interlayer insulating layer 9. The shield layer 21 is formed on the dielectric layer 12 and within the opening portion 12a and the COM contact hole CH2, comes into contact with the common electrode CE within the opening portion 12a, and comes into contact with the COM wiring line 23 within the COM contact hole CH2.

In FIG. 39, a gate wiring-line layer GLL and a source wiring-line layer SLL are illustrated. Each of the gate wiring-line layer GLL and the source wiring-line layer SLL is a wiring line or an electrode. By providing the shield layer 21, an electric field that results from signal electric charge that is spread to the gate wiring-line layer GLL and the source wiring-line layer SLL can be prevented from flowing out toward the liquid crystal layer side. However, when the shield layer 21 is provided, there is a concern that signal waveforms of the gate wiring-line layer GLL and the source wiring-line layer SLL will be degraded due to an electrostatic capacitance (a parasitic capacitance that is indicated by a dotted line) that is formed between the gate wiring-line layer GLL and the source wiring-line layer SLL, and the shield layer 21.

As illustrated in FIG. 39, when the organic insulating layer 8 is formed on the gate wiring-line layer GLL and the source wiring-line layer SLL (more precisely, when the gate wiring-line layer GLL and the source wiring-line layer SLL are covered, in the vertical direction, with the organic insulating layer 8), the parasitic capacitance that is formed between the gate wiring-line layer GLL and the source wiring-line layer SLL, and the shield layer 21 decreases. Because of this, the signal waveform due to the parasitic capacitance can be suppressed from being degraded.

For the same reason, it is preferable that the organic insulating layer 8 is also formed on the TFT that is positioned in the non-display area 90. It is noted that one portion of the TFT that is positioned in the non-display area 90 may have a back gate electrode. The back gate electrode is an additional gate electrode that is positioned in such a manner as to face a main gate electrode (an original gate electrode) with the semiconductor layer being interposed. By providing the back gate electrode, a threshold voltage can be controlled. When the comparatively thick organic insulating layer 8 is present between the semiconductor layer and the back gate electrode, there is a concern that the threshold voltage will not be suitably controlled with the back gate electrode. For this reason, the TFT that has the back gate electrode may employ a configuration in which the covering with the organic insulating layer 8 is not provided.

Embodiment 3

Figure 40:
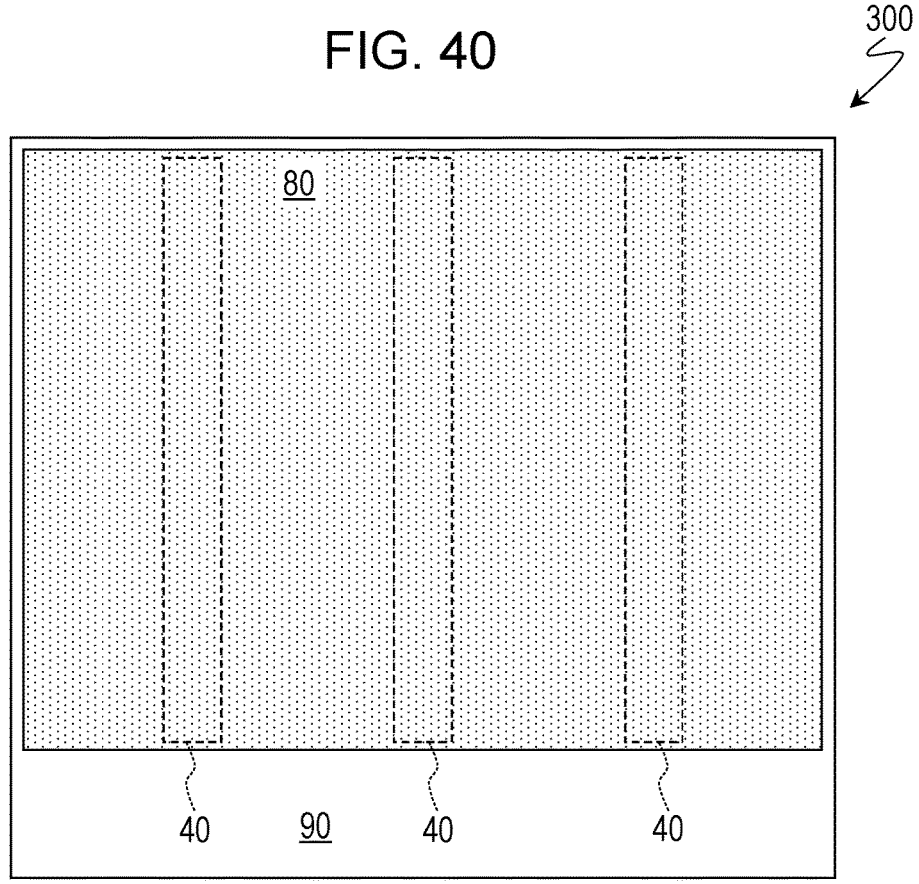
FIG. 40 is a plan-view diagram that schematically illustrates an active-matrix substrate 300 according to an embodiment of the present invention.

An active-matrix substrate 300 in the present embodiment is described with reference to FIG. 40. FIG. 40 is a diagram that schematically illustrates the active-matrix substrate 300.

In the active-matrix substrate 300, at least one portion of the GDM circuit 40 that includes a plurality of circuit TFTs is positioned within the display area 80. By employing this configuration, the non-display area 90 can be much more decreased (the frame can be much more narrowed). A configuration in which at least one portion of the GDM circuit 40 is positioned within the display area 80, for example, is disclosed in International Publication No. 2014/069529. For reference, the entire contents of International Publication No. 2014/069529 are incorporated herein by reference.

Figure 41:
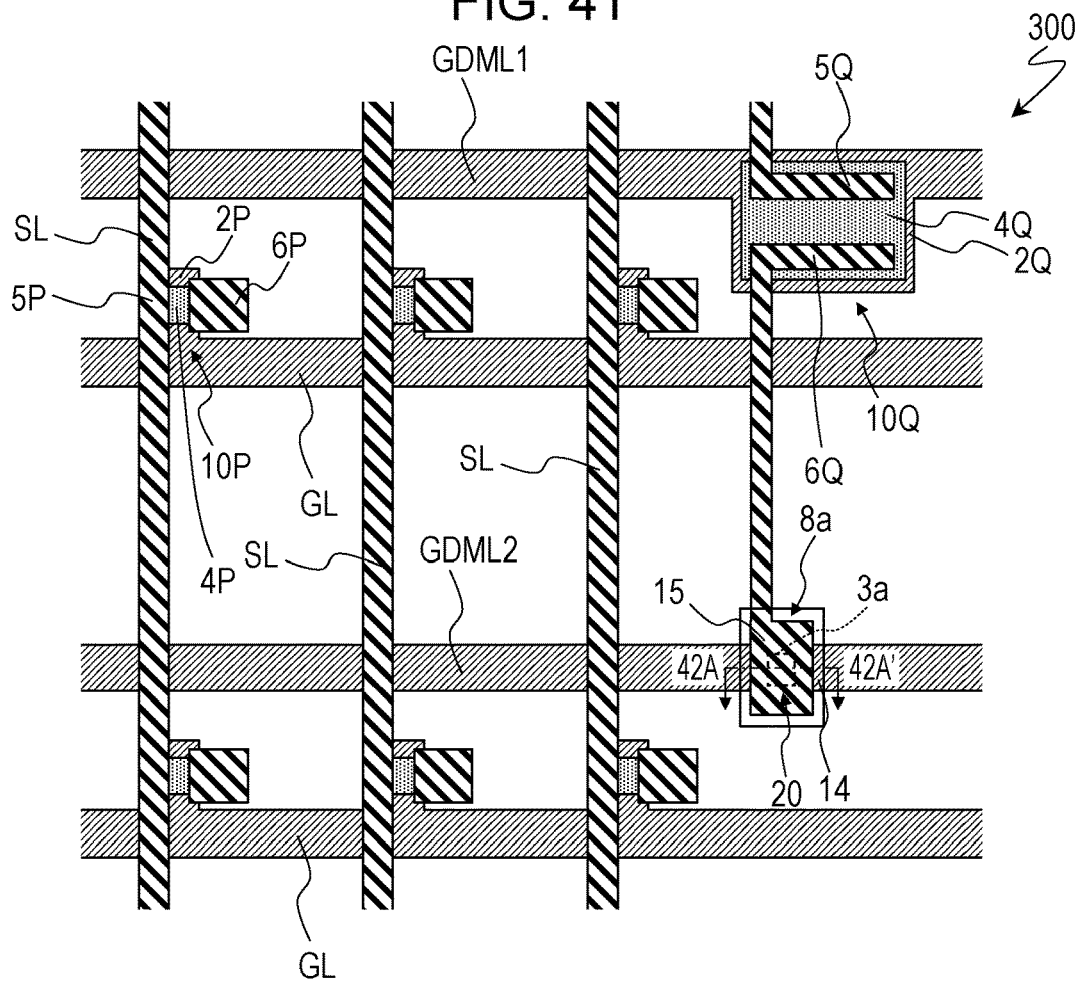
FIG. 41 is a plan-view diagram that schematically illustrates the active-matrix substrate 300, and is a top-view diagram that schematically illustrates the vicinity of the circuit TFT 10Q that is positioned within the display area 80, among the plurality of circuit TFTs 10Q that are included in the GDM circuit 40.
Figure 42:
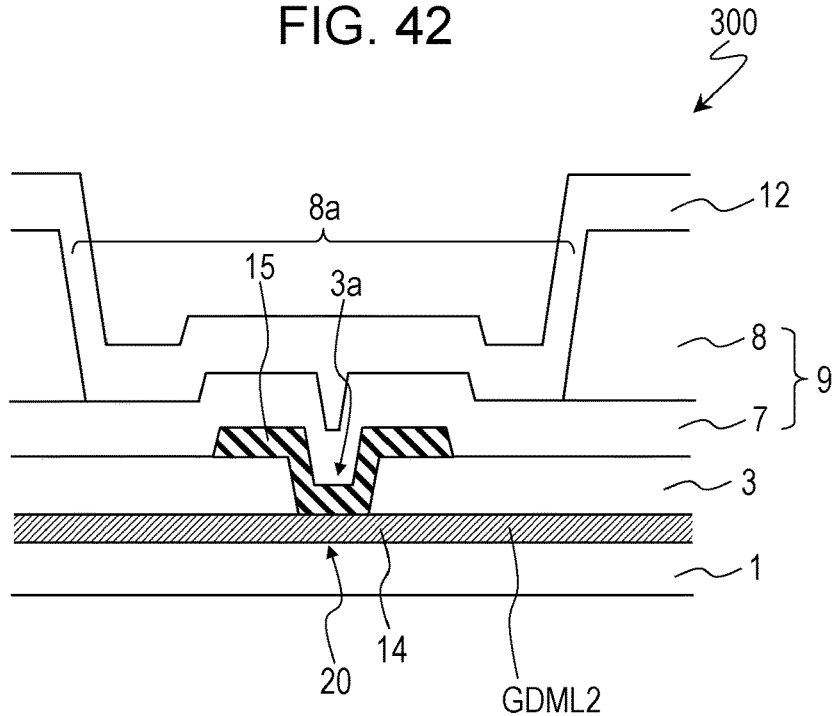
FIG. 42 is a cross-sectional diagram cut along line 42A-42A' in FIG. 41.

In the present embodiment, the source and gate metal connection portion 20 that is not covered with the organic insulating layer 8 is positioned within a portion of the GDM circuit 40, which is positioned in the display area 80. The description will be provided in more detail below with reference to FIGS. 41 and 42. FIG. 41 is a plan-view diagram that schematically illustrates the vicinity of the circuit TFT 10Q which is positioned within the display area 80, among a plurality of circuit TFTs 10Q that are included in the GDM circuit 40. FIG. 42 is a cross-sectional diagram cut along line 42A-42A' in FIG. 41.

The circuit TFT 10Q that is illustrated in FIG. 41 has the gate electrode 2Q, the oxide semiconductor layer 4Q, the source electrode 5Q, and the drain electrode 6Q. More precisely, the circuit TFT 10Q is the oxide semiconductor TFT. The oxide semiconductor layer 4Q of the circuit TFT 10Q may be formed from the same oxide semiconductor film as the oxide semiconductor layer 4P of the pixel TFT 10P.

In FIG. 41, among wiring lines for the GDM circuit 40, two types of wiring lines (hereinafter referred to as a "first GDM wiring line" and a "second GDM wiring line"), a GDM L1 and a GDM L2 are illustrated. The first GDM wiring line and the second GDM wiring line are formed from the same conductive film as the gate wiring line GL. The gate electrode 2Q of the circuit TFT 10Q is electrically connected to the GDM L1 that is the first GDM wiring line. Furthermore, the drain electrode 6Q of the circuit TFT 10Q is electrically connected to the GDM L2 that is the second GDM wiring line.

In an example that is illustrated in FIGS. 41 and 42, the source and gate metal connection portion 20 is a portion that electrically connects the drain electrode 6Q of the circuit TFT 10Q, and the GDM L2 that is the second GDM wiring line. The first conductive layer 14 is one portion of the GDM L2 that is the second GDM wiring line. The second conductive layer 15 is a portion that extends from the drain electrode 6Q of the circuit TFT 10Q.

Figure 43:
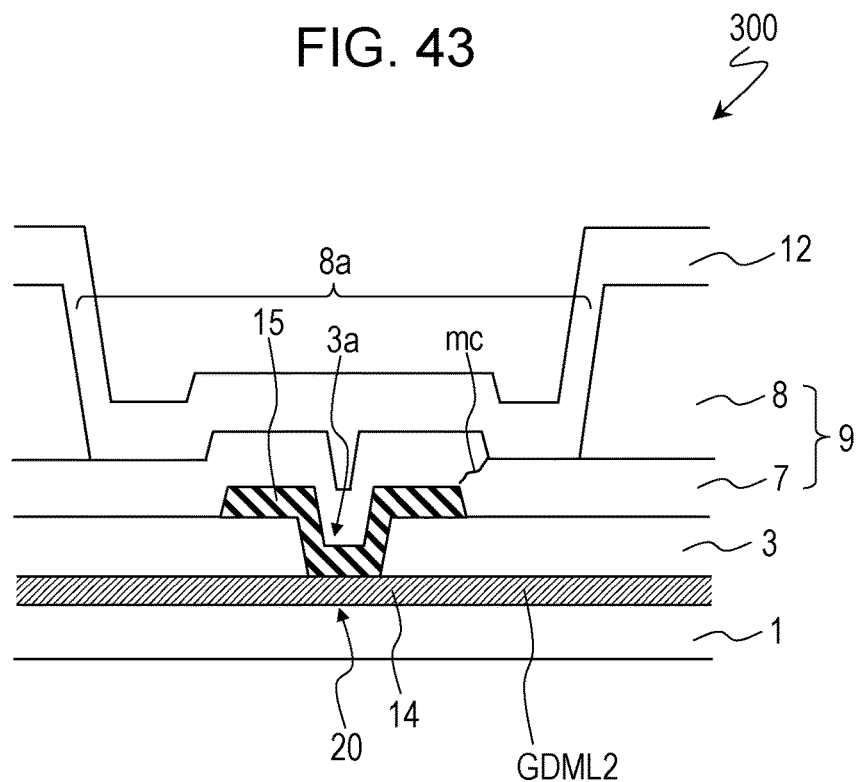
FIG. 43 is a cross-sectional diagram cut along the line 42A-42A' in FIG. 41, and illustrates a situation in which the microcrack mc occurs in the wireless inorganic insulating layer 7 on the active-matrix substrate 300.

The opening portion 8a is formed in a portion of the organic insulating layer 8, which corresponds to the source and gate metal connection portion 20. More precisely, the source and gate metal connection portion 20 is not covered with the organic insulating layer 8. For this reason, as illustrated in FIG. 43, although the microcrack mc occurs in the inorganic insulating layer 7, because the organic insulating layer 8 is not present on the inorganic insulating layer 7, the water is prevented from penetrating from the microcrack mc to the first conductive layer 14 or the second conductive layer 15. Therefore, the reliability of the active-matrix substrate 300 is suppressed from being reduced.

As described above, in the active-matrix substrate according to the embodiment of the present invention, the source and gate metal connection portion 20 is not covered with the organic insulating layer 8, and thus the reliability is improved.

It is noted that as an example, the active-matrix substrate of the liquid crystal display device which performs display in a horizontal electric field mode such as an FFS mode has been described so far, but that there can be application to an active-matrix substrate of a liquid crystal display device which performs display in a vertical electric mode (for example, a TN mode or a vertical alignment mode) in which a voltage is applied in the thickness direction of a liquid crystal layer. Furthermore, the active-matrix substrate according to the embodiment of the present invention is also suitably used for a display device (a display device that includes a display medium layer other than the liquid crystal layer) other than the liquid crystal display device.

INDUSTRIAL APPLICABILITY

According to an embodiment of the present invention, an active-matrix substrate can be provided in which the reliability can be suppressed from decreasing due to penetration of water from a microcrack that occurs in an inorganic insulating layer. The active-matrix substrate according to the embodiment of the present invention is suitably used for various display devices starting from the liquid crystal display device.

REFERENCE SIGNS LIST 2P, 2Q, 2R GATE ELECTRODE
3 GATE INSULATING LAYER
3a OPENING PORTION IN GATE INSULATING LAYER
4P, 4Q, 4R OXIDE SEMICONDUCTOR LAYER
5P, 5Q, 5R SOURCE ELECTRODE
6P, 6Q, 6R DRAIN ELECTRODE
7 INORGANIC INSULATING LAYER (PROTECTION FILM)
8 ORGANIC INSULATING LAYER (PLANARIZING FILM)
8a OPENING PORTION IN ORGANIC INSULATING LAYER
9 INTERLAYER INSULATING LAYER
10P PIXEL TFT
10Q CIRCUIT TFT
10R INSPECTION TFT
11 LOWER TRANSPARENT ELECTRODE
12 DIELECTRIC LAYER
13 UPPER TRANSPARENT ELECTRODE
14 FIRST CONDUCTIVE LAYER
15 SECOND CONDUCTIVE LAYER
16 BASE FILM
17 CRYSTALLINE SILICON SEMICONDUCTOR LAYER
18 LOWER INSULATING LAYER
19 ALIGNMENT FILM
20 SOURCE AND GATE METAL CONNECTION PORTION
21 SHIELD LAYER
22 COM CONTACT PORTION
23 COMMON WIRING LINE (COM WIRING LINE)
30 LIQUID CRYSTAL LAYER (DISPLAY MEDIUM LAYER)
31 SEALING MATERIAL
40 GATE DRIVER MONOLITHIC (GDM) CIRCUIT
50 GDM WIRING-LINE AREA
51 MAIN WIRING LINE
52 BRANCH WIRING LINE
58 GDM TERMINAL AREA
60 INSPECTION CIRCUIT
61 INSPECTION WIRING LINE
61G INSPECTION GATE WIRING LINE
61S INSPECTION SOURCE WIRING LINE
68 INSPECTION TERMINAL AREA
69 TERMINAL AREA
70 SDM WIRING-LINE AREA
71 MAIN WIRING LINE
72 BRANCH WIRING LINE
78 SOURCE DRIVER MONOLITHIC (SDM) CIRCUIT
79 SOURCE SHARED DRIVING (SSD) CIRCUIT
80 DISPLAY AREA
90 NON-DISPLAY AREA
91 COM WIRING-LINE AREA
100, 100A, 100B, 100C, 100D ACTIVE-MATRIX SUBSTRATE
200, 200A, 200B, 200C, 200D ACTIVE-MATRIX SUBSTRATE
200E, 300 ACTIVE-MATRIX SUBSTRATE
400 COUNTER SUBSTRATE
1000 LIQUID CRYSTAL DISPLAY DEVICE
GL GATE WIRING LINE
SL SOURCE WIRING LINE
SR SEALING AREA
GDM L1 FIRST GDM WIRING LINE
GDM L2 SECOND GDM WIRING LINE

The invention claimed is:

1. An active-matrix substrate that has a display area which includes a plurality of pixel areas, and a non-display area that is positioned in a vicinity of the display area, the active-matrix substrate comprising:
a substrate;
a plurality of first TFTs that are arranged within the display area, the plurality of first TFTs being supported on the substrate;
a plurality of gate wiring lines for supplying a scanning signal to the plurality of first TFTs;
a plurality of source wiring lines for supplying a display signal to the plurality of first TFTs;
an inorganic insulating layer that covers at least the plurality of first TFTs;
an organic insulating layer that is provided on the inorganic insulating layer;
a plurality of second TFTs that are arranged within the non-display area, the plurality of second TFTs being supported on the substrate; and
a source and gate metal connection portion that is positioned within the non-display area and including a first conductive layer that is formed from an identical conductive film with the plurality of gate wiring lines and a second conductive layer that is formed from an identical conductive film with the plurality of source wiring lines being connected to each other at the source and gate metal connection portion,
wherein each of the plurality of first TFTs is an oxide semiconductor TFT that includes an oxide semiconductor layer,
wherein at least one second TFT among the plurality of second TFTs is covered with the organic insulating layer, and
wherein the source and gate metal connection portion is covered with the inorganic insulating layer and not covered with the organic insulating layer.

2. The active-matrix substrate according to claim 1, further comprising:
a gate driver monolithic circuit that is formed on the substrate in the non-display area,
wherein the source and gate metal connection portion that is not covered with the organic insulating layer is positioned within the gate driver monolithic circuit.

3. The active-matrix substrate according to claim 2, wherein the gate driver monolithic circuit includes a plurality of circuit TFTs, and wherein the source and gate metal connection portion that is not covered with the organic insulating layer is positioned in a vicinity of a certain circuit TFT among the plurality of circuit TFTs.

4. The active-matrix substrate according to claim 1, further comprising:
a gate driver monolithic circuit that is formed on the substrate in the non-display area,
wherein the non-display area includes a GDM wiring-line area in which a plurality of wiring lines for supplying a signal to the gate driver monolithic circuit are formed, and
wherein the source and gate metal connection portion that is not covered with the organic insulating layer is positioned within the GDM wiring-line area.

5. The active-matrix substrate according to claim 4,
wherein the plurality of wiring lines that are formed within the GDM wiring-line area includes a plurality of main wiring lines that extend in a given direction,
wherein the active-matrix substrate further comprises a plurality of branch wiring lines that extend in a direction which intersects the given direction, and which connect the plurality of main wiring lines and the gate monolithic circuit, and
wherein the source and gate metal connection portion that is not covered with the organic insulating layer is a portion that connects a certain main wiring line, among the plurality of main wiring lines, and a certain branch wiring line, among the plurality of branch wiring lines.

6. The active-matrix substrate according to claim 1, further comprising:
a gate driver monolithic circuit that is formed on the substrate in the non-display area,
wherein the source and gate metal connection portion that is not covered with the organic insulating layer is positioned between the gate driver monolithic circuit and the display area.

7. The active-matrix substrate according to claim 6,
wherein the source and gate metal connection portion that is not covered with the organic insulating layer is a portion that connects the gate driver monolithic circuit and a certain gate wiring line, among the plurality of gate wiring lines.

8. The active-matrix substrate according to claim 1, further comprising:
an inspection circuit that is formed on the substrate in the non-display area,
wherein the inspection circuit includes
a plurality of inspection TFTs, and
a plurality of inspection wiring lines for supplying a signal to the plurality of inspection TFTs, and
wherein the source and gate metal connection portion that is not covered with the organic insulating layer is positioned within the inspection circuit.

9. The active-matrix substrate according to claim 8,
wherein the source and gate metal connection portion that is not covered with the organic insulating layer is a portion that connects a certain inspection TFT, among the plurality of inspection TFTs, and a certain inspection wiring line, among the plurality of inspection wiring lines.

10. The active-matrix substrate according to claim 1,
wherein each of the plurality of second TFTs is a crystalline silicon TFT that includes a crystalline silicon semiconductor layer.

11. The active-matrix substrate according to claim 1,
wherein the second conductive layer in the source and gate metal connection portion includes an edge that is at a distance of 1.0 µm or more from an edge of the organic insulating layer when viewed in a direction normal to the substrate.

12. The active-matrix substrate according to claim 1,
wherein the oxide semiconductor TFT includes an oxide semiconductor layer that has a stacked structure.

13. A display device comprising:
the active-matrix substrate according to claim 1;
a counter substrate that is positioned in such a manner as to face the active-matrix substrate; and
a display medium layer that is provided between the active-matrix substrate and the counter substrate.

14. An active-matrix substrate that has a display area which includes a plurality of pixel areas, and a non-display area that is positioned in a vicinity of the display area, the active-matrix substrate comprising:
a substrate;
a plurality of first TFTs that are arranged within the display area, the plurality of first TFTs being supported on the substrate;
a plurality of gate wiring lines for supplying a scanning signal to the plurality of first TFTs; a plurality of source wiring lines for supplying a display signal to the plurality of first TFTs;
an inorganic insulating layer that covers at least the plurality of first TFTs;
an organic insulating layer that is provided on the inorganic insulating layer; a plurality of second TFTs that are arranged within the non-display area, the plurality of second TFTs being supported on the substrate; and
a source and gate metal connection portion that is positioned within the non-display area and including a first conductive layer that is formed from an identical conductive film with the plurality of gate wiring lines and a second conductive layer that is formed from an identical conductive film with the plurality of source wiring lines being connected to each other at the source and gate metal connection portion,
wherein each of the plurality of first TFTs is an oxide semiconductor TFT that includes an oxide semiconductor layer,
wherein the organic insulating layer includes a portion in which a groove that substantially surrounds the display area is formed, the portion being positioned within the non-display area, and
wherein the source and gate metal connection portion is covered with the inorganic insulating layer and not covered with the organic insulating layer.

15. The active-matrix substrate according to claim 14, further comprising:
a gate driver monolithic circuit that is formed on the substrate in the non-display area,
wherein the source and gate metal connection portion that is not covered with the organic insulating layer is positioned within the gate driver monolithic circuit.

16. The active-matrix substrate according to claim 14, further comprising:
a gate driver monolithic circuit that is formed on the substrate in the non-display area,
wherein the non-display area includes a GDM wiring-line area in which a plurality of wiring lines for supplying a signal to the gate driver monolithic circuit are formed, and wherein the source and gate metal connection portion that is not covered with the organic insulating layer is positioned within the GDM wiring-line area.

17. The active-matrix substrate according to claim 14, further comprising:
a gate driver monolithic circuit that is formed on the substrate in the non-display area,
wherein the source and gate metal connection portion that is not covered with the organic insulating layer is positioned between the gate driver monolithic circuit and the display area.

18. The active-matrix substrate according to claim 14, further comprising:
an inspection circuit that is formed on the substrate in the non-display area,
wherein the inspection circuit includes
a plurality of inspection TFTs, and
a plurality of inspection wiring lines for supplying a signal to the plurality of inspection TFTs, and
wherein the source and gate metal connection portion that is not covered with the organic insulating layer is positioned within the inspection circuit.

19. An active-matrix substrate that has a display area which includes a plurality of pixel areas, and a non-display area that is positioned in a vicinity of the display area, the active-matrix substrate comprising:
a substrate;
a plurality of pixel TFTs that are arranged within the display area, the plurality of pixel TFTs being supported on the substrate;
a plurality of gate wiring lines for supplying a scanning signal to the plurality of pixel TFTs;
a plurality of source wiring lines for supplying a display signal to the plurality of pixel TFTs;
an inorganic insulating layer that covers at least the plurality of pixel TFTs;
an organic insulating layer that is provided on the inorganic insulating layer;
a source and gate metal connection portion that is positioned on the non-display area and including a first conductive layer that is formed from an identical conductive film with the plurality of gate wiring lines and a second conductive layer that is formed from an identical conductive film with the plurality of source wiring lines being connected to each other at the source and gate metal connection portion; and
a gate driver monolithic circuit that is formed on the substrate and includes a plurality of circuit TFTs,
wherein each of the plurality of pixel TFTs is an oxide semiconductor TFT that includes an oxide semiconductor layer,
wherein at least one portion of the gate driver monolithic circuit is positioned within the display area, and
wherein the source and gate metal connection portion is positioned within a portion of the gate driver monolithic circuit, which is positioned within the display area, and is covered with the inorganic insulating layer and not covered with the organic insulating layer.

* * * * *